US012356740B2

United States Patent
Lee et al.

(10) Patent No.: US 12,356,740 B2
(45) Date of Patent: Jul. 8, 2025

(54) TRANSISTOR INTEGRATION WITH STACKED SINGLE-PHOTON AVALANCHE DIODE (SPAD) PIXEL ARRAYS

(71) Applicant: Apple Inc., Cupertino, CA (US)

(72) Inventors: Hong Wei Lee, San Jose, CA (US);
Cristiano L. Niclass, San Jose, CA (US); Shingo Mandai, Mountain View, CA (US); Xiaofeng Fan, San Jose, CA (US)

(73) Assignee: Apple Inc., Cupertino, CA (US)

( * ) Notice: Subject to any disclaimer, the term of this patent is extended or adjusted under 35 U.S.C. 154(b) by 939 days.

(21) Appl. No.: 17/473,855

(22) Filed: Sep. 13, 2021

(65) Prior Publication Data

US 2022/0102404 A1   Mar. 31, 2022

Related U.S. Application Data

(60) Provisional application No. 63/083,262, filed on Sep. 25, 2020.

(51) Int. Cl.
   H10F 39/00       (2025.01)
   H10F 30/225      (2025.01)
   H10F 39/18       (2025.01)

(52) U.S. Cl.
   CPC ....... *H10F 39/8037* (2025.01); *H10F 30/225* (2025.01); *H10F 39/803* (2025.01); *H10F 39/809* (2025.01); *H10F 39/807* (2025.01)

(58) Field of Classification Search
   CPC ......... H01L 27/14612; H01L 27/14634; H01L 31/107; H01L 27/1463; H01L 27/14643;
   (Continued)

(56) References Cited

U.S. PATENT DOCUMENTS 5,056,914 A   10/1991   Kollodge
5,179,286 A    1/1993   Akasu
(Continued)

FOREIGN PATENT DOCUMENTS

CN   1375896   10/2002
CN   1675920    9/2005
(Continued)

OTHER PUBLICATIONS

Charbon, et al., SPAD-Based Sensors, *TOF Range-Imaging Cameras*, F. Remondino and D. Stoppa (eds.), 2013, Springer-Verlag Berlin Heidelberg, pp. 11-38.
(Continued)

*Primary Examiner* — Jeff W Natalini
*Assistant Examiner* — Brandon C Fox
(74) *Attorney, Agent, or Firm* — Brownstein Hyatt Farber Schreck, LLP

(57) ABSTRACT

Disclosed herein are photodetectors using arrays of pixels with single-photon avalanche diodes (SPADs). The pixel arrays may have configurations that include one or more control transistors for each SPAD collocated on the same chip or wafer as the pixels and located on a surface of the wafer opposite to the light gathering surface of the pixel arrays. The control transistors may be positioned or configured for interconnection with a logic chip that is bonded to the wafer of the pixel array. The pixels may be formed in a substrate having doping gradient. The control transistors may be positioned on or within the SPADs, or adjacent to, but isolated from, the SPADs. Isolation between the individual SPADs and the respective control transistors may make use of shallow trench isolation regions or deep trench isolation regions.

19 Claims, 42 Drawing Sheets

(58) Field of Classification Search
CPC ........... H01L 27/14609; H10F 39/8037; H10F 30/225; H10F 39/807; H10F 39/18; H10F 39/8033; H10F 39/803
See application file for complete search history.

(56) References Cited

U.S. PATENT DOCUMENTS

| | | |
|---|---|---|
| 6,522,395 B1 | 2/2003 | Bamji et al. |
| 6,528,833 B2 | 3/2003 | Lee et al. |
| 6,714,239 B2 | 3/2004 | Guidash |
| 6,791,596 B2 | 9/2004 | Nihei et al. |
| 6,905,470 B2 | 6/2005 | Lee et al. |
| 6,931,269 B2 | 8/2005 | Terry |
| 6,982,759 B2 | 1/2006 | Goto |
| 7,075,049 B2 | 7/2006 | Rhodes |
| 7,084,914 B2 | 8/2006 | Blerkom |
| 7,091,466 B2 | 8/2006 | Bock |
| 7,119,322 B2 | 10/2006 | Hong |
| 7,259,413 B2 | 8/2007 | Rhodes |
| 7,262,401 B2 | 8/2007 | Hopper et al. |
| 7,271,836 B2 | 9/2007 | Iizuka et al. |
| 7,282,028 B2 | 10/2007 | Kim et al. |
| 7,319,218 B2 | 1/2008 | Krymski |
| 7,332,786 B2 | 2/2008 | Altice et al. |
| 7,390,687 B2 | 6/2008 | Boettiger et al. |
| 7,415,096 B2 | 8/2008 | Sherman |
| 7,437,013 B2 | 10/2008 | Anderson |
| 7,443,421 B2 | 10/2008 | Stavely et al. |
| 7,446,812 B2 | 11/2008 | Ando et al. |
| 7,453,131 B2 | 11/2008 | Marshall et al. |
| 7,471,315 B2 | 12/2008 | Silsby et al. |
| 7,502,054 B2 | 3/2009 | Kalapathy et al. |
| 7,525,168 B2 | 4/2009 | Hsieh |
| 7,554,067 B2 | 6/2009 | Zarnowski et al. |
| 7,555,158 B2 | 6/2009 | Park et al. |
| 7,589,316 B2 | 9/2009 | Dunki-Jacobs |
| 7,622,699 B2 | 11/2009 | Sakakibara |
| 7,626,626 B2 | 12/2009 | Panicacci |
| 7,636,109 B2 | 12/2009 | Nakajima et al. |
| 7,667,400 B1 | 2/2010 | Goushcha |
| 7,671,435 B2 | 3/2010 | Ahn |
| 7,696,483 B2 | 4/2010 | Tkaczyk |
| 7,714,292 B2 | 5/2010 | Agarwal et al. |
| 7,728,351 B2 | 6/2010 | Shim |
| 7,733,402 B2 | 6/2010 | Egawa |
| 7,742,090 B2 | 6/2010 | Street et al. |
| 7,764,312 B2 | 7/2010 | Ono et al. |
| 7,773,138 B2 | 8/2010 | Lahav et al. |
| 7,786,543 B2 | 8/2010 | Hsieh |
| 7,796,171 B2 | 9/2010 | Gardner |
| 7,817,198 B2 | 10/2010 | Kang et al. |
| 7,838,956 B2 | 11/2010 | McCarten et al. |
| 7,869,608 B2 | 1/2011 | Sander et al. |
| 7,873,236 B2 | 1/2011 | Li et al. |
| 7,880,785 B2 | 2/2011 | Gallagher |
| 7,884,402 B2 | 2/2011 | Ki |
| 7,906,826 B2 | 3/2011 | Martin et al. |
| 7,952,121 B2 | 3/2011 | Arimoto et al. |
| 7,952,635 B2 | 5/2011 | Lauxtermann |
| 7,982,789 B2 | 7/2011 | Watanabe et al. |
| 8,026,966 B2 | 9/2011 | Altice |
| 8,089,036 B2 | 1/2012 | Manabe |
| 8,089,524 B2 | 1/2012 | Urisaka |
| 8,094,232 B2 | 1/2012 | Kusaka |
| 8,116,540 B2 | 2/2012 | Dean et al. |
| 8,140,143 B2 | 3/2012 | Picard et al. |
| 8,153,947 B2 | 4/2012 | Barbier et al. |
| 8,159,570 B2 | 4/2012 | Negishi |
| 8,159,588 B2 | 4/2012 | Boemler |
| 8,164,669 B2 | 4/2012 | Compton et al. |
| 8,174,595 B2 | 5/2012 | Honda et al. |
| 8,184,188 B2 | 5/2012 | Yaghmal |
| 8,194,148 B2 | 6/2012 | Doida |
| 8,194,165 B2 | 6/2012 | Border et al. |
| 8,222,586 B2 | 7/2012 | Lee |
| 8,227,844 B2 | 7/2012 | Adkisson et al. |
| 8,233,071 B2 | 7/2012 | Takeda |
| 8,259,228 B2 | 9/2012 | Wei et al. |
| 8,324,553 B2 | 12/2012 | Lee |
| 8,338,856 B2 | 12/2012 | Tai et al. |
| 8,340,407 B2 | 12/2012 | Kalman |
| 8,350,940 B2 | 1/2013 | Smith et al. |
| 8,355,117 B2 | 1/2013 | Niclass |
| 8,378,310 B2 | 2/2013 | Bornefalk et al. |
| 8,388,346 B2 | 3/2013 | Rantala et al. |
| 8,400,546 B2 | 3/2013 | Itano et al. |
| 8,456,540 B2 | 6/2013 | Egawa |
| 8,456,559 B2 | 6/2013 | Yamashita et al. |
| 8,508,637 B2 | 8/2013 | Han et al. |
| 8,514,308 B2 | 8/2013 | Itonaga et al. |
| 8,520,913 B2 | 8/2013 | Dean et al. |
| 8,546,737 B2 | 10/2013 | Tian et al. |
| 8,547,388 B2 | 10/2013 | Cheng |
| 8,575,531 B2 | 11/2013 | Hynecek et al. |
| 8,581,992 B2 | 11/2013 | Hamada |
| 8,594,170 B2 | 11/2013 | Mombers et al. |
| 8,619,163 B2 | 12/2013 | Ogura |
| 8,619,170 B2 | 12/2013 | Mabuchi |
| 8,629,484 B2 | 1/2014 | Ohri et al. |
| 8,634,002 B2 | 1/2014 | Kita |
| 8,637,875 B2 | 1/2014 | Finkelstein et al. |
| 8,648,947 B2 | 2/2014 | Sato et al. |
| 8,653,434 B2 | 2/2014 | Johnson et al. |
| 8,723,975 B2 | 5/2014 | Solhusvik |
| 8,724,096 B2 | 5/2014 | Gosch et al. |
| 8,730,345 B2 | 5/2014 | Watanabe |
| 8,754,983 B2 | 6/2014 | Sutton |
| 8,755,854 B2 | 6/2014 | Addison et al. |
| 8,759,736 B2 | 6/2014 | Yoo |
| 8,760,413 B2 | 6/2014 | Peterson et al. |
| 8,767,104 B2 | 7/2014 | Makino et al. |
| 8,797,512 B2 | 8/2014 | Stettner et al. |
| 8,803,990 B2 | 8/2014 | Smith |
| 8,810,703 B2 | 8/2014 | Machida |
| 8,817,154 B2 | 8/2014 | Manabe et al. |
| 8,874,377 B1 | 10/2014 | Sickenberger |
| 8,879,686 B2 | 11/2014 | Okada |
| 8,902,330 B2 | 12/2014 | Theuwissen |
| 8,902,341 B2 | 12/2014 | Mabuchi |
| 8,908,073 B2 | 12/2014 | Minagawa et al. |
| 8,923,994 B2 | 12/2014 | Laikari et al. |
| 8,934,030 B2 | 1/2015 | Kim et al. |
| 8,936,552 B2 | 1/2015 | Kateraas et al. |
| 8,946,610 B2 | 2/2015 | Iwabuchi et al. |
| 8,982,237 B2 | 3/2015 | Chen |
| 9,006,641 B2 | 4/2015 | Drader |
| 9,007,600 B2 | 4/2015 | Imaki et al. |
| 9,017,748 B2 | 4/2015 | Spelman et al. |
| 9,041,837 B2 | 5/2015 | Li |
| 9,054,009 B2 | 6/2015 | Oike et al. |
| 9,058,081 B2 | 6/2015 | Baxter |
| 9,066,017 B2 | 6/2015 | Geiss |
| 9,066,660 B2 | 6/2015 | Watson et al. |
| 9,076,632 B2 | 7/2015 | Reinhorn et al. |
| 9,087,755 B2 | 7/2015 | Frach |
| 9,088,727 B2 | 7/2015 | Trumbo |
| 9,094,623 B2 | 7/2015 | Kawaguchi |
| 9,099,604 B2 | 8/2015 | Roy et al. |
| 9,100,597 B2 | 8/2015 | Hu |
| 9,106,859 B2 | 8/2015 | Kizuna et al. |
| 9,131,171 B2 | 9/2015 | Aoki |
| 9,151,829 B2 | 10/2015 | Campbell |
| 9,153,612 B2 | 10/2015 | Miyanami |
| 9,154,750 B2 | 10/2015 | Pang |
| 9,160,949 B2 | 10/2015 | Zhang et al. |
| 9,164,144 B2 | 10/2015 | Dolinsky |
| 9,176,241 B2 | 11/2015 | Frach |
| 9,178,100 B2 | 11/2015 | Webster et al. |
| 9,209,320 B1 | 12/2015 | Webster |
| 9,225,948 B2 | 12/2015 | Hasegawa |
| 9,232,150 B2 | 1/2016 | Kleekajai et al. |
| 9,232,161 B2 | 1/2016 | Suh |
| 9,235,267 B2 | 1/2016 | Burrough et al. |
| 9,257,589 B2 | 2/2016 | Niclass et al. |

(56) References Cited

U.S. PATENT DOCUMENTS

| | | |
|---|---|---|
| 9,270,906 B2 | 2/2016 | Peng et al. |
| 9,276,031 B2 | 3/2016 | Wan |
| 9,277,144 B2 | 3/2016 | Kleekajai et al. |
| 9,287,304 B2 | 3/2016 | Park et al. |
| 9,288,380 B2 | 3/2016 | Nomura |
| 9,288,404 B2 | 3/2016 | Papiashvili |
| 9,293,500 B2 | 3/2016 | Sharma et al. |
| 9,312,401 B2 | 4/2016 | Webster |
| 9,313,434 B2 | 4/2016 | Dutton et al. |
| 9,319,611 B2 | 4/2016 | Fan |
| 9,331,116 B2 * | 5/2016 | Webster ............. H01L 27/1464 |
| 9,344,649 B2 | 5/2016 | Bock |
| 9,354,332 B2 | 5/2016 | Zwaans |
| 9,392,237 B2 | 7/2016 | Toyoda |
| 9,417,326 B2 | 8/2016 | Niclass et al. |
| 9,431,439 B2 | 8/2016 | Soga et al. |
| 9,438,258 B1 | 9/2016 | Yoo |
| 9,445,018 B2 | 9/2016 | Fettig et al. |
| 9,448,110 B2 | 9/2016 | Wong |
| 9,450,007 B1 | 9/2016 | Motta et al. |
| 9,451,887 B2 | 9/2016 | Watson et al. |
| 9,467,553 B2 | 10/2016 | Heo et al. |
| 9,473,706 B2 | 10/2016 | Malone et al. |
| 9,478,030 B1 | 10/2016 | Lecky |
| 9,479,688 B2 | 10/2016 | Ishii |
| 9,490,285 B2 | 11/2016 | Itonaga |
| 9,503,616 B2 | 11/2016 | Taniguchi et al. |
| 9,516,244 B2 | 12/2016 | Borowski |
| 9,538,106 B2 | 1/2017 | McMahon et al. |
| 9,549,099 B2 | 1/2017 | Fan |
| 9,560,339 B2 | 1/2017 | Borowski |
| 9,596,420 B2 | 3/2017 | Fan et al. |
| 9,639,063 B2 | 5/2017 | Dutton et al. |
| 9,661,308 B1 | 5/2017 | Wang et al. |
| 9,685,576 B2 | 6/2017 | Webster |
| 9,686,485 B2 | 6/2017 | Agranov et al. |
| 9,699,442 B2 | 7/2017 | Fereyre et al. |
| 9,700,240 B2 | 7/2017 | Letchner et al. |
| 9,741,754 B2 | 8/2017 | Li et al. |
| 9,749,556 B2 | 8/2017 | Fettig et al. |
| 9,774,318 B2 | 9/2017 | Song |
| 9,831,283 B2 | 11/2017 | Shepard et al. |
| 9,857,469 B2 | 1/2018 | Oggier et al. |
| 9,870,053 B2 | 1/2018 | Modarres et al. |
| 9,888,198 B2 | 2/2018 | Mauritzson et al. |
| 9,915,733 B2 | 3/2018 | Fried et al. |
| 9,921,299 B2 | 3/2018 | Kalscheur et al. |
| 9,935,231 B2 | 4/2018 | Roehrer |
| 9,939,316 B2 | 4/2018 | Scott |
| 9,952,323 B2 | 4/2018 | Deane |
| 9,973,678 B2 | 5/2018 | Mandelli et al. |
| 9,985,163 B2 | 5/2018 | Moore |
| 10,026,772 B2 | 7/2018 | Shinohara |
| 10,067,224 B2 | 9/2018 | Moore |
| 10,078,183 B2 | 9/2018 | Adderly et al. |
| 10,107,914 B2 | 10/2018 | Kalscheur et al. |
| 10,120,446 B2 | 11/2018 | Pance et al. |
| 10,139,478 B2 | 11/2018 | Russell et al. |
| 10,145,678 B2 | 12/2018 | Wang et al. |
| 10,153,310 B2 | 12/2018 | Zhang et al. |
| 10,205,844 B2 | 2/2019 | Miyake et al. |
| 10,217,889 B2 * | 2/2019 | Dhulla ................. H10F 39/103 |
| 10,267,901 B2 | 4/2019 | Drader |
| 10,276,620 B2 | 4/2019 | Chien et al. |
| 10,305,247 B2 | 5/2019 | Bills et al. |
| 10,324,171 B2 | 6/2019 | Niclass et al. |
| 10,334,181 B2 | 6/2019 | Guenter |
| 10,338,221 B2 | 7/2019 | Lee et al. |
| 10,416,293 B2 | 9/2019 | Buckley |
| 10,438,987 B2 | 10/2019 | Mandai et al. |
| 10,451,736 B2 | 10/2019 | Stutz |
| 10,495,736 B2 | 12/2019 | Zhuang et al. |
| 10,605,922 B2 | 3/2020 | Deane |
| 10,613,225 B2 | 4/2020 | Kubota et al. |
| 10,620,300 B2 | 4/2020 | Sharma et al. |
| 10,651,332 B2 | 5/2020 | Moussy |
| 10,658,419 B2 | 5/2020 | Mandai et al. |
| 10,663,595 B2 | 5/2020 | Curatu |
| 10,795,001 B2 | 10/2020 | Niclass et al. |
| 10,801,886 B2 | 10/2020 | Mandai et al. |
| 10,802,148 B2 | 10/2020 | Lee et al. |
| 10,921,454 B2 | 2/2021 | Van Dyck et al. |
| 10,928,492 B2 | 2/2021 | Mandai et al. |
| 10,962,628 B1 | 3/2021 | Laifenfeld et al. |
| 11,002,853 B2 | 5/2021 | McWhirter |
| 11,016,184 B2 | 5/2021 | Beer et al. |
| 11,233,966 B1 | 1/2022 | Niclass et al. |
| 2005/0258370 A1 | 11/2005 | Kawamura et al. |
| 2010/0159632 A1 | 6/2010 | Rhodes et al. |
| 2012/0162632 A1 | 6/2012 | Dutton |
| 2014/0231630 A1 | 8/2014 | Rae et al. |
| 2018/0090526 A1 * | 3/2018 | Mandai ............. H01L 27/14609 |
| 2018/0341009 A1 | 11/2018 | Niclass et al. |
| 2019/0018119 A1 | 1/2019 | Laifenfeld et al. |
| 2020/0286946 A1 | 9/2020 | Mandai et al. |
| 2020/0373452 A1 * | 11/2020 | Do Valle ............... H10F 30/225 |
| 2022/0384494 A1 * | 12/2022 | Morimoto ............ H10F 39/182 |

FOREIGN PATENT DOCUMENTS

| | | |
|---|---|---|
| CN | 101379615 | 3/2009 |
| CN | 101489159 | 7/2009 |
| CN | 102884444 | 1/2013 |
| CN | 103064076 | 4/2013 |
| CN | 103299437 | 9/2013 |
| CN | 103472458 | 12/2013 |
| CN | 103779437 | 5/2014 |
| CN | 104103655 | 10/2014 |
| CN | 104779259 | 7/2015 |
| CN | 104810377 | 7/2015 |
| CN | 104884972 | 9/2015 |
| CN | 105185796 | 12/2015 |
| CN | 105489624 | 4/2016 |
| CN | 105991933 | 10/2016 |
| CN | 106526612 | 3/2017 |
| DE | 4133196 | 4/1992 |
| DE | 102010060527 | 4/2012 |
| EP | 0727824 | 8/1995 |
| EP | 2148514 | 1/2010 |
| EP | 2211430 | 7/2010 |
| EP | 2787531 | 10/2014 |
| JP | S63132177 | 6/1988 |
| JP | H04363264 | 12/1992 |
| JP | 2004319576 | 11/2004 |
| JP | 2007230173 | 9/2007 |
| JP | 2009075068 | 4/2009 |
| JP | 2011123149 | 6/2011 |
| JP | 2012038981 | 2/2012 |
| JP | 2012048080 | 3/2012 |
| JP | 2012169530 | 9/2012 |
| JP | 2014081254 | 5/2014 |
| JP | 2014225647 | 12/2014 |
| JP | 2015041746 | 3/2015 |
| JP | 2016511539 | 4/2016 |
| JP | 2016145776 | 8/2016 |
| JP | 2019169643 | 10/2019 |
| JP | 2020039017 | 3/2020 |
| JP | 2020510308 | 4/2020 |
| JP | 2020143959 | 9/2020 |
| JP | 2020155783 | 9/2020 |
| KR | 1020190124273 | 11/2019 |
| WO | WO 01/022033 | 3/2001 |
| WO | WO 12/011095 | 1/2012 |
| WO | WO 12/032353 | 3/2012 |
| WO | WO 17/112416 | 6/2017 |
| WO | WO 18/158631 | 9/2018 |
| WO | WO 20/045123 | 3/2020 |

OTHER PUBLICATIONS

Cox, "Getting histograms with varying bin widths," http://www.stata.com/support/faqs/graphics/histograms-with-varying-bin-widths/, Nov. 13, 2017, 5 pages.

(56) References Cited

OTHER PUBLICATIONS

Gallivanoni, et al., "Progress n Quenching Circuits for Single Photon Avalanche Diodes," IEEE Transactions on Nuclear Science, vol. 57, No. 6, Dec. 2010, pp. 3815-3826.

Jahromi et al., "A Single Chip Laser Radar Receiver with a 9×9 SPAD Detector Array and a 10-channel TDC," 2013 Proceedings of the ESSCIRC, IEEE, Sep. 14, 2015, pp. 364-367.

Kindt, et al., "A silicon avalanche photodiode for single optical photon counting in the Geiger mode," *Sensors and Actuators A: Physical*, Elsevier BV, NL, vol. 60, No. 1-3, May 1, 1997, pp. 98-102.

Leslar, et al., "Comprehensive Utilization of Temporal and Spatial Domain Outlier Detection Methods for Mobile Terrestrial LiDAR Data," *Remote Sensing*, 2011, vol. 3, pp. 1724-1742.

Mota, et al., "A flexible multi-channel high-resolution Time-to-Digital Converter ASIC," *Nuclear Science Symposium Conference Record IEEE*, 2000, Engineering School of Geneva, Microelectronics Lab, Geneva, Switzerland, 8 pages.

Niclass, et al., "Design and Characterization of a CMOS 3-D Image Sensor Based on Single Photon Avalanche Diodes," *IEEE Journal of Solid-State Circuits*, vol. 40, No. 9, Sep. 2005, pp. 1847-1854.

Shin, et al., "Photon-Efficient Computational 3D and Reflectivity Imaging with Single-Photon Detectors," IEEE International Conference on Image Processing, Paris, France, Oct. 2014, 11 pages.

Tisa, et al., "Variable-Load Quenching Circuit for single-photon avalanche diodes," Optics Express, vol. 16, No. 3, Feb. 4, 2008, pp. 2232-2244.

Ullrich, et al., "Linear LIDAR versus Geiger-mode LIDAR: Impact on data properties and data quality," *Laser Radar Technology and Applications XXI*, edited by Monte D. Turner, Gary W. Kamerman, Proc. of SPIE, vol. 9832, 983204, 2016, 17 pages.

\* cited by examiner

TRANSISTOR INTEGRATION WITH STACKED SINGLE-PHOTON AVALANCHE DIODE (SPAD) PIXEL ARRAYS

CROSS-REFERENCE TO RELATED APPLICATIONS

This application is a nonprovisional of, and claims the benefit under 35 U.S.C. § 119(e) of, U.S. Provisional Patent Application No. 63/083,262, filed Sep. 25, 2020, the contents of which are incorporated herein by reference as if fully disclosed herein.

FIELD

The present disclosure generally relates to image sensors that include pixel arrays that have single-photon avalanche diodes (SPADs) as their photodetectors, light gathering elements, or light detecting elements.

BACKGROUND

Electronic imaging or camera devices are now commonplace on various types of electronic devices, such as cell phones, tablet or desktop computers, personal digital assistants, and the like. These imaging devices may use arrays of individual light gathering sensors, or just pixels. The pixels are often semiconductor based and convert received light into electrical signals that are processed to produce respective parts of a total image.

Each individual pixel may be connected with associated circuitry (e.g., supply lines, control electronics such as quenching or gating transistors, and other components or circuitry) that controls the light sensing or imaging operations of the pixel. How the associated circuitry and light gathering semiconductor section of a pixel are arranged may affect the light gathering capabilities of the pixel. How the associated circuitry and light gathering semiconductor section of a pixel are arranged may make better use of, or determine, the number of wafers included in the electronic imaging or camera devices. In some embodiments, the pixel array may be implemented as part of a first wafer, with the associated circuitry implemented on a second wafer to which the first wafer is then bonded. In other embodiments, the pixel array may be implemented as part of a first wafer and bonded or joined with a second wafer containing control or other circuit components for the pixels, and the second wafer may be bonded or joined with a third wafer containing supply and logic components and circuitry.

SUMMARY

This summary is provided to introduce a selection of concepts in a simplified form that are further described below in the Detailed Description section. This summary is not intended to identify key features or essential features of the claimed subject matter, nor is it intended to be used as an aid in determining the scope of the claimed subject matter.

Disclosed herein are devices, systems, and structures for photodetectors, light sensors, or image sensors, their internal components, and the arrangements of those internal components. The image sensors may include pixel arrays in which the photodetectors include single-photon avalanche diodes (SPADs). The image sensor may be formed by connecting or bonding one or more separately fabricated wafers or chips, such as a pixel wafer and a logic and/or control circuitry wafer.

Various implementations and embodiments are directed to the internal structuring of the SPADs and the positioning of various supply and/or control transistors for the SPADs. Certain supply and control transistors may be placed on the pixel wafer in proximity to their respective SPADs, or, in some embodiments, placed separately on a dedicated wafer.

More specifically, a first set of embodiments discloses a structure of a pixel array. One or more pixels may include a SPAD, as well as one or more control transistors formed within the pixel and operably connected with the SPAD. The control transistor may be formed in a semiconductor substrate of the pixel array, with the pixel adjacent to a top surface of the pixel opposite to the light gathering surface of the pixel. The pixel may be positioned between isolation walls extending at least partially from the top surface of the pixel to the light gathering surface of the pixel. The anode layer of the SPAD may be formed within the semiconductor substrate, and the substrate may be formed with a doping gradient. Particular embodiments within the first family describe embodiments with one, two, or three control transistors.

Another set of embodiments describes a pixel wafer, formed in a semiconductor substrate, having multiple pixel cells arranged as a rectangular array and multiple transistor regions. Each pixel of the pixel array contains a SPAD, and at least one control transistor is formed within each transistor region. Deep trench isolation walls may extend from the top surface of the pixel wafer into the semiconductor substrate to, or near to, a backside surface of the pixel wafer that is opposite to the top surface. The deep trench isolation walls separate the transistor regions from the pixel cells. The SPAD of each pixel cell is formed with an n-type cathode proximate to the top surface and a p-type anode formed beneath the n-type cathode opposite to the top surface. The semiconductor substrate may be a p-type semiconductor with a doping gradient.

Another set of embodiments describes photodetector devices that include a pixel wafer comprising an array of pixel cells, a control transistor wafer having a first side joined to the pixel wafer, and a logic wafer joined to a second side of the control transistor wafer that is opposite to the first side. Each pixel cell of the array of pixel cells in the pixel wafer contains a SPAD. The control transistor wafer includes, for each pixel cell, respective control transistors, the control transistors including at least a recharging transistor, a gating transistor, and a quenching transistor. The control transistors may control a light detection operation of the SPAD of the corresponding pixel. The logic wafer may contain circuit components that may receive an electrical signal through an interconnection pad from the control transistor wafer based on the light detection operation.

BRIEF DESCRIPTION OF THE DRAWINGS

The disclosure will be readily understood by the following detailed description in conjunction with the accompanying drawings, wherein like reference numerals designate like structural elements.

Figure 1A:
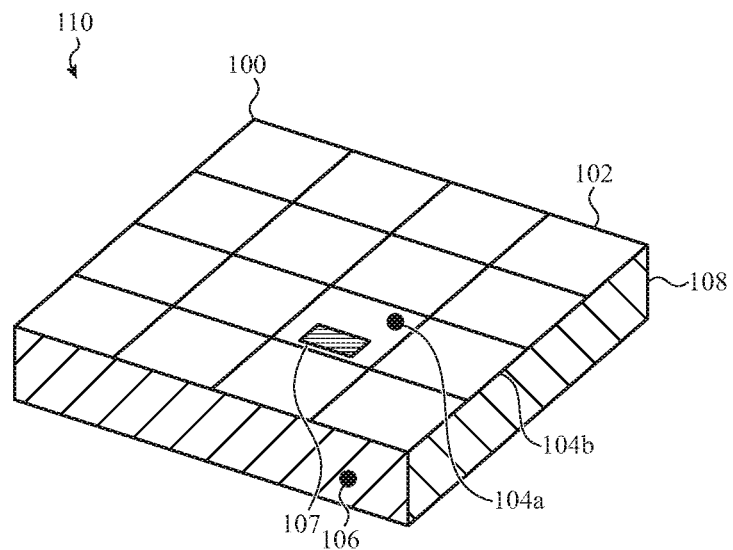
FIG. 1A illustrates a perspective view of an array of single-photon avalanche diode (SPAD) pixels.

The use of cross-hatching or shading in the accompanying figures is generally provided to clarify the boundaries between adjacent elements and also to facilitate legibility of the figures. Accordingly, neither the presence nor the absence of cross-hatching or shading conveys or indicates any preference or requirement for particular materials, material properties, element proportions, element dimensions, commonalities of similarly illustrated elements, or any other characteristic, attribute, or property for any element illustrated in the accompanying figures.

Additionally, it should be understood that the proportions and dimensions (either relative or absolute) of the various features and elements (and collections and groupings thereof) and the boundaries, separations, and positional relationships presented therebetween, are provided in the accompanying figures merely to facilitate an understanding of the various embodiments described herein and, accordingly, may not necessarily be presented or illustrated to scale, and are not intended to indicate any preference or requirement for an illustrated embodiment to the exclusion of embodiments described with reference thereto.

DETAILED DESCRIPTION

Reference will now be made in detail to representative embodiments illustrated in the accompanying drawings. It should be understood that the following descriptions are not intended to limit the embodiments to one preferred embodiment. To the contrary, it is intended to cover alternatives, modifications, and equivalents as can be included within the spirit and scope of the described embodiments as defined by the appended claims.

The embodiments described herein are generally directed to structures of light detecting sensors, photodetectors (or "photoreceptors"), and devices and systems that use them. Examples of such devices include digital cameras, light detection and ranging (LIDAR) systems and devices, and the like. Such devices often use arrays of photodetectors formed on a single semiconductor wafer. The individual photodetectors and associated circuit components are termed the pixels or pixels cells, and the semiconductor wafer is termed the pixel wafer.

A pixel may include, as the photodetecting component, a single-photon avalanche diode (SPAD), in which a diode junction is reverse-biased into the avalanche region. The cathode of the SPAD is often positioned near a surface of the pixel so that a photon striking the cathode induces an expanding cascade of charge carriers that are detected by circuit components connected to the SPAD. The pixel wafer may be formed with multiple SPAD pixels arranged as an array with their light gathering surfaces on a first side, also called the 'backside,' of the pixel wafer. The pixel wafer may be formed or fabricated with at least some of the detecting circuit components on a second side, called the 'frontside,' that is opposite to the light gathering backside.

In order to obtain an increased net light gathering surface, in some implementations the pixel wafer may be fabricated or formed to contain primarily the SPAD pixel cells, with only limited additional circuit components on the pixel wafer, such as for biasing the SPADs. One or more additional wafers, termed the "logic" and/or "control" wafer(s), may then be formed to contain circuit components for detecting, conditioning, and/or processing the signals produced by the SPAD pixels. The pixel wafer and other wafers may then be bonded or joined into a stack configuration with matching electrical interconnections.

In this implementation, certain circuit elements, such as control transistors for the SPADs, may be formed on the logic wafer. Such control transistors, such as quenching, gating, and recharging transistors, may use higher voltage supplies, or dual voltage supplies. This may create challenges for circuit layout and space constraints within the logic wafer. For example, various other circuit components of the logic wafer (such as temporal sampling circuits, counters, image processors, graphics processors, or other components) may operate from lower voltage supplies.

The families of embodiments disclosed herein generally relate to structures or configurations by which SPAD pixels and their associated control transistors may be formed or fabricated on a pixel wafer while still providing the SPAD a large light gathering surface. In general, each SPAD may be implemented with a cathode/anode junction forming a wide avalanche region. The light gathering surfaces of the SPADs may be formed on one side of a pixel wafer, in which a doping gradient is formed within the SPAD. The doping gradient allows for photon-induced charge carriers to be directed toward the avalanche region in a SPAD. The control transistors (and possibly other circuit components) may be formed on a side of the pixel wafer opposite to the light gathering surface of the pixel wafer. The cathode/anode junction of a SPAD may be positioned, at least in part, within the pixel wafer beneath the control transistors for increased junction area. The control transistors for each pixel may be electrically or otherwise separated by formation within semiconductor wells, by use of shallow trench isolation walls or structures, or by deep trench isolation walls or structures.

In the first family of embodiments, two control transistors for a SPAD may be formed on the respective pixel. In the second family of embodiments, three or more control or logic transistors for a SPAD may be formed on the respective pixel. In a third family of embodiments, a single control transistor for a SPAD may be formed on the respective pixel. In a fourth family of embodiments, the control transistors are formed on the pixel wafer but are exterior to the corresponding pixel containing the SPAD. The control transistors are formed in areas separated from the SPAD pixels by deep trench isolation walls. In a fifth family of embodiments, the control wafers are formed on a dedicated wafer, separate from either the pixel wafer or a logic circuitry wafer. The dedicated wafer is positioned between the pixel wafer and the logic circuitry wafer and joined or bonded with both.

These and other embodiments are discussed below with reference to FIGS. 2-15C. FIGS. 1A-E describe and review general considerations and implementations for dual wafer image sensors containing a pixel wafer and a logic and/or control circuitry wafer. However, those skilled in the art will readily appreciate that the detailed description of the embodiments given herein with respect to FIGS. 2-15C is for explanatory purposes only and should not be construed as limiting.

Further, although specific electronic devices with image sensors are mentioned or described below, the embodiments described herein may be used with various electronic devices including, but not limited to, mobile phones, personal digital assistants, a time keeping device, a health monitoring device, a wearable electronic device, an input device (e.g., a stylus), a desktop computer, electronic glasses, and so on.

Other embodiments and implementations are within the scope and spirit of the disclosure and appended claims. For example, features implementing functions may also be physically located at various positions, including being distributed such that portions of functions are implemented at different physical locations. Also, as used herein, including in the claims, "or" as used in a list of items prefaced by "at least one of" indicates a disjunctive list such that, for example, a list of "at least one of A, B, or C" means A or B or C or AB or AC or BC or ABC (i.e., A and B and C). Further, the term "exemplary" does not mean that the described example is preferred or better than other examples.

FIGS. 1A-E provide a general description of using multiple wafers, such as a pixel wafer containing an array of photodetectors together with a logic wafer, to create a light sensing or image sensing device. The descriptions are given to provide context and contrast for the descriptions of the embodiments described in FIGS. 2-15C.

FIG. 1A illustrates a pixel array 100 formed on a single pixel wafer 108. The pixel array 100 is shown with top surface 102 opposite to the backside surface 106. Individual pixels, such as pixels 104a and 104b, contain photoreceptors, such as single-photon avalanche diodes (SPADs), and possibly associated circuitry. The pixel array may be formed in the pixel wafer 108 by any of various semiconductor manufacturing processes. For example, the pixel wafer 108 may be a p-type semiconductor, with photoreceptors and any associated circuitry formed by etching and deposition, ion implantation, and/or other fabrication methods. The associated circuitry or connection components to the anodes or cathodes of the photoreceptors may be formed by the fabrication processes on the top surface 102 so that the backside surface 106 can be the side exposed to light for image capture. The pixel array 100 may be fabricated with various interconnection pads, such as interconnection pad 107.

The pixel array 100 may be fabricated so that it may be bonded to a second wafer, herein termed the "logic wafer," that may contain any of the supply voltage lines or connections for the photoreceptors, various control transistors for the photoreceptors (as described further below), processing circuitry (e.g., buffers, time-to-digital counters, image processors, filters, and others), or other components.

Figure 1B:
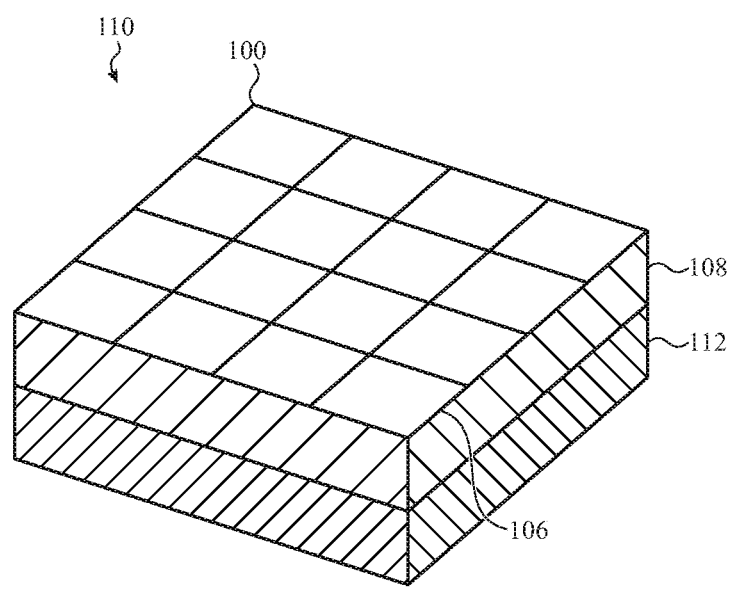
FIG. 1B illustrates a perspective view of a SPAD pixel wafer attached to a logic or control circuitry wafer.

FIG. 1B shows a perspective view 110 of the pixel array 100 bonded or joined to the logic (or control circuitry) wafer 112. The pixel wafer 108 has been flipped so that the backside surface 106 is now shown topmost, with the top surface 102 now interfacing or bonded with logic wafer 112. The logic wafer 112 may also have been fabricated with interconnection pads to match and/or join with the interconnection pads 107 fabricated on the pixel array 100, to make circuit or electrical connections.

Figure 1C:
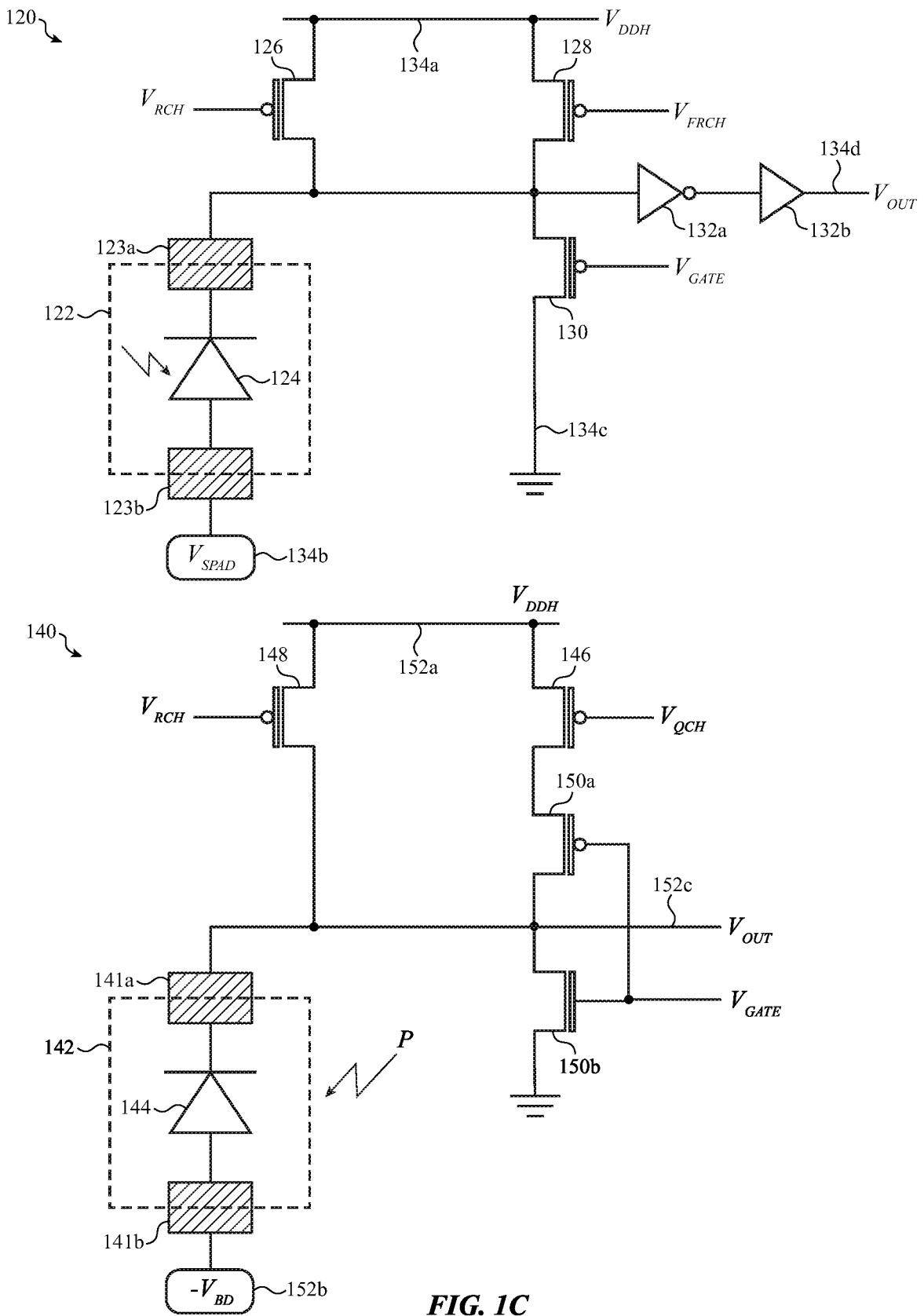
FIG. 1C illustrates two circuit diagrams of supply or control circuitry associated with a single SPAD pixel.

FIG. 1C illustrates first and second circuit diagrams of circuit 120 and circuit 140 that may be used in the dual wafer process of forming an image sensor, such as shown in FIGS. 1A-B. The second circuit 140 is based on the disclosures of U.S. patent application Ser. No. 15/879,350, the contents of which are hereby included by reference in their entirety. In the circuits 120 and 140, the photoreceptors are SPADs, 124 and 144, implemented on respective pixel wafers, 122 and 142, that are bonded or joined to logic wafers that contain the shown control transistors and voltage supplies.

In the first circuit 120, there may be various supply voltages: a high voltage $V_{DDH}$ 134a, an anode supply voltage $V_{SPAD}$ 134b, and a zero voltage supply 134c. The SPAD 124 is electrically linked through interconnection pad 123a between the pixel wafer 122 and a logic wafer, and through the interconnection pad 123b to the anode supply voltage $V_{SPAD}$ 134b.

The logic and/or control circuitry, also herein called "logic circuitry" or "control circuitry," includes at least three transistors: the pMOS quenching transistor 126 applying voltage $V_Q$, the pMOS fast recharging transistor 128 applying voltage $V_{FRCH}$, and the pMOS gating transistor applying voltage $V_{GATE}$. The pMOS quenching transistor 126 allows for reducing bias of the SPAD 124 to below breakdown after detection of the photon-induced avalanche current. The pMOS fast recharging transistor 128 can be gated to allow for rapid restoration of charge carriers in the SPAD 124. The pMOS gating transistor 130 may control output signaling from the SPAD 124. The output signals are transmitted through the level down shifter (which may have high voltage transistor(s)) 132a and inverter (possibly with low voltage transistor(s)) 132b, either of which may also provide amplification, to subsequent processing circuitry through the output connection link 134d. One skilled in the art will recognize that alternatives or variations on the first circuit 120 for SPAD photoreceptors are possible.

The second circuit 140 shows one such variation. In the second circuit 140, the SPAD 144 is included in a pixel wafer 142. The second circuit 140 has a first supply voltage 152a and a second supply voltage 152b. The pixel wafer 142 may be electrically connected to the logic and control circuitry in a separate logic wafer through the interconnection pads 141a, 141b, and to the second supply voltage 152b connected to the anode of the SPAD 144. The second circuit 140 includes the pMOS recharging transistor 148 that applies voltage signals $V_{RCH}$, the pMOS quenching transistor 146 applying voltage signal $V_{QCH}$, and the combination of pMOS select transistor 150a and nMOS gating transistor 150b controlled by the voltage signal $V_{GATE}$. The source of the nMOS gating transistor 150b is connected to a circuit ground.

Figure 1D:
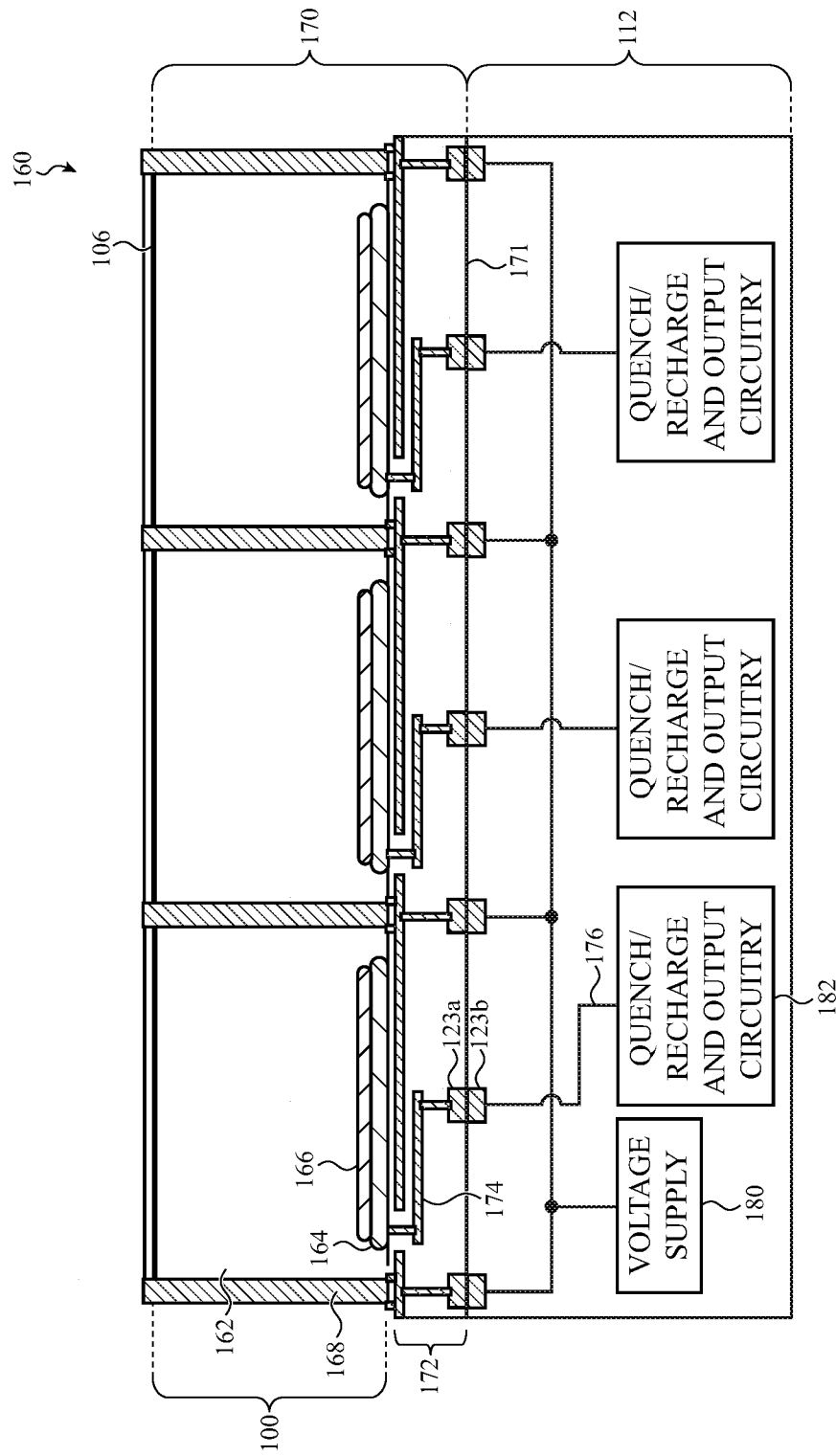
FIG. 1D illustrates a cross-sectional view of a SPAD pixel wafer connected with a supply, control, or logic circuitry wafer.

FIG. 1D illustrates a combination cross section and circuit diagram of one example of how a pixel wafer 170 may be joined or bonded to a control circuitry wafer 112. The pixel wafer 170 includes an array 100 of SPAD pixels, such as SPAD pixel 162, separated by isolation walls, such as isolation wall 168. The SPAD pixel 162 includes an anode 166 and cathode 164. The pixel wafer 170 may also include a junction layer 172 containing vias and interconnection links, such as via 174 to control circuitry wafer 112. The pixel wafer 170 may be joined or bonded with the control circuitry wafer 112 along the interface 171. Electrical connections between the pixel wafer 170 and the control circuitry wafer 112 may be provided at interconnection pads, such as interconnection pads 123a and 123b. As indicated, the upper surface of the pixel wafer 170 may be the backside surface 106 described above in relation to FIGS. 1A-B, and is now the surface that is exposed to light for light sensing or image capture.

The control circuitry wafer 112 may include the voltage supply 180 that may provide one or more voltage levels to pixel wafer 170, and possibly also to the Quench/Recharge circuitry 182, such as circuits 120 and 140 described above.

Figure 1E:
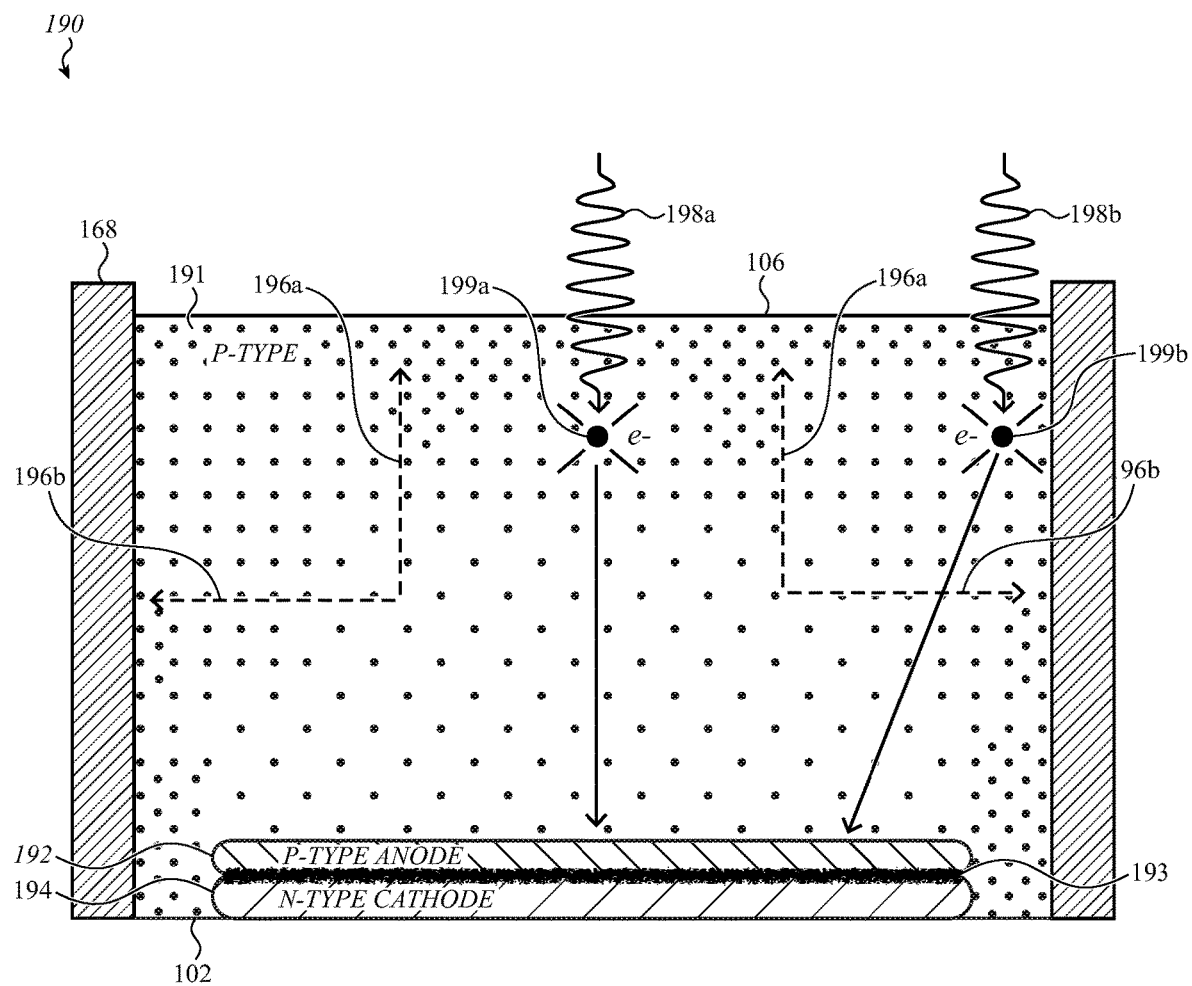
FIG. 1E illustrates a cross-sectional view of a single SPAD pixel of a SPAD pixel array.

FIG. 1E illustrates in a cross-sectional view of various details of a SPAD 190, such as the SPAD of the SPAD pixel 162 in the pixel wafer 170. The SPAD 190 includes a p-type body 191 on which a p-type anode 192 and an n-type cathode 194 have been fabricated. There may be an avalanche region 193 at the junction of the p-type anode 192 and the n-type cathode 194. The SPAD pixel 162 may be electrically shielded from adjoining SPADs of the pixel wafer 170 by the isolation wall 168.

The SPAD pixel 162 may be doped so that the p-type body 191 has a doping gradient, in which the concentration of dopants increases both vertically from the surface 102 to the light gathering backside surface 106, as shown by gradient indicators 196a, and laterally from the center of the p-type body to the isolation wall 168, as shown by gradient indicators 196b. The doping gradient of the SPAD pixel 162 may be based on, or a variation of, the doping gradient described in the disclosures of U.S. patent application Ser. No. 15/713,477, now U.S. Pat. No. 10,438,987, the contents of which are hereby included by reference in their entirety.

The doping gradient may allow for guiding of photon-induced charge carriers to the junction of the n-type cathode 194 and the p-type anode 192. For example, a centrally arriving photon 198a may generate the charge carrier 199a (in this case, an electron) that then is guided by the vertical gradient to the junction. Alternatively, a photon 198b entering the SPAD pixel 162 near a side wall may generate the charge carrier 199b that may be guided by the lateral doping gradient toward the center, and so may have greater probability of inducing an avalanche current at the junction.

SUMMARY AND BACKGROUND OF FAMILIES OF EMBODIMENTS

Described below are at least four families of embodiments of circuits, configurations, and layouts of control circuitry and pixel wafers, photoreceptor pixels and their included SPADs, and other components that may form part of an image sensor. It is to be understood that this classification is not to be construed as limiting or restrictive; various features, components, and configurations of the embodiments may occur in more than one family. Further, the features, components, and configurations described in the embodiments in these families may be combined in still further embodiments.

While descriptions of certain features, components, and subcomponents described for a first embodiment may be referenced in regard to, or described as applying to, analogous features, components, and subcomponents of a second embodiment, it is to be understood that those analogous features, components, and subcomponents of the second embodiment may be implemented with variations consistent with the scope of those descriptions.

In these embodiments there may be dual level supply voltages: a higher-level supply voltage, $V_{DDH}$, and a lower level supply voltage, $V_{DDL}$. Additionally, the embodiments may have a SPAD voltage supply and a ground supply. In some of the described embodiments, certain control transistors, e.g., gating transistors, may be placed on the pixel array. In some of the embodiments, these may be control transistors that may need to operate from the higher voltage supplies.

The various components of pixels may be formed by any of various fabrication techniques, such as ion implantation, etching and deposition, or other fabrication techniques. The various components may be formed or fabricated into a semiconductor wafer, e.g., a p-type substrate or an n-type substrate.

First Family: Two Transistors in a SPAD Pixel Cell

The first family of embodiments is directed to light or image sensors, and their internal components and features that include an array of pixels formed on a pixel wafer joined or bonded to a logic or control circuitry wafer. The pixels may contain SPADs as the photodetectors. In the first family of embodiments, two of the transistors of the control circuitry are formed on the pixel wafer for each pixel. The pixels are also referred to herein as "pixel cells."

Figure 2:
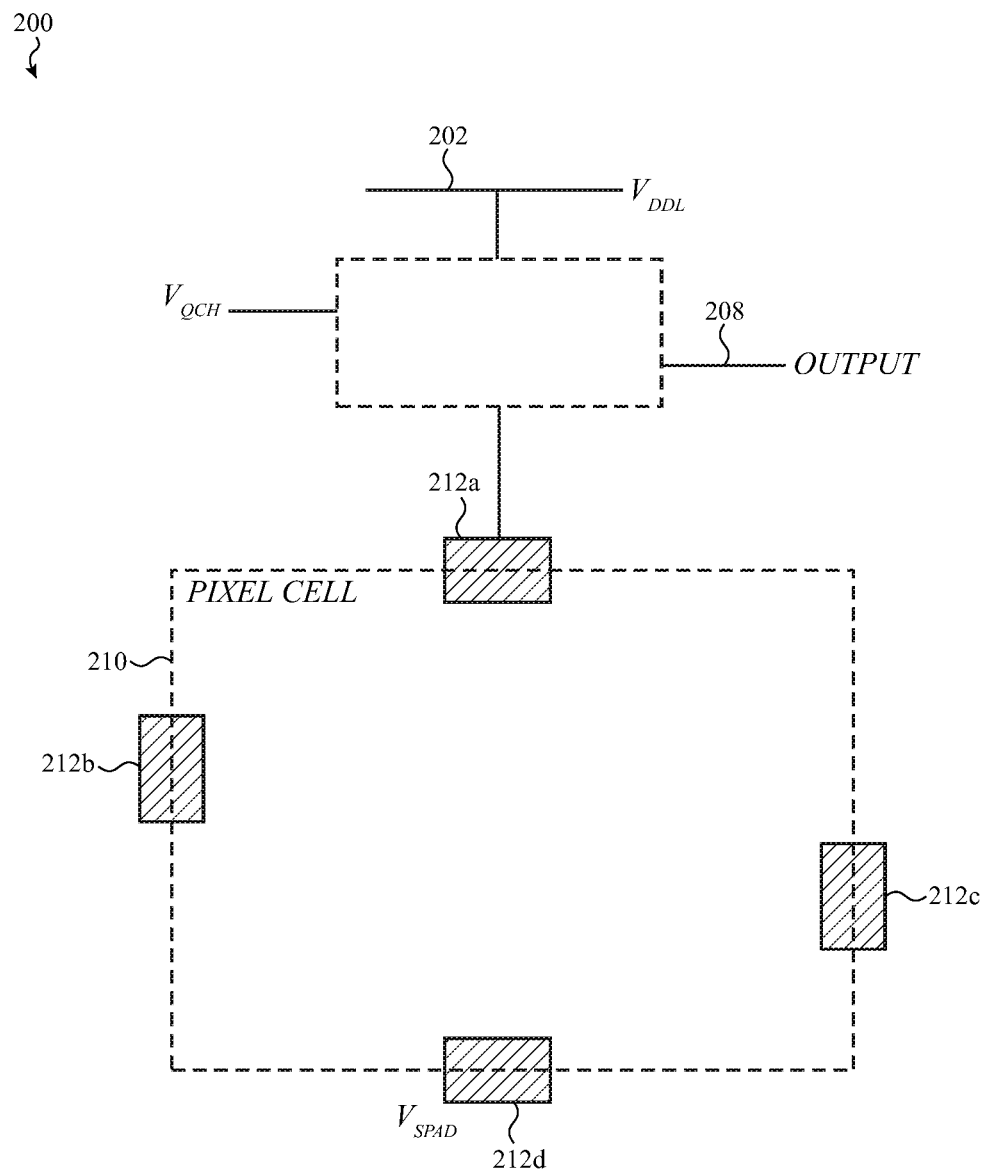
FIG. 2 illustrates a circuit diagram of a supply and control circuitry associated with a SPAD pixel, according to an embodiment.

FIG. 2 illustrates a generalized diagram 200 for an embodiment of a pixel cell 210 and associated control and supply circuitry. The pixel cell 210 may be a section of a pixel array on a pixel wafer. The pixel cell 210 generally includes high-voltage circuit elements such as a SPAD, gating transistor, quenching transistor, and the like. The pixel cell 210 has interconnection pads 212a-d that provide electrical connections with exterior circuit components that may be located on a separate control wafer, as described above. The interconnection pads 212a-d may be copper and bonded with matching copper interconnection pads on a logic wafer.

By contrast, low-voltage circuitry segment 224 includes low-voltage elements, such as a quenching transistor, a buffer/inverter, and the like. Generally, the low-voltage circuitry segment 224 includes circuitry exterior to the pixel cell 210 and may draw voltage from the $V_{DDL}$ source 202. An output signal may be sent over the connection 208 to yet further components, such as signal conditioning and image processing components.

Figure 3A:
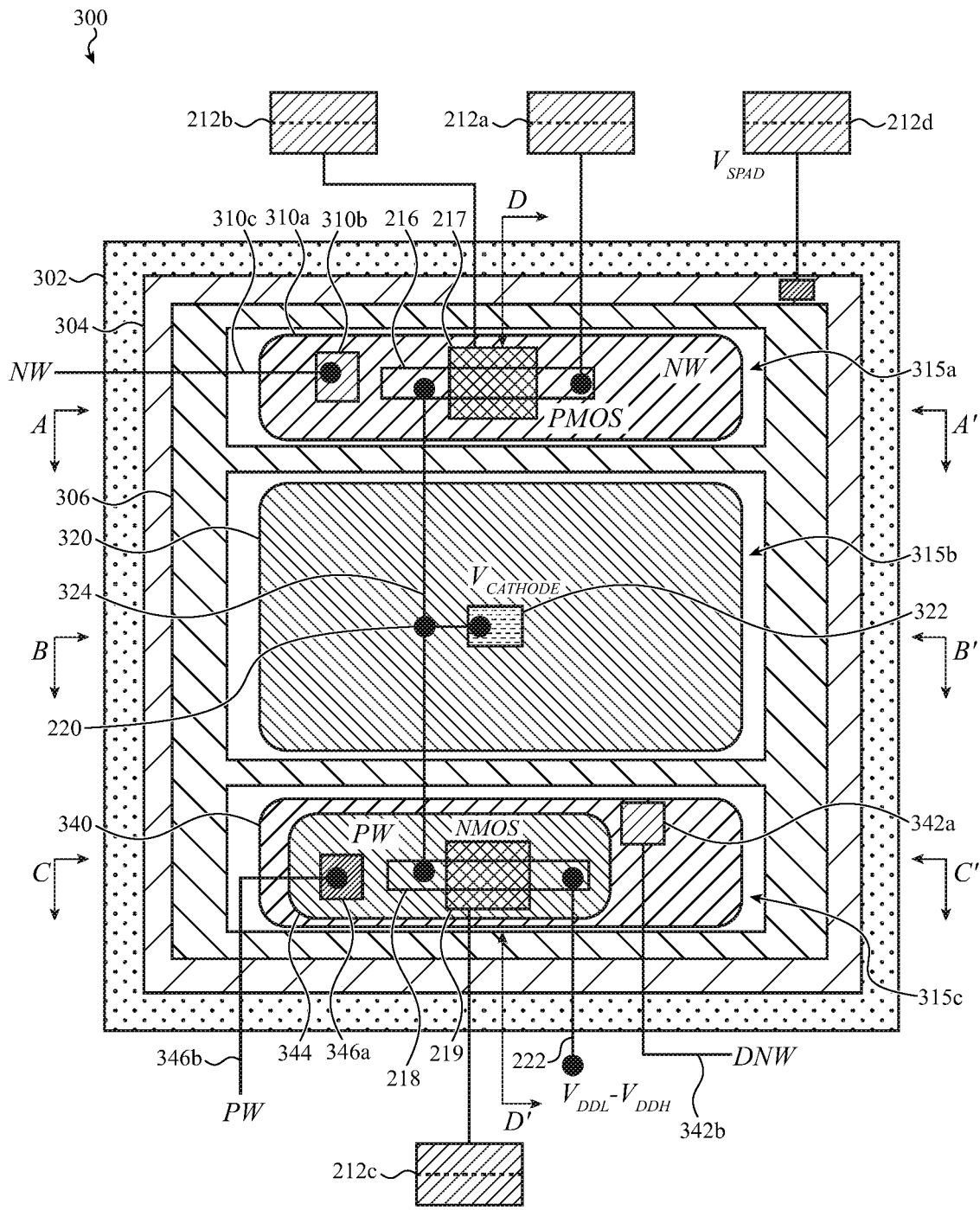
FIG. 3A illustrates a plan view of components of a SPAD pixel, according to an embodiment.

FIG. 3A shows a plan view of a pixel cell 300 that provides a first configuration of the components of the pixel cell 210. The shown surface of the pixel cell 300 may correspond to the surface 102 of FIG. 1A, with the light gathering surface of pixel cell 300 opposite to the shown surface of pixel cell 300. The pixel cell 300 is configured with a rectangular well, ringed with an isolation layer 302 that separates the pixel cell 300 from other pixel cells within a pixel wafer. The isolation layer may be silicon dioxide. The pixel cell 300 has an anode layer 304 internally bordering the isolation layer 302. The anode layer 304 may be p-type and may be electrically connected to the interconnection pad 212d.

The pixel cell 300 is configured with a shallow trench isolation (STI) layer 306 internal to the anode layer 304 to form at least three regions: a first transistor region 315a, a central SPAD region 315b, and a second transistor region 315c that are in separated wells. In the particular version of the embodiment shown, the first transistor region 315a is located on a first side of the central SPAD region 315b, with the second transistor region 315c located on a second side of the central SPAD region 315b opposite to the first side. In the particular version of the embodiment shown, the STI layer 306 forms surrounding rings around the first transistor region 315a, the central SPAD region 315b, and the second transistor region 315c. Other versions of the embodiment may have an alternate positioning of the three regions.

The SPAD 214 in this configuration may be implemented as an n-type cathode layer 320 positioned over (relative the orientation shown) a p-type anode layer, as shown and described further below. The SPAD 214 may have a cathode electrode 322 connected to the n-type cathode layer 320. The cathode electrode may extend over some or all of the n-type cathode layer. The cathode electrode 322 may be electrically connected with the interconnect line 324, which may be a metallic or other trace.

The pMOS HV quenching transistor (which may be part of the pixel cell 210 of FIG. 2) may be situated in the first transistor region 315a. The pMOS HV quenching transistor 216 may be situated in an n-type semiconductor well (NW) 310a. The NW 310a may have an NW bias section 310b linked to an NW connection line 310c. A bias voltage may be applied on the NW connection line 310c; in some versions, the bias voltage may be 0.8V, although other bias voltages may be used. The source of the pMOS HV quenching transistor 216 is connected to the interconnection pad 212a, as described above. The drain of the pMOS HV quenching transistor 216 is linked with the interconnect line 324 to form a node 220 within the pixel cell 210. The gate 217 of the pMOS HV quenching transistor 216 is linked with the interconnection pad 212b, as described above.

The nMOS gating transistor 218 may be situated in the second transistor region 315c. The nMOS gating transistor 218 may be situated in a p-type semiconductor well (PW) 344. The PW 344 may have a PW bias section 346a linked with the PW connection link 346b, at which PW bias voltage may be applied. In some versions, the PW bias applied voltage may be $V_{DDL}$-$V_{DDH}$. The PW 344 then is situated within a deep n-type semiconductor well (DNW) 340. The DNW 340 may have a DNW bias section 342a linked to a DNW connection line 342b. A bias voltage may be applied on the NW connection line 310c; in some versions, the bias voltage may be 0.8V, although other bias voltages may be used. The source of the nMOS gating transistor 218 is connected along the voltage supply link 222 to the supply voltage $V_{DDL}$-$V_{DDH}$, as described above. The drain of the nMOS gating transistor 218 is linked with the interconnect line 324 to form the node 220. The gate 219 of the nMOS gating transistor 218 is linked with the interconnection pad 212c, as described above.

The interconnection pads 212a-d may be positioned above the surface of the pixel cell 300 (that is, out of the page) rather than in the plane of the shown top surface. Such a configuration or positioning of the interconnection pads 212a-d may be based on FIG. 1D. Such a configuration, or similar configurations, allows the wafer containing the pixel cell 300 to be joined to a control wafer containing the exterior circuit components shown in FIG. 2 (e.g., high-voltage circuitry segment 224).

Figure 3B:
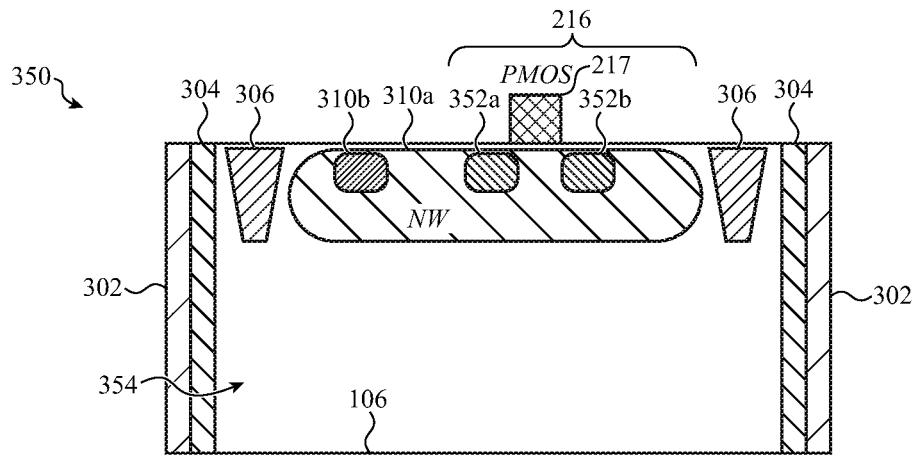
FIG. 3B illustrates a first cross-sectional view of the SPAD pixel of FIG. 3A, according to an embodiment.

FIG. 3B shows a horizontal ("x-axis") cross-sectional view 350 along the horizontal cut line A-A' of FIG. 3A. The left and right edges in the cross-sectional view 350 show that the isolation layer 302 and the anode layer 304 may extend to the backside surface 106 at which light is received for imaging, though this is not required. The cross-sectional view 350 shows that the pixel cell 300 contains a p-type substrate 354 (P-EPI), into which the pMOS HV quenching transistor 216 is formed. The STI layer 306 may be formed without extending to the backside surface 106, but may extend sufficiently to electrically isolate the pMOS HV quenching transistor 216, and may extend deeper than the NW 310a, though this is not required. The NW 310a may extend to contact the STI layer 306, or there may be a gap containing an extension of the p-type substrate 354 between the NW 310a and the STI layer 306. In the particular version of the embodiment shown in the cross-sectional view 350, the NW bias section 310b is disposed away from the drain 352a and source 352b of the pMOS HV quenching transistor 216.

Figure 3C:
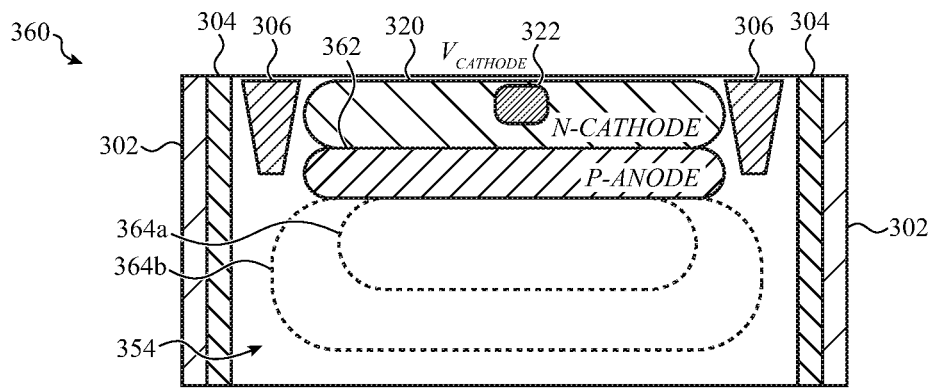
FIG. 3C illustrates a second cross-sectional view of the SPAD pixel of FIG. 3A, according to an embodiment.

FIG. 3C shows a horizontal ("x-axis") cross-sectional view 360 of the pixel cell 300 along the horizontal cut line B-B' of FIG. 3A. The isolation layer 302, anode layer 304, and STI layer 306 may be as described with respect to FIG. 3B. The pixel cell 300 in this embodiment has an n-type cathode layer 320 positioned above a p-type anode layer 362. The STI layer 306 may extend deeper than p-type anode layer 362, though this is not required. The p-type substrate 354 is shown with doping gradient contour levels 364a and 364b, which may be based on the description given with respect to FIG. 1E. The n-type cathode layer 320 has cathode electrode 322 to provide electrical connection to the node 220, as described above.

Figure 3D:
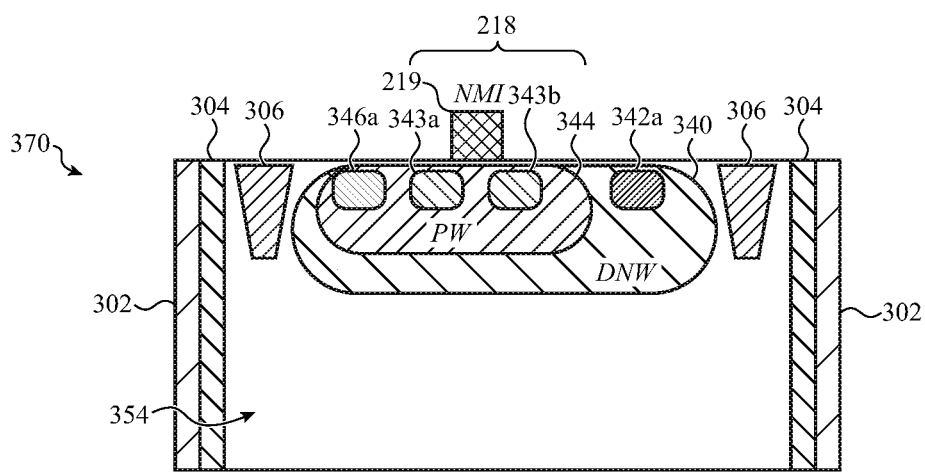
FIG. 3D illustrates a third cross-sectional view of the SPAD pixel of FIG. 3A, according to an embodiment.

FIG. 3D shows a horizontal ("x-axis") cross-sectional view 370 of the pixel cell 300 along the horizontal cut line C-C' of FIG. 3A. The isolation layer 302, anode layer 304, and STI layer 306 may be as described with respect to FIG. 3B. The PW 344 is shown contained in the DNW 340. The PW bias section 346a is positioned in the PW 344 on a side of the nMOS gating transistor 218 opposite to the position of the DNW bias section 342a, though this is not required. Conduction through the drain 343a and the source 343b of the nMOS gating transistor 218 is controlled by voltage signals applied to the gate 219, as described above.

Figure 3E:
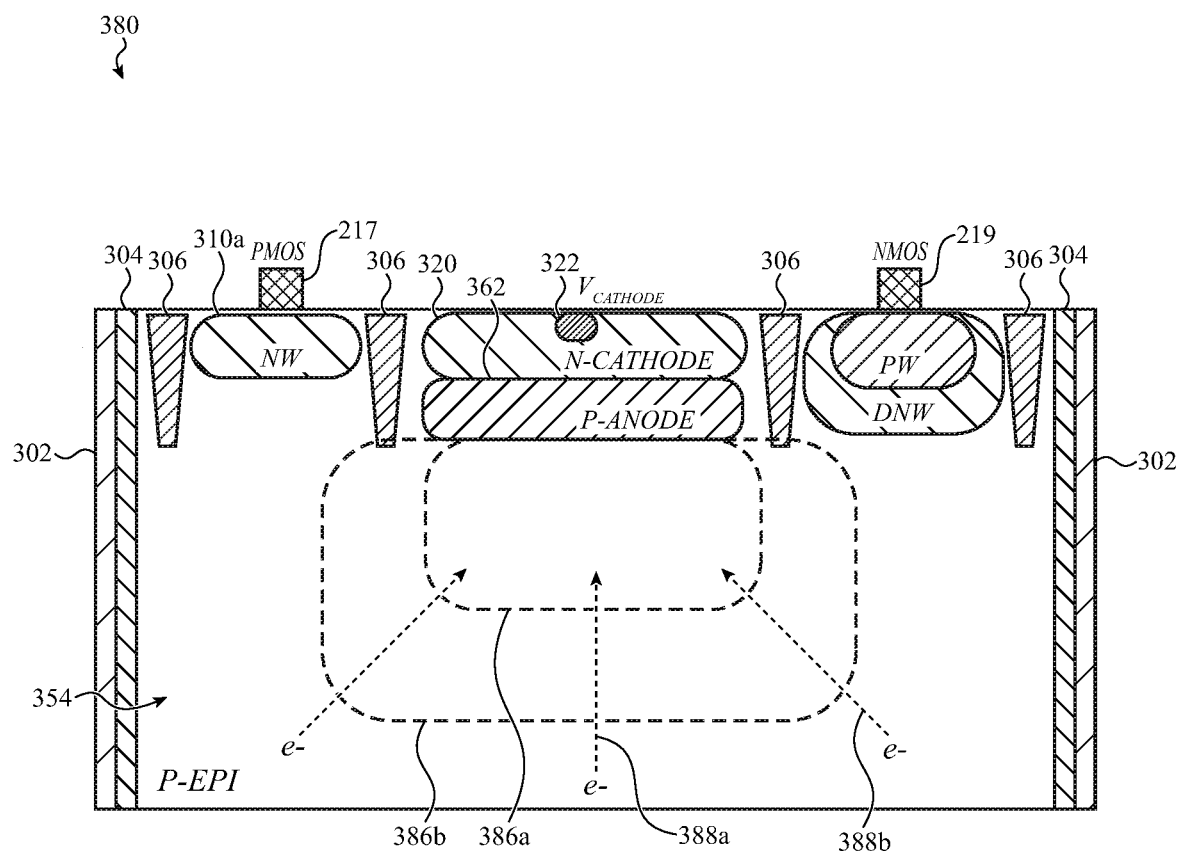
FIG. 3E illustrates a fourth cross-sectional view of the SPAD pixel of FIG. 3A, according to an embodiment.

FIG. 3E shows a vertical ("y-axis") cross-sectional view 380 of the pixel cell 300 along the vertical cutline D-D' of FIG. 3A. The cross-sectional view 380 illustrates that the doping gradient in the p-type substrate 354, indicated by gradient level lines 386a and 386b, may extend beneath the pMOS HV quenching transistor 216 and the nMOS gating transistor 218. With such a doping gradient, a photon-induced charge carrier 388a, induced by a photon received at the center of the backside surface of the pixel cell 300, may be directed without deflection toward the avalanche junction region at the interface of the p-type anode layer 362 and the n-type cathode layer 320. But a photon received toward an edge of the backside surface of the pixel cell 300 may be deflected by the doping gradient toward the avalanche junction region.

Figure 4A:
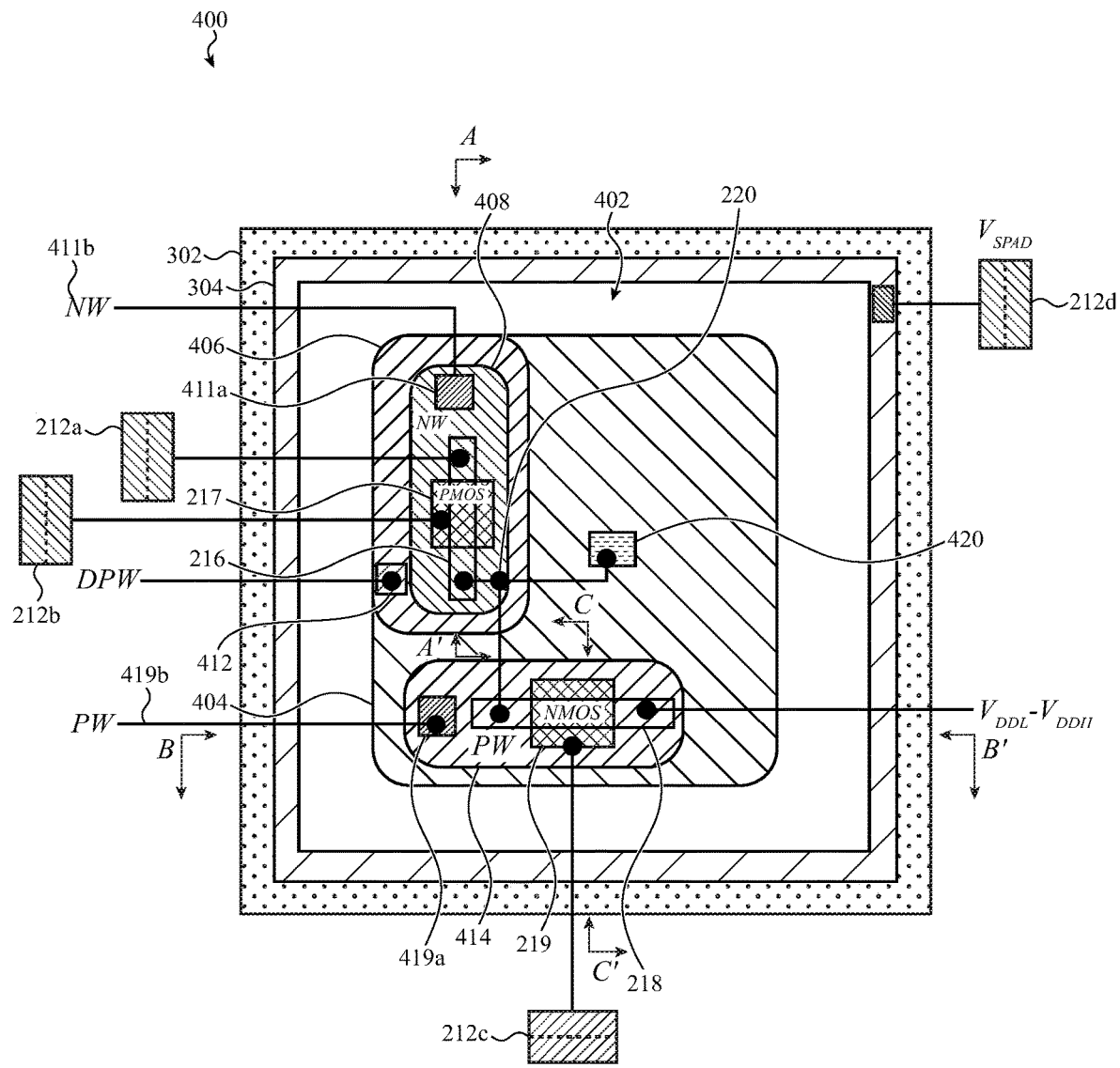
FIG. 4A illustrates a plan view of components of a SPAD pixel, according to an embodiment.

FIG. 4A illustrates a plan view of a second embodiment by which two control transistors may be included in each pixel cell of a pixel wafer. The pixel cell 400 may implement the circuitry discussed with respect to FIG. 2. The pixel cell 400 implements a layout or configuration for the pMOS HV quenching transistor 216 and the nMOS gating transistor 218 described and shown in relation to FIG. 3. Unlike the embodiment described in FIGS. 3A-E, the pixel cell 400 does not make use of shallow trench isolation to create separated regions for components. Instead, pixel cell 400 implements a SPAD in which the n-type cathode layer and a p-type anode layer that form the avalanche junction are both formed, at least partially, underneath the surface of the pixel cell 400.

FIG. 4A illustrates pixel cell 400 formed as a rectangular well having a surrounding isolation layer 302 and an anode layer 304, such as described above in relation to FIGS. 3A-E. The anode layer 304 may be electrically connected through interconnection pad 212d to the biasing voltage source $V_{SPAD}$, as previously described. The components of pixel cell 400 may be formed in or on a p-type substrate 402, as shown in more detail below in FIGS. 4B-C. Within the p-type substrate 402 may be formed in an n-type well (NW) 404 that has cathode electrode 420 as an electrical connection to the node 220.

In the configuration shown in FIG. 4A, the pMOS HV quenching transistor 216 may be positioned within an internal NW 408, that is itself positioned within a deep p-type well (DPW) 406. The DPW may be provided with a bias supply voltage at the DPW bias section 412, and the internal NW 408 may be linked with an NW bias voltage 411a provided at the NW bias section 411b. The pMOS HV quenching transistor 216 may have its source connected to the interconnection pad 212a, its gate 217 connected to the interconnection pad 212B, and its drain connected to the node 220, as described for the embodiments of FIGS. 3A-E.

The nMOS gating transistor 218 may be positioned within a PW 414, which may be supplied at the bias section 419a by the PW bias voltage 419b. The nMOS gating transistor 218 may have its drain and source connected as described for the embodiments of FIGS. 3A-E, and its gate 219 connected to the interconnection pad 212c. The pMOS HV quenching transistor 216 is shown with its source/gate/drain axis perpendicular to the source/gate/drain axis of the nMOS gating transistor 218, but this is not required.

Figure 4B:
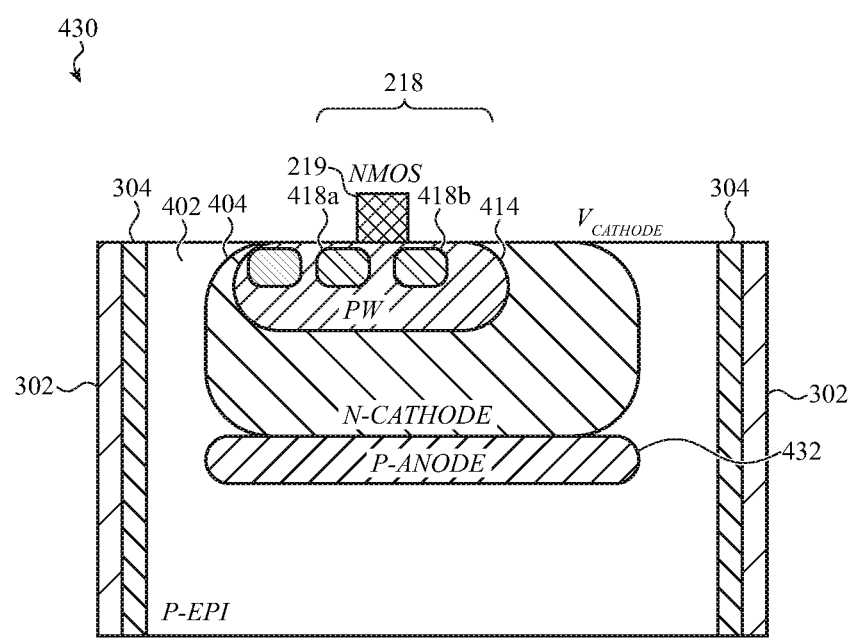
FIG. 4B illustrates a first cross-sectional view of the SPAD pixel of FIG. 4A, according to an embodiment.

FIG. 4B shows a horizontal cross-sectional ("x-axis") view 430 of the pixel cell 400 along the cut line B-B' of FIG. 4A, through the nMOS gating transistor 218. The view 430 shows the positioning of the PW 414 within the n-type cathode layer 404 that forms the cathode of the SPAD of the pixel cell 400. The p-type anode layer 432 is positioned as a buried layer beneath the n-type cathode layer 404, within the p-type substrate 402. The nMOS gating transistor has its drain 418a and source 418b positioned within the PW 414 as shown with respect to the gate 219.

Figure 4C:
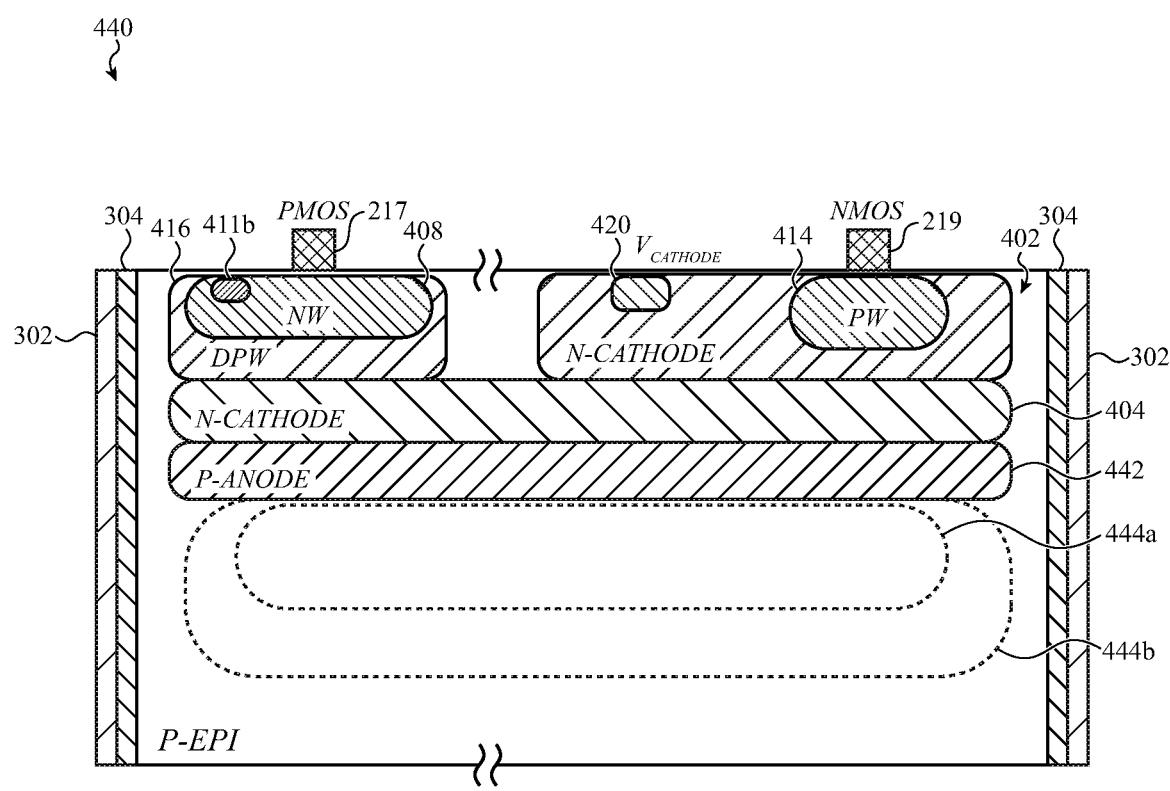
FIG. 4C illustrates a second cross-sectional view of the SPAD pixel of FIG. 4A, according to an embodiment.

FIG. 4C shows a shifted ("zig-zag") vertical cross-sectional view ("y-axis") 440 along the dual and shifted cut lines A-A' and C-C' shown in FIG. 4A. FIG. 4C shows that the n-type cathode layer 404 may extend as a buried layer under the pMOS HV quenching transistor 216 and the nMOS gating transistor 218, and may also extend to the surface of the pixel cell 400 away from the DPW 416 and the PW 414 that respectively provide isolation of the pMOS HV quenching transistor 216 and the nMOS gating transistor 218. As previously described, the p-type substrate 402 may have a doping gradient, as indicated by the doping gradient contour lines 444a and 444b, that may operate to direct photon-induced charge carriers to the center of the pixel cell 400.

Figure 5A:
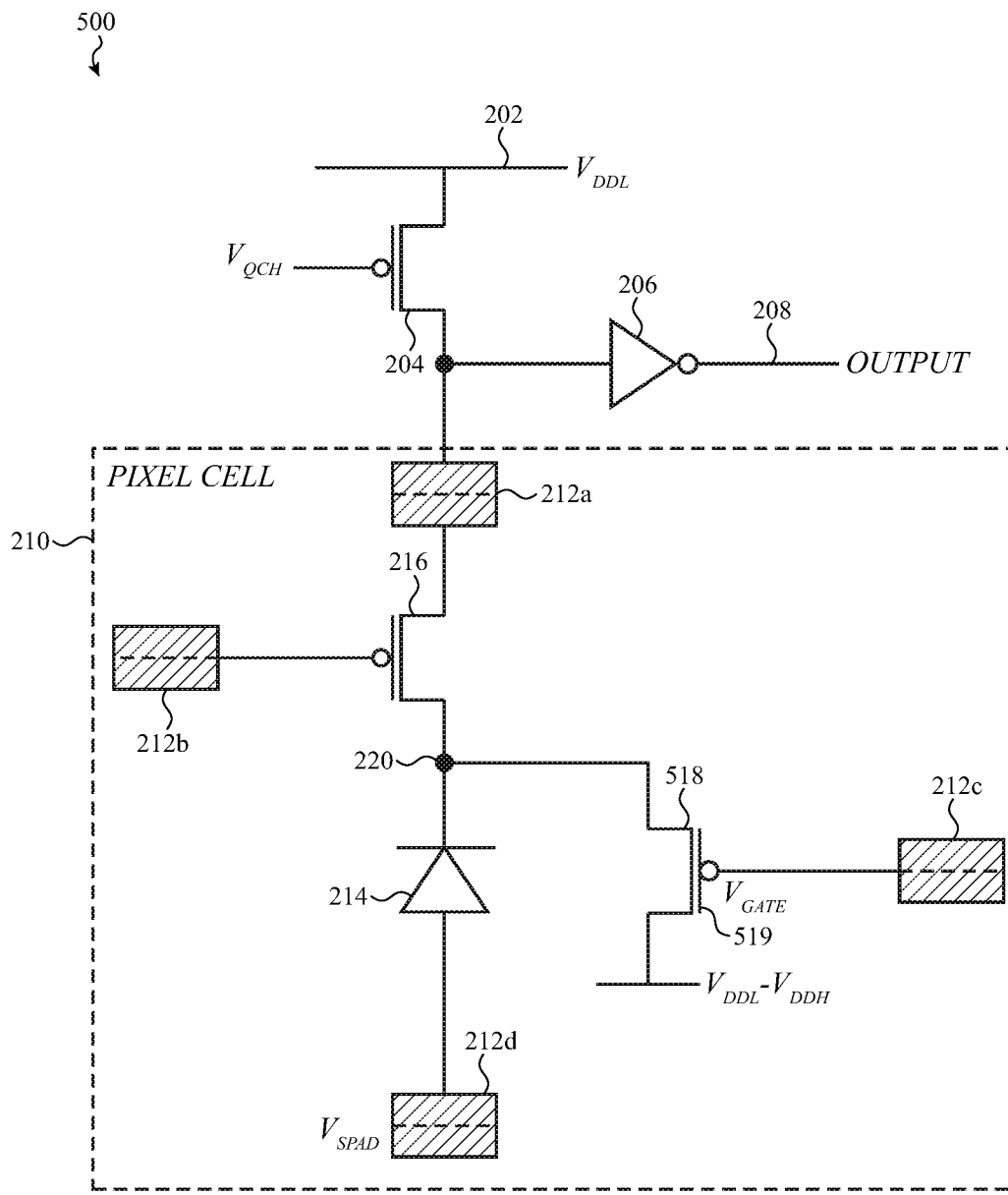
FIG. 5A illustrates a circuit diagram of a supply and control circuitry associated with a SPAD pixel, according to an embodiment.

FIG. 5A shows a circuit diagram 500 that is conceptually similar to the circuit diagram 200 of FIG. 2, although with specific detail. In the circuit diagram 500, a pMOS gating transistor 518 is used instead of the nMOS gating transistor 218 of FIG. 3. The other components shown in FIG. 5A are as described in relation to FIGS. 2 and 3.

Figure 5B:
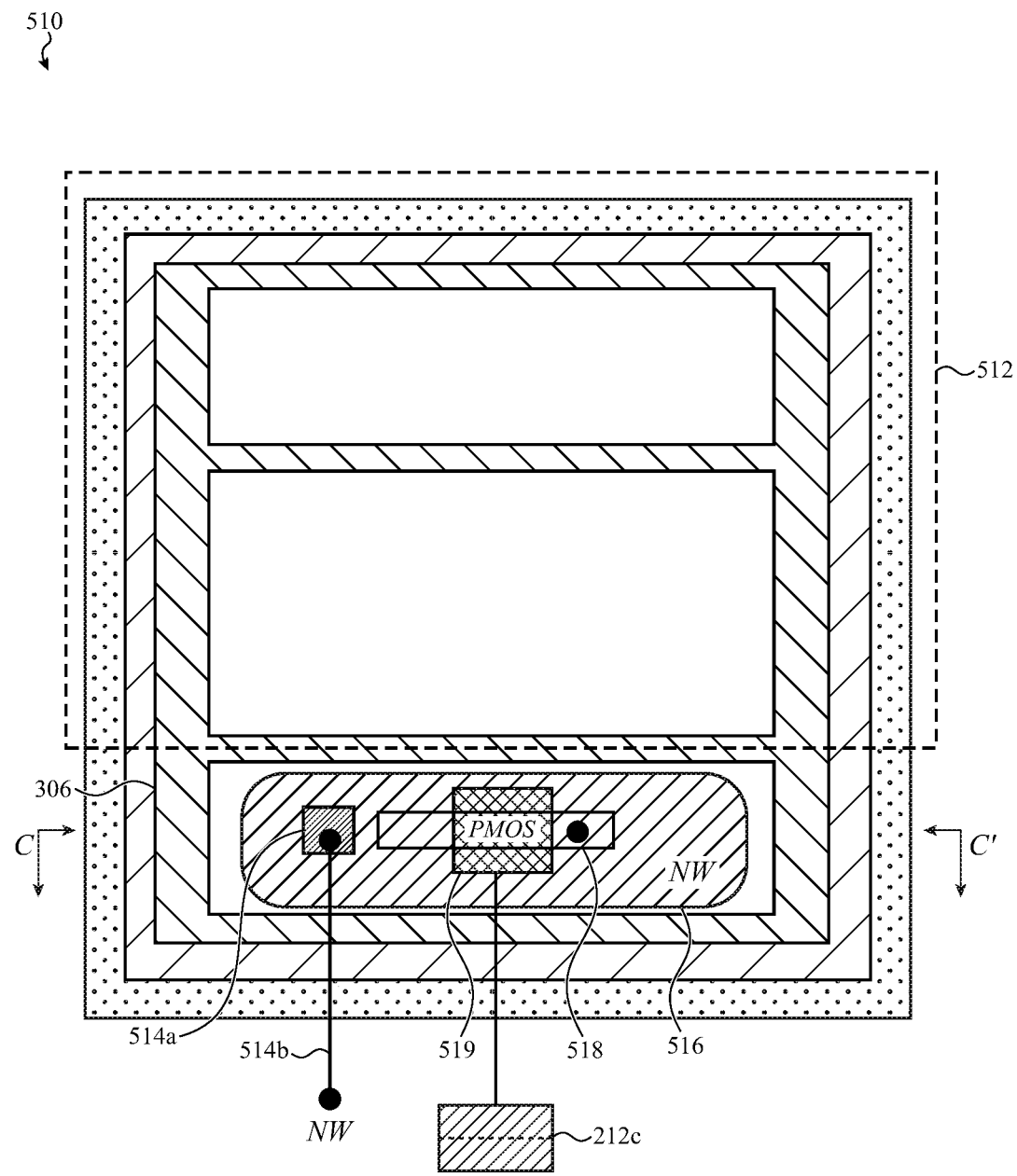
FIG. 5B illustrates a cross-sectional view of the SPAD pixel implementing the circuitry of FIG. 5A, according to an embodiment.

FIG. 5B shows a plan view of a configuration for a third embodiment in which two control transistors may be included with each pixel of a pixel wafer. The pixel 510 is similar to the pixel cell 300 described in relation to FIGS. 3A-E; in particular, the pixel 510 uses the STI layer 306 to create separated regions for the components shown in FIG. 5A. The area 512 may be as described for the pixel cell 300. Pixel 510 differs from pixel cell 300 in that there is now a pMOS gating transistor 518 in place of the nMOS gating transistor 218 of pixel cell 300. The pMOS gating transistor 518 is formed in the NW 516, with the gate 519 connected to the interconnection pad 212c as shown. The NW 516 may have a bias section 514A to which the NW bias voltage 514b is applied. Along the horizontal cut line C-C' of FIG. 5B, the cross-sectional view would be analogous to the cross-sectional view shown in FIG. 3B, with similar corresponding descriptions.

Figure 6A:
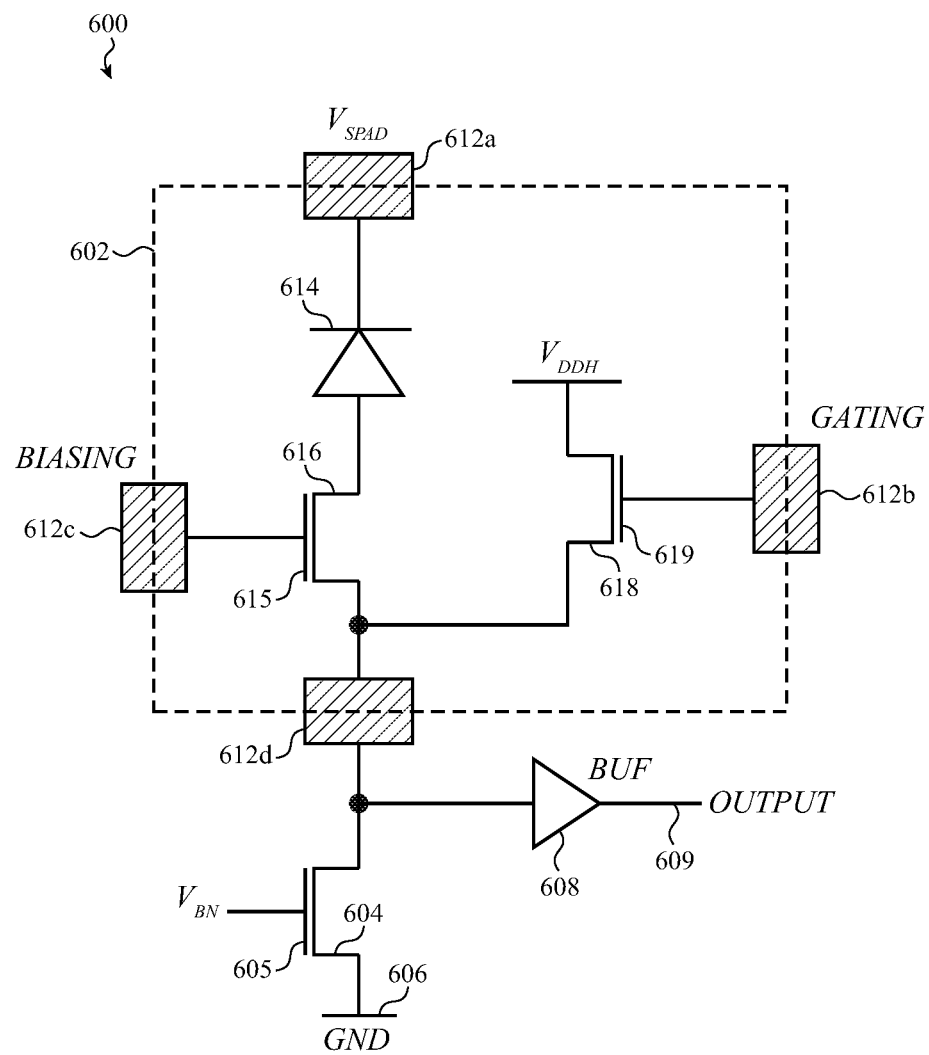
FIG. 6A illustrates a circuit diagram of a supply and control circuitry associated with a SPAD pixel, according to an embodiment.

FIG. 6A is a circuit diagram 600 that shows a SPAD pixel cell that includes the SPAD 614, and two control transistors, as well as associated supply and control circuit elements. This illustrates a fourth embodiment in which a pixel wafer having an array of SPAD photodetectors may also include two control transistors that might otherwise be positioned on a logic wafer to which the pixel wafer is joined or bonded. The embodiment of FIG. 6A includes two nMOS transistors within each pixel cell 602, and so the biasing may be implemented differently than in the previous embodiments.

The associated supply and control circuit elements that are external to the pixel cell 602 may include an nMOS quenching transistor 604 with its source connected to circuit ground 606, and its drain linked to the interconnection pad 612d of the pixel cell 602. The nMOS quenching transistor 604 is controlled by signals received at its gate 605, such as voltage signal $V_{BN}$, applied at its gate 605. The output of the pixel cell 602 is received at the drain of the nMOS quenching transistor 604 and is transmitted by the buffer 608, which may also provide signal amplification, onto the output line 609.

The pixel cell 602 includes at least a SPAD 614, an nMOS biasing transistor 616, and an nMOS gating transistor 618. The nMOS biasing transistor 616 may operate to place the SPAD 614 in a reverse bias condition for photon detection. The drain of the nMOS gating transistor 618 is biased at $V_{DDH}$, with its gate linked to receive gating signals through the interconnection pad 612b. The cathode of the SPAD 614 may be connected through the interconnection pad 612a to the supply voltage $V_{SPAD}$, which in some implementations of this embodiment may be at $V_{SPAD}=V_{BD}+V_{DDH}$, for $V_{BD}$ the breakdown voltage of the SPAD 614.

Figure 6B:
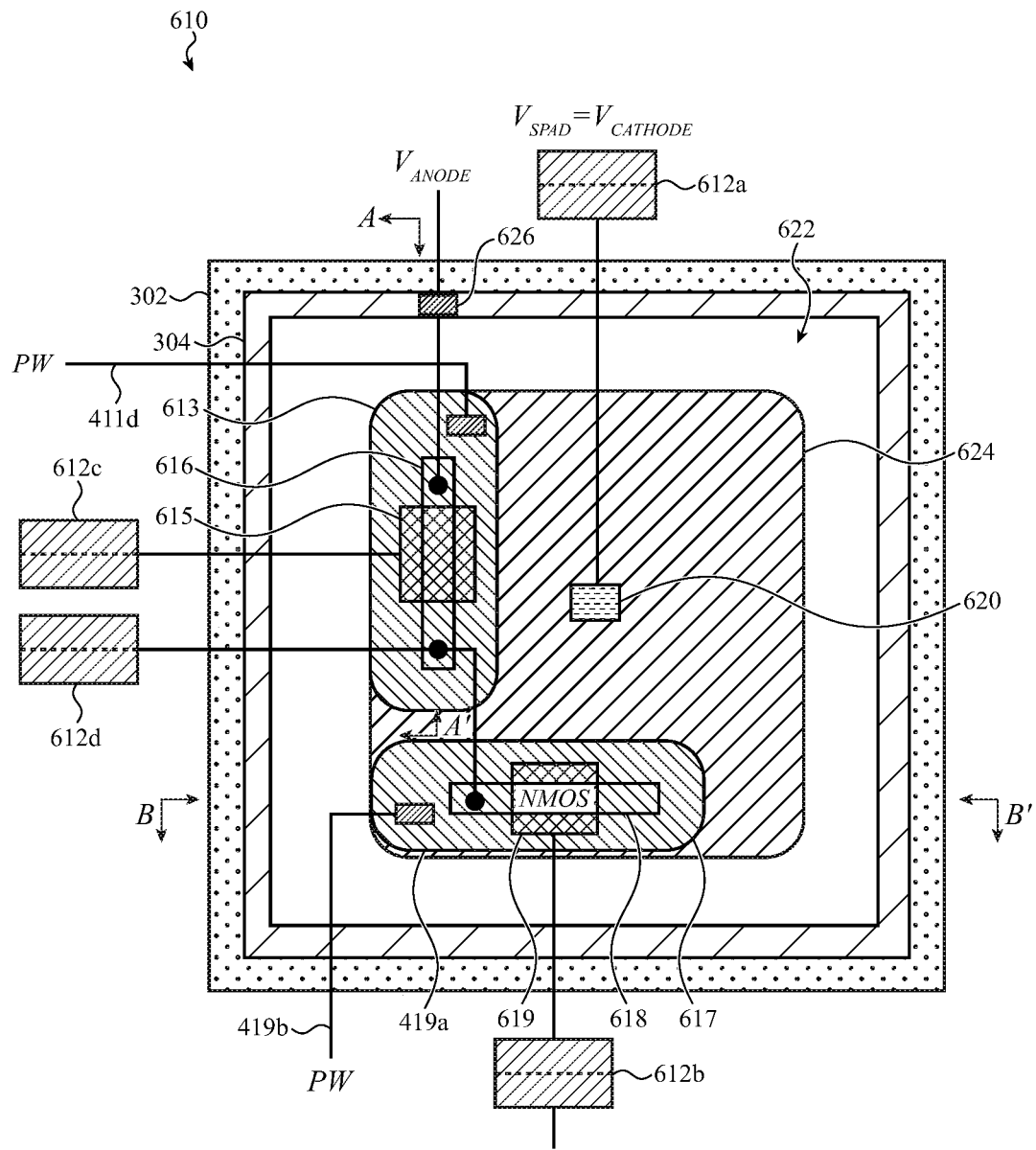
FIG. 6B illustrates a plan view of the components of the SPAD pixel of FIG. 6A, according to an embodiment.

FIG. 6B shows a plan view 610 of a layout or configuration of the circuit components of the circuit diagram 600 within the pixel cell 602. As described for previous embodiments, the pixel cell 602 may be contained within a rectangular isolation layer 302, internal to which is an anode layer 304. The components in the pixel cell 602 may be implemented on a p-type substrate 622. An n-type cathode layer 624 may be in a buried layer to extend beneath the nMOS biasing transistor 616 and the nMOS gating transistor 618, as shown below, to provide a large avalanche junction area. The n-type cathode layer may also extend to the top surface, as shown below, and have a cathode electrode 620 that is connected to the interconnection pad 612a.

The nMOS biasing transistor 616 and an nMOS gating transistor 618 are formed within respective PWs 613 and 617. The PWs 613 and 617 may have bias sections, not shown for brevity, analogous to the bias section 419a, at which respective bias voltages may be applied. Though the nMOS biasing transistor 616 and the nMOS gating transistor 618 are positioned so that the drain/gate/source axes are orthogonal, in other variations of this embodiment, the nMOS biasing transistor 616 and the nMOS gating transistor 618 may be positioned differently in the pixel cell 602. The gate 615 of the nMOS biasing transistor 616 is linked with the interconnection pad 612c, and the gate 619 of the nMOS gating transistor 618 is linked with the interconnection pad 612b.

Figure 6C:
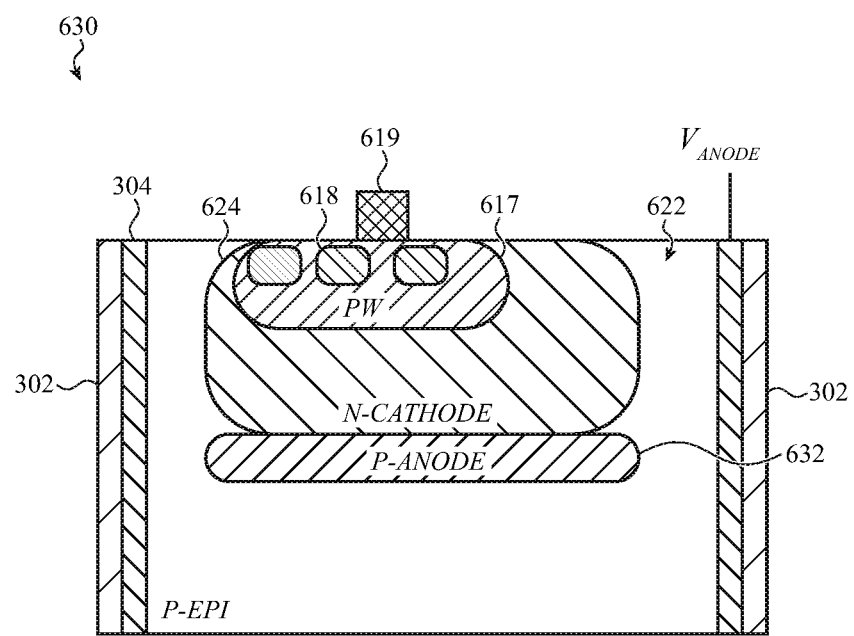
FIG. 6C illustrates a cross-sectional view of the SPAD pixel of FIG. 6B, according to an embodiment.

FIG. 6C shows a horizontal cross-sectional view 630 along the cut line B-B' shown in FIG. 6B. The nMOS gating transistor 618 is formed within the PW 617. The PW 617 itself is formed within the n-type cathode layer 624, which may extend both underneath and beyond PW 617. The p-anode layer 632 is formed beneath the n-type cathode layer 624 to allow for a large avalanche area at the junction of the p-anode layer 632 and the n-type cathode layer 624. The p-type substrate 622 may be implemented with a doping gradient, as described previously. FIG. 6C also shows a vertical cross-sectional view along the cut line A-A' of FIG. 6B, so the description is not repeated.

Figure 7A:
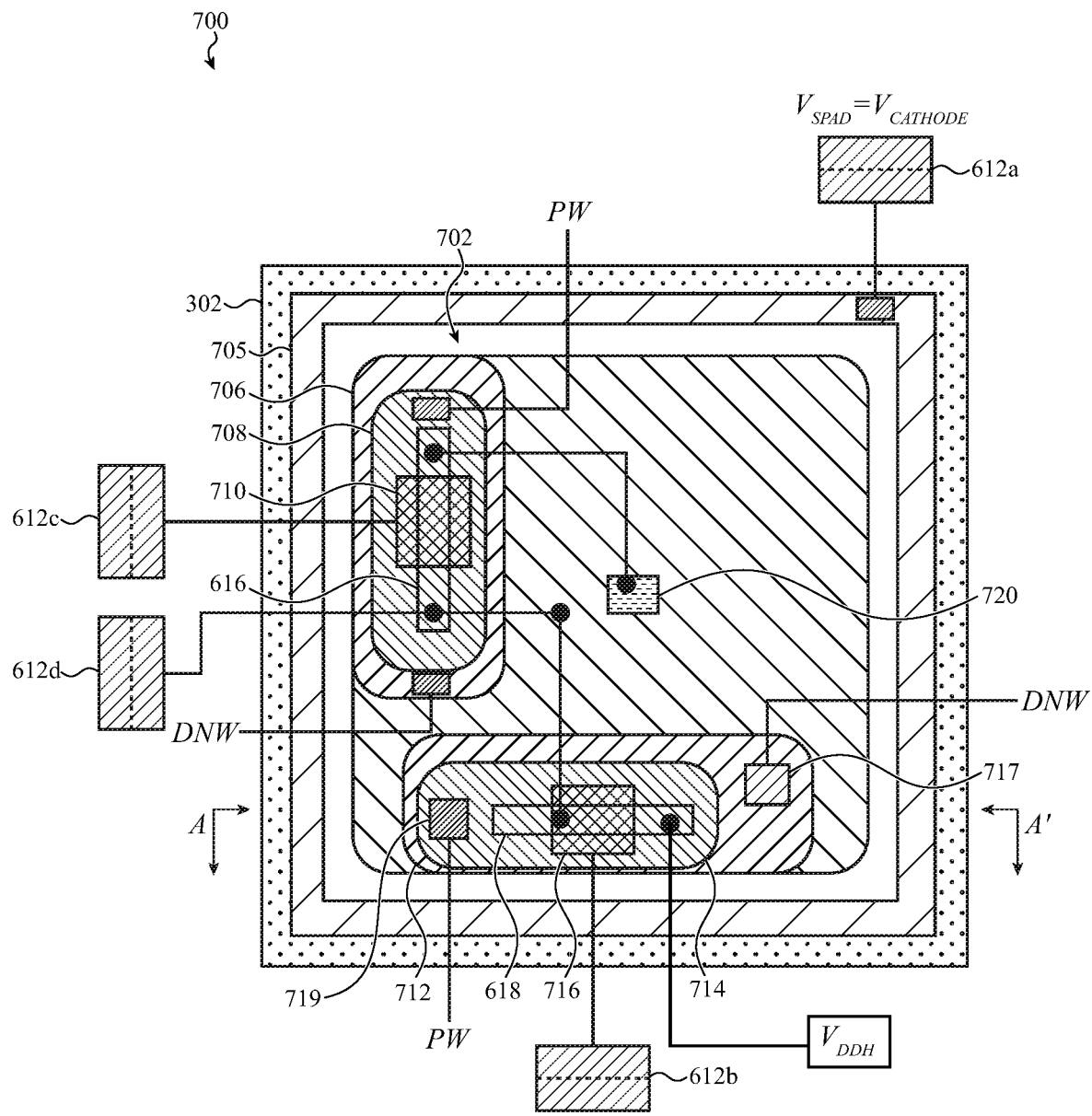
FIG. 7A illustrates a plan view of the components of a SPAD pixel, according to an embodiment.

FIG. 7A shows a plan view of a configuration of pixel cell 700 of a fifth embodiment in which two control transistors are included with each pixel cell of a pixel wafer. The configuration is based on and implements the circuit elements described in relation to the pixel cell 602 of FIG. 6A. The difference is that now pixel cell 700 is formed on an n-type substrate, with the control transistors being nMOS and formed in respective deep n-wells (DNWs).

As described for previous embodiments, the pixel cell 700 may be contained within a rectangular isolation layer 302. However, there is now an n-type cathode layer 705 internally bordering isolation layer 302. In this embodiment, the n-type cathode layer 705 is linked through the interconnection pad 612a to the cathode biasing cathode voltage $V_{SPAD}$. $V_{SPAD}$ may be set as: $V_{SPAD}=VBD+V_{DDH}$, for $V_{BD}$ the breakdown voltage, though this is not required.

The pixel cell 700 may include a p-type anode layer 732 that extends under the nMOS biasing transistor 616 and the nMOS gating transistor 618, and is positioned above an n-type cathode layer formed in the n-type substrate, as will be shown further below. The p-type anode layer 732 connects with the anode electrode 720.

The nMOS gating transistor 618 is controlled by signals applied to the gate 716 that is linked to control circuitry external to the pixel cell 700 through the interconnection pad 612b. The nMOS gating transistor 618 is positioned in the PW 714. The PW 714 may have bias section 719 at which a bias voltage is applied. The PW 714 is formed within the DNW 712, which may have a bias section 717 at which a DNW bias voltage is applied. The gate 716 connects to and receives external signals from the interconnection pad 612b. The source of the nMOS gating transistor 618 may connect to the VDDH source, which may be at $V_{DDH}$.

The nMOS biasing transistor 616 may be configured or formed similar to the nMOS gating transistor 618. The nMOS biasing transistor 616 may be formed within the PW 708, which may be formed within the DNW 706. The PW 708 and DNW 706 may be implemented with respective bias sections, as described above, but, for brevity, are not shown. The gate 710 of the nMOS biasing transistor 616 may be linked to and receive external signals through the interconnection pad 612c. The drain of the nMOS biasing transistor 616 is commonly linked with the drain of the nMOS gating transistor 618 to external circuit components through the interconnection pad 612d.

Figure 7B:
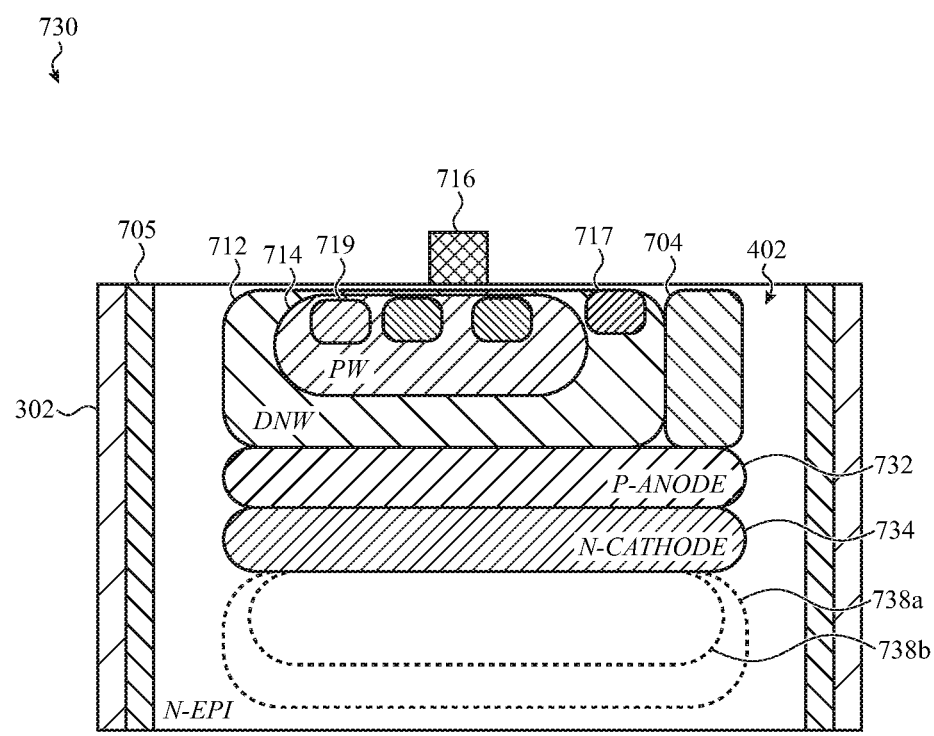
FIG. 7B illustrates a cross-sectional view of the SPAD pixel of FIG. 7A, according to an embodiment.

FIG. 7B shows a horizontal cross-sectional view 730 along the cut line A-A' of FIG. 7A. The nMOS gating transistor 618 is shown in cross section in the PW 714, which in turn is within the DNW 712. There is a part of the p-anode layer 732 that extends beneath the DNW 712, which may also have an extension 704 that extends to the top surface of the pixel cell 700. The n-type cathode layer 734 may be formed beneath all or most of the p-anode layer 732 to increase the size of the avalanche region formed by the n-type cathode layer 734 and the p-anode layer 732. The region of the n-type substrate 702 beneath the n-type cathode layer 734 may be formed with a doping gradient, as indicated by the doping gradient contour levels 738a and 738b.

Just as the fifth embodiment described in relation to FIGS. 7A-B implements the fourth embodiment described in relation to FIGS. 6A-C, but with semiconductor valence types (n-type and p-type) reversed for the substrate, and for the anode and cathode of the SPAD, one skilled in the art will recognize how to implement the other previous described embodiments with analogously reversed semiconductor types. Similarly, it will be recognized that for each of the following embodiments there will also be an analogous corresponding embodiment with similarly reversed semiconductor types.

Second Family: At Least Three Transistors in a SPAD Pixel Cell

The following embodiments of this section describe circuits and configurations by which a pixel wafer containing an array of SPAD pixels may include three control transistors within each pixel cell. Such control transistors, in other implementations, may have been located on a logic wafer to which the pixel wafer is bonded. Including the three control transistors on the pixel wafer may provide more space for circuit components on the logic wafer. The circuits and configurations described in these embodiments may maintain a large avalanche area within each SPAD. As many of the features, components, and subcomponents of the following embodiments may be similar or analogous to features, components, and subcomponents of previously described embodiments, such features, components, and subcomponents will not be described in the same detail. One skilled in the art will recognize the possible variations and adaptations, as may be useful or needed.

Figure 8A:
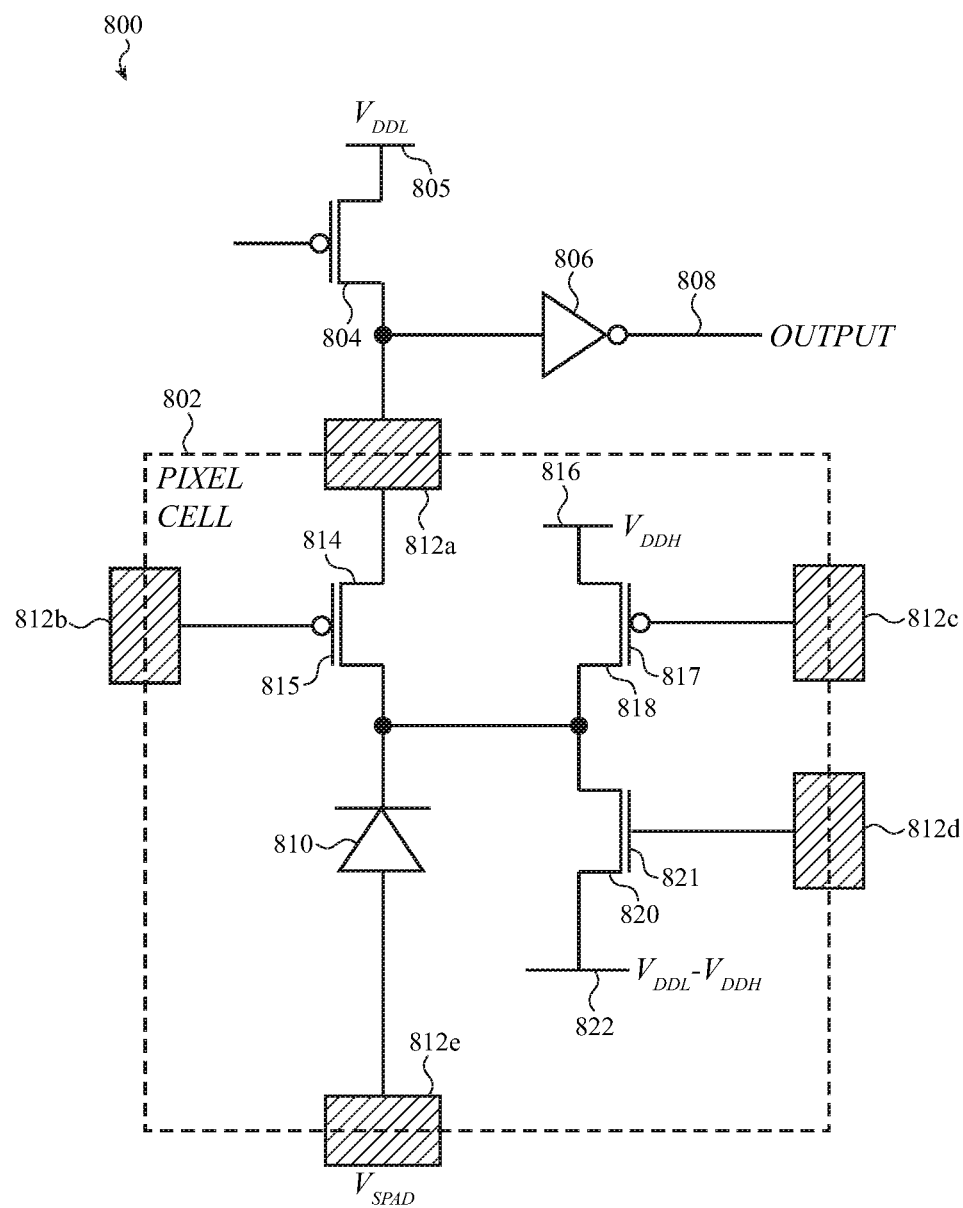
FIG. 8A illustrates a circuit diagram of a supply and control circuitry associated with a SPAD pixel, according to an embodiment.

FIG. 8A is a circuit diagram 800 for a sixth embodiment, in which there are three transistors within a pixel cell 802. The pixel cell 802 and the SPAD 810 are connected at its anode to the interconnection pad 812e to the voltage source $V_{SPAD}$. The cathode of the SPAD 810 is connected to the drain of the first internal pMOS transistor 814, a high voltage quenching transistor whose gate 815 is connected to the interconnection pad 812b through which control signals may be received. The source of the first internal pMOS transistor 814 is connected to the interconnection pad 812a, through which the supply voltage $V_{DDL}$ 805 is received. The exterior pMOS transistor 804 is a low voltage quenching transistor. The exterior control circuitry may include the inverting buffer 806, which applies output signals of the SPAD on the interconnect 808 to further components of the logic or control wafer.

The pixel cell 802 contains a pMOS recharging transistor 818, with gate 817 connected to interconnection pad 812c through which further control signals may be applied. The pMOS recharging transistor 818 is supplied at its source by a voltage supply at level $V_{DDH}$. In these embodiments there are two high voltages provided: $V_{DDL}$ and $V_{DDH}$, as well as offsets thereof and the anode voltage $V_{SPAD}$. The drain of the pMOS recharging transistor 818 is connected serially with the drain of the nMOS gating transistor 820, which has a gate 821 connected to the interconnection pad 812d through which gating signals (e.g., "on/off" signals) may be received from exterior control circuitry. The node connecting the drains of the pMOS recharging transistor 818 and the nMOS gating transistor 820 connects to the cathode of the SPAD 810. The source of nMOS gating transistor 820 is connected to the reduced supply voltage 822, which may have value $V_{DDL}-V_{DDH}$, or may have another value.

Figure 8B:
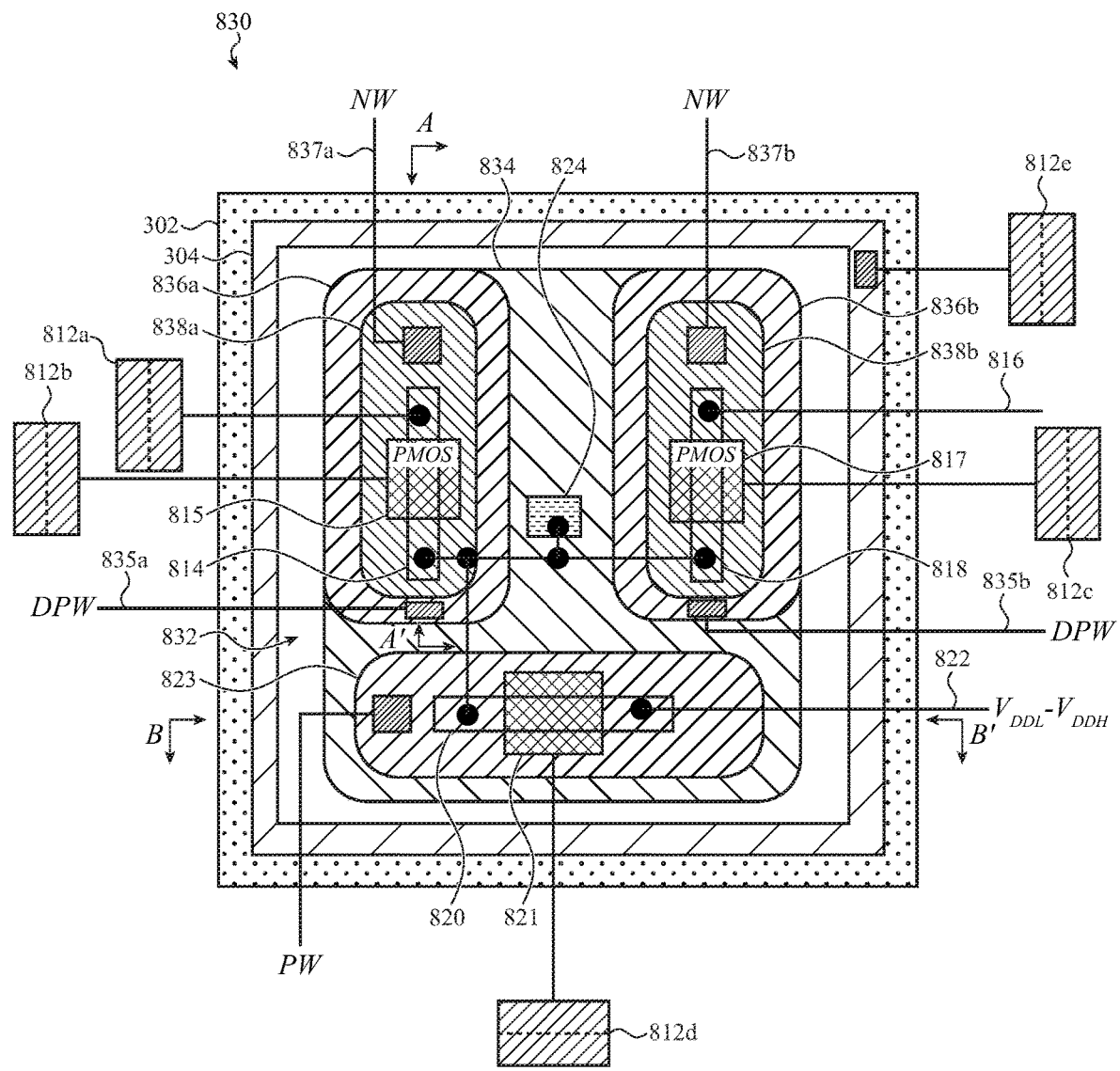
FIG. 8B illustrates a plan view of the components of the SPAD pixel of FIG. 8A, according to an embodiment.

FIG. 8B illustrates a plan view 830 of a configuration of certain elements of the pixel cell 802 of FIG. 8A. The pixel cell 802 is surrounded by the isolation layer 302, internal to which is the bordering anode layer 304, as described previously. The pixel cell 802 has an n-type cathode layer 834 formed into a semiconductor substrate 832, which may be respectively p-type and n-type. A cathode electrode 824 may be formed on the surface of the n-type cathode layer 834. While shown as square, the cathode electrode 824 may extend over more or less of the cathode electrode 824.

Both the first internal pMOS transistor 814 and the pMOS recharging transistor 818 are formed within respective NWs 838a and 838b, which in turn are formed within respective deep p-wells (DPWs) 836a and 836b. While the first internal pMOS transistor 814 and the pMOS recharging transistor 818 are positioned with their source/gate/drain axes in parallel, other positioning and configurations may be used. The nMOS gating transistor 820 is formed in the PW 823.

Figure 8C:
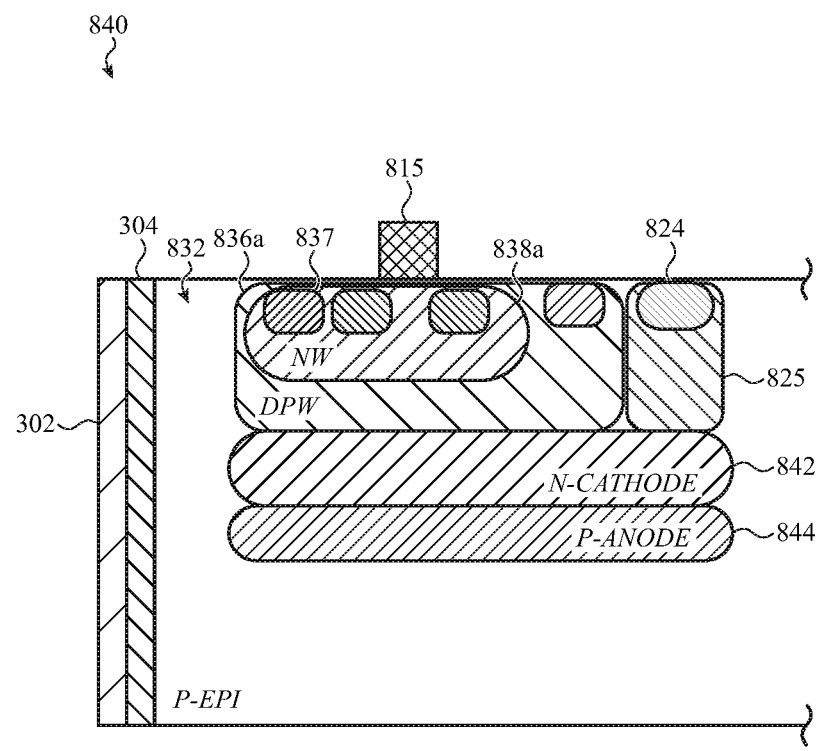
FIG. 8C illustrates a first cross-sectional view of the SPAD pixel of FIG. 8A, according to an embodiment.

FIG. 8C illustrates a cross-sectional view 840 of the pixel cell 802 with the configuration described in relation to FIG. 8B, along the cut line A-A'. The n-type layer 842 may be part of the n-type cathode layer, and forms part of the cathode of the SPAD 810. As shown, the p-type anode layer 844 of the SPAD 810 has been formed within the semiconductor substrate 832 beneath the n-type layer 842. The n-type layer 842 may extend, as shown, underneath the DNWs 836a and 836b to increase the avalanche junction area at the interface of the n-type layer 842 and the p-type anode layer 844. Away from the DNWs 836a and 836b, the n-type layer 842 joins to the n-type cathode layer 842, which may extend proximately to the top surface of the pixel cell 802.

Figure 8D:
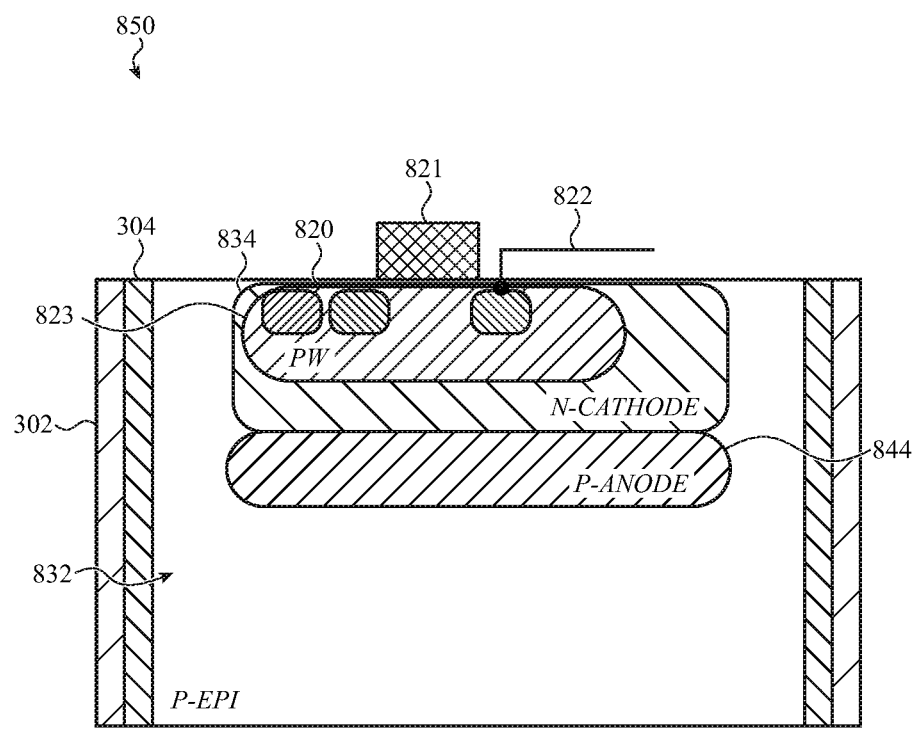
FIG. 8D illustrates a second cross-sectional view of the SPAD pixel of FIG. 8A, according to an embodiment.

FIG. 8D illustrates a cross-sectional view 850 of the pixel cell 802 with the configuration described in relation to FIG. 8B along the cut line B-B'. The nMOS gating transistor 820 is shown formed in the PW 823, which in turn is formed in the n-type cathode layer 834. The p-type anode layer 844 extends beneath the n-type cathode layer 834. The extension of the n-type cathode layer 834 and the p-type anode layer 844 under the n-type cathode layer 834 provides an increased avalanche junction area at their interface.

Figure 9A:
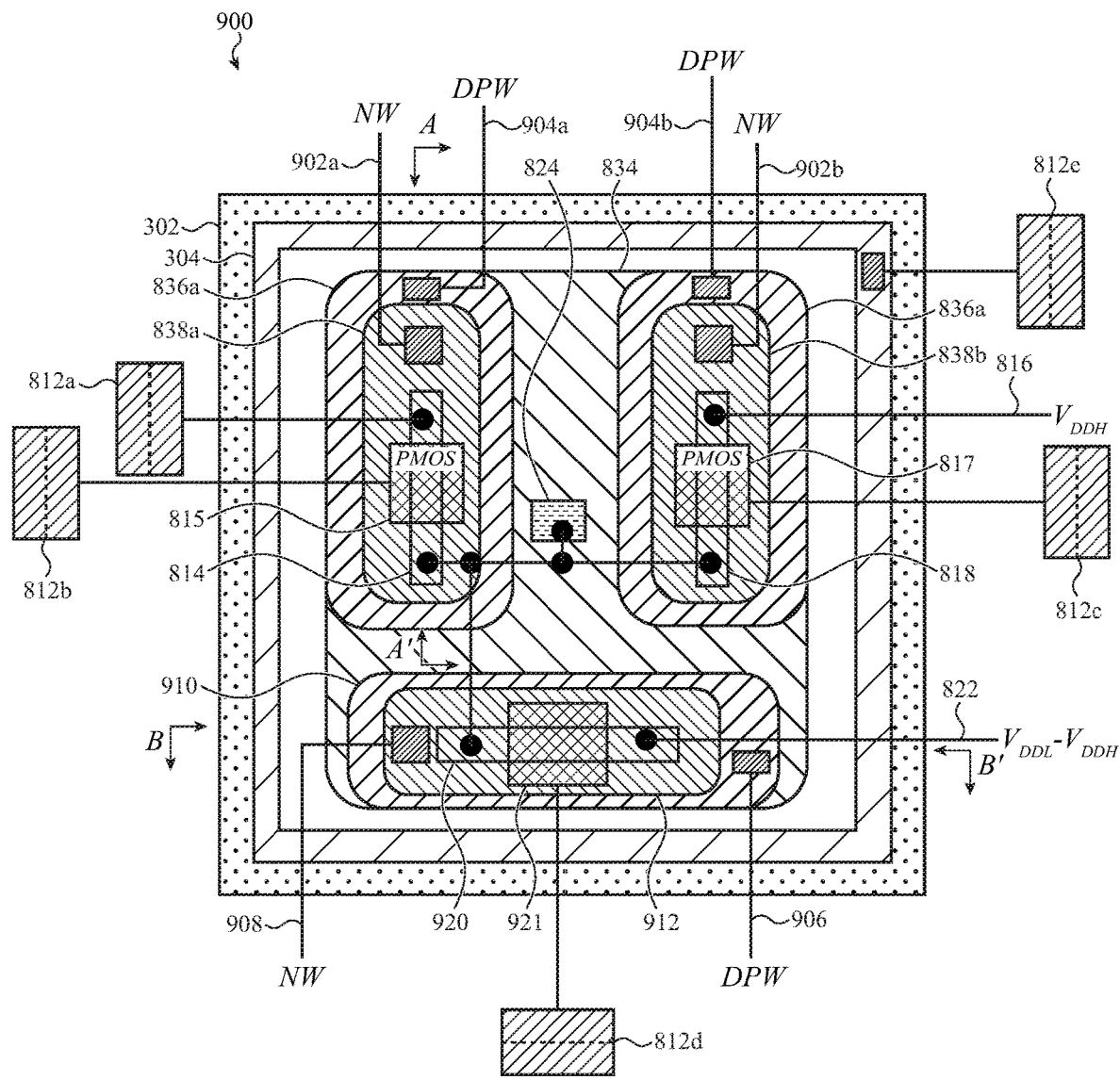
FIG. 9A illustrates a plan view of a SPAD pixel with three control transistors, according to an embodiment.

FIG. 9A shows a plan view 900 of a first variation of the embodiment described in relation to FIGS. 8A-D. The embodiment shown in FIG. 9A modifies the circuit diagram 800 shown in FIG. 8A to replace the nMOS gating transistor 820 with a pMOS gating transistor 920 with gate 921. The other components of the circuit diagram 800 are as described. The plan view 900 is as described for the plan view 830 described above, except that the pMOS gating transistor 920 is formed in the NW 912, which in turn is formed within the DPW 910. Using only pMOS for the control transistors may allow for simpler fabrication of this embodiment. A cross-sectional view along the cut line B-B' of FIG. 9A is analogous to that of FIG. 8C.

FIGS. 9B-E illustrate a second variation of the embodiment described in relation to FIGS. 8A-D. In this second variation, component transistors of the inverter 806, along with a gating and a recharging transistor, are placed on one side of a pixel cell containing a SPAD. Such an embodiment may allow for improved speed as an inverter located on a logic circuitry wafer may be implemented with low voltage transistors, whereas an inverter implemented on a pixel cell may make use of higher voltage transistors, and so may eliminate a need for a voltage level shifter between the output of the pixel cell 802. In the embodiment of FIGS.

9B-E, the SPAD of the pixel cell is formed with a mostly buried anode and cathode for the SPAD junction, as described below, with the transistors formed on the front side of the pixel wafer. The cathode of the SPAD may extend through to the front side, for example, to make electrical connections to the transistors thereon.

Figure 9B:
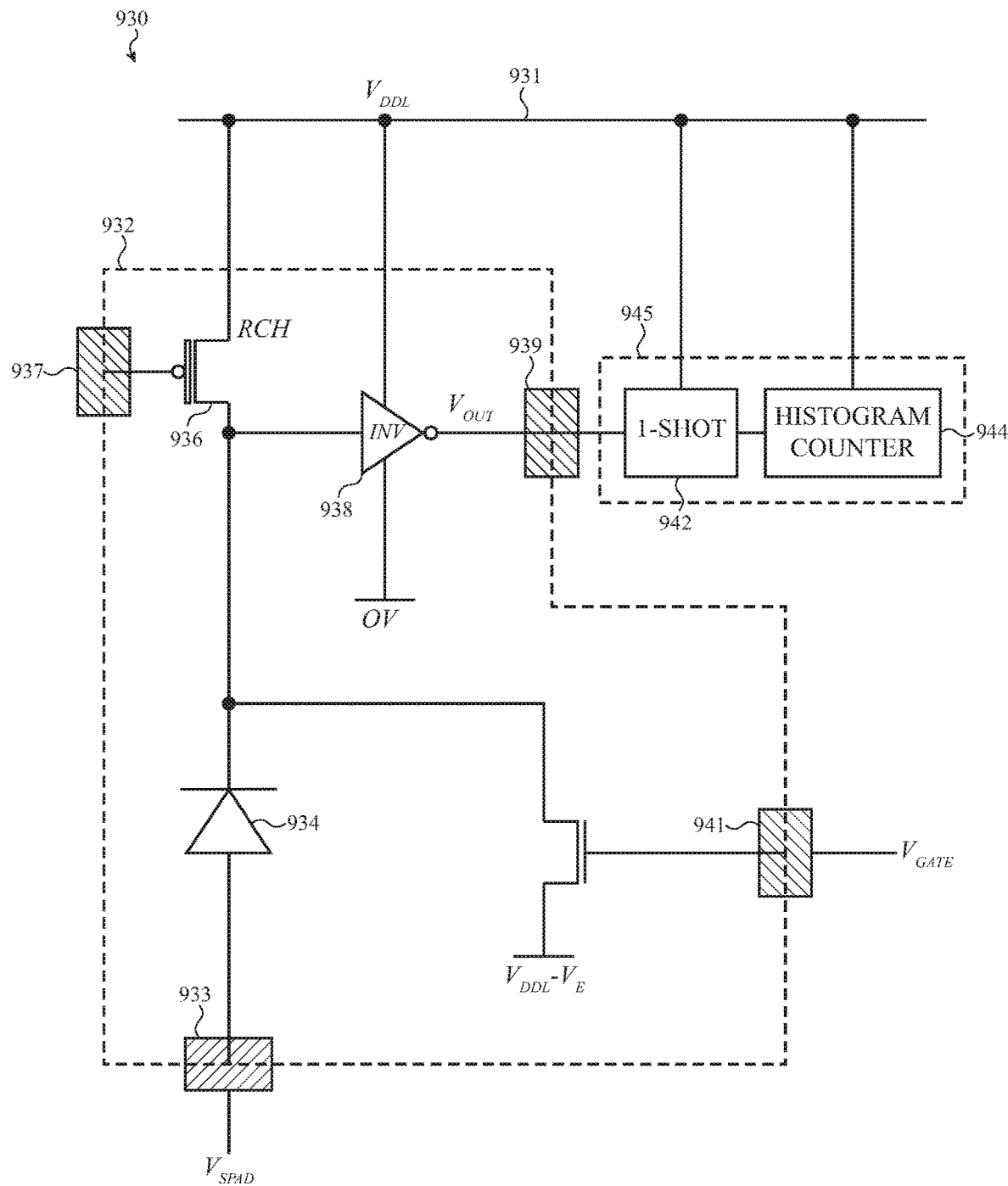
FIG. 9B illustrates a circuit diagram of a SPAD pixel with four control transistors

FIG. 9B illustrates a configuration 930 in which a pixel cell 932 of a pixel wafer includes a SPAD 934, an inverter 938, an pMOS recharging transistor 936, and an nMOS gating transistor 940. The pixel cell 932 is supplied by voltage supply line $V_{DDL}$ 931 and by the voltage $V_{SPAD}$ supplied through the contact 933. The pixel wafer containing the pixel cell 932 may be bonded or joined with a logic circuitry wafer 945. The gate of the recharging transistor 936 is controlled by signals applied through the contact 937, and the gate of the gating transistor 940 is controlled by signals applied through the contact 941.

FIG. 9B also shows a section of a logic circuitry wafer 945 that may be connected to the pixel cell 932 through the metal-to-metal connection 939. Alternatively, the logic circuitry wafer 945 may be joined or connected with the pixel wafer containing the pixel cell 932 by means of a through-silicon via (TSV), as described below in relation to FIG. 15C. The logic circuitry wafer 945 may include a 1-shot 942 to produce a standard pulse based on the output of the pixel cell 932. The output of the 1-shot may then be received by the histogram counter 944. The logic circuitry wafer 945 may include microcontrollers, microprocessors, signal processors, memory, or other components, which may use the data of the histogram counter to produce image information or other information.

Figure 9C:
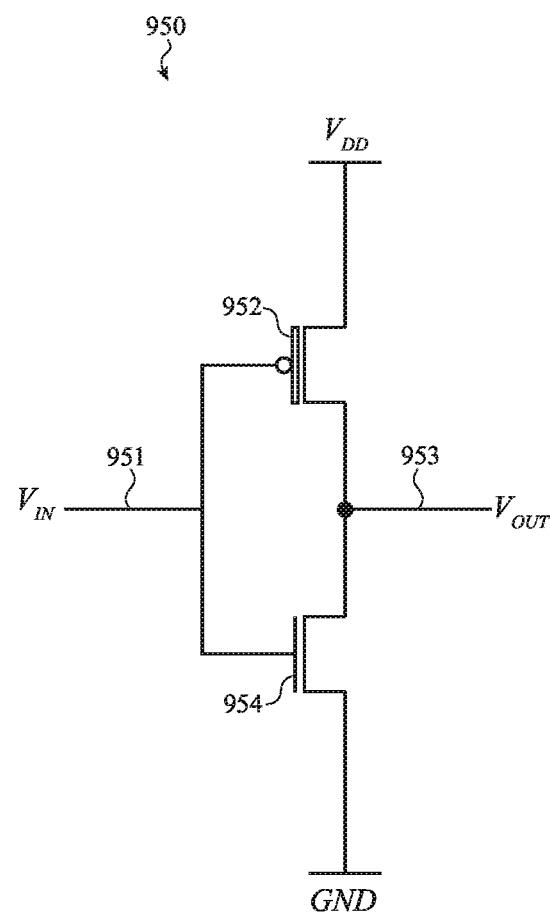
FIG. 9C illustrates a circuit diagram of an inverter circuit, such as may be included in the pixel of FIG. 9B.

FIG. 9C illustrates a configuration 950 of two transistors that may be used to implement the inverter 938. An upper pMOS transistor 952 is stacked so that its drain connects with the source of the lower nMOS transistor 954. The source of the upper pMOS transistor 952 is supplied by the voltage $V_{DD}$, and the drain of the lower nMOS transistor 954 is connected to ground. When the input signal VIN 951 is applied to the gates of both transistors as shown, the output signal $V_{OUT}$ 953 is then inverted in polarity with respect to the input signal VIN 951. Using this implementation of the inverter 938, in the pixel cell 932 there would be two nMOS transistors, the gating transistor 940 and the lower nMOS transistor of the inverter 938, and two pMOS transistors: the recharging transistor 936 and the upper pMOS transistor of the inverter 938.

Figure 9D:
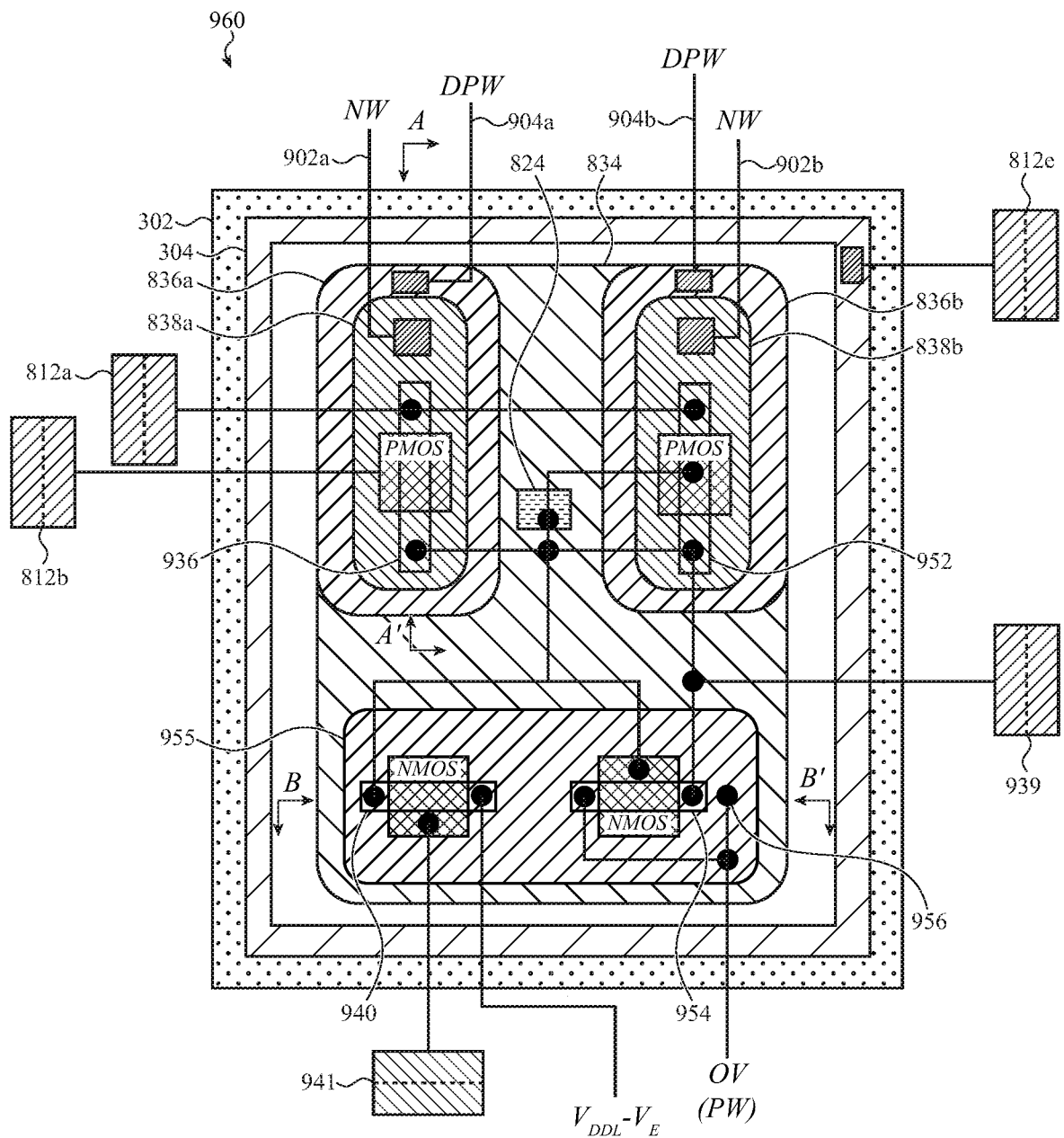
FIG. 9D illustrates a plan view of the pixel of FIG. 9B.

FIG. 9D illustrates a configuration 960 of the gating transistor 940, the recharging transistor 936, the upper pMOS transistor 952 and the lower nMOS transistor 954 implemented on the frontside (opposite of the light gathering backside) of the pixel cell 932. The configuration is a variation of the configurations illustrated in FIGS. 8B and 9A. The features shown in FIG. 9D that are also shown in FIGS. 8B and 9A may be as described above. The pMOS transistors 936 and 952 are formed in respective, separated, n-type wells (NW) 838a and 838b. In turn, the two NWs 838a and 838b are formed in deep p-type wells (DPW) 836a and 836b. In this embodiment, the DPW may be formed as a single DPW, though this is not required.

For the configuration of FIG. 9D, the two nMOS transistors 940 and 954 are formed in the common p-type well (PW) 955. The PW 955 may be biased to ground (0 V) at one or more locations, such as connection pad 956. The output of the inverter 938 may be connected to the logic circuitry wafer 945 through connection 939, which may be a metal-to-metal connection, or another type.

The cross-sectional view along the indicated cut lines A-A' in FIG. 9D is as shown for the corresponding features of FIG. 8C, and the descriptions are not repeated.

Figure 9E:
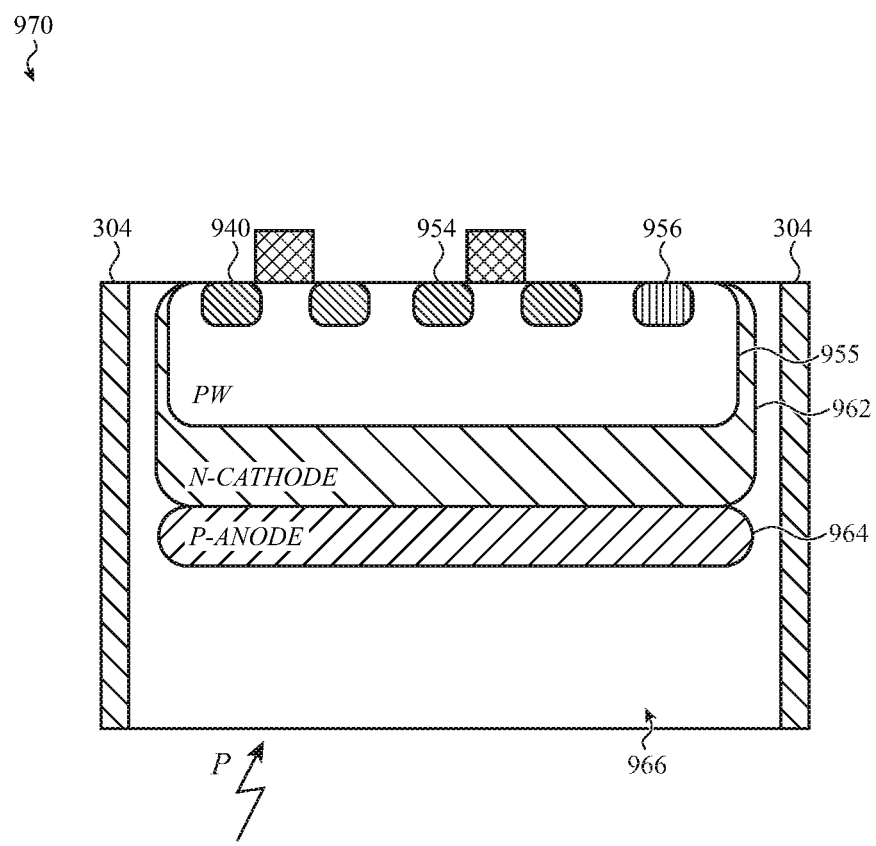
FIG. 9E illustrates a cross-sectional view of the pixel of FIG. 9D.

FIG. 9E illustrates a cross-sectional view 970 along the cut line B-B' of FIG. 9D. FIG. 9E illustrates that sections of the n-type cathode 962 and the p-type anode 964 forming the junction of the SPAD 934 are formed beneath the semiconductor structures forming the four transistors of the inverter 938, the pMOS recharging transistor 936, and the nMOS gating transistor 940. The n-type cathode 962 and the p-type anode 964 may be formed within a p-type body 966, which may be implemented with a doping gradient, as described above in relation to FIG. 1E. Sections of the n-type cathode 962 may extend to the frontside (shown at the top in FIG. 9E), such as to the cathode electrode 824.

Third Family: Single Transistor in a SPAD Pixel Cell

In this family of embodiments, the pixel cells are formed with a SPAD and a single control transistor. These embodiments may provide ease of fabrication of the corresponding pixel arrays. For example, the embodiments may need fewer interconnection pads for bonding with an associated control circuitry wafer.

Figure 10A:
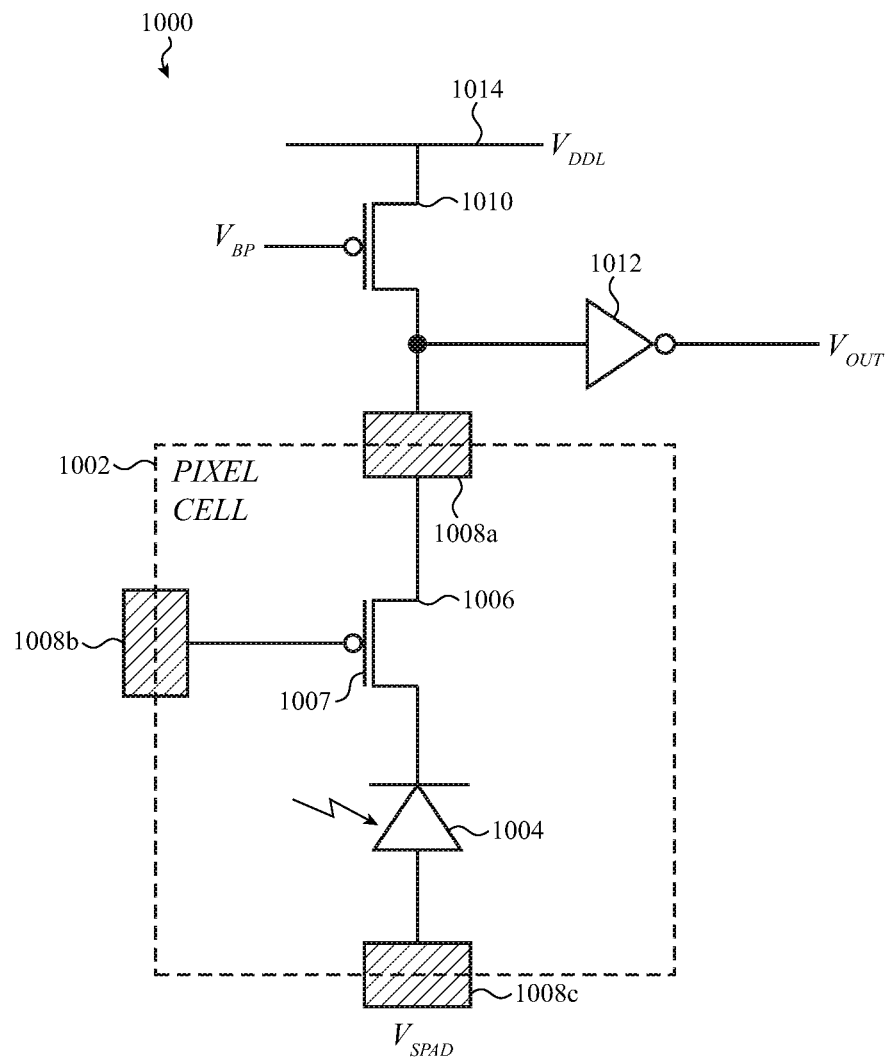
FIG. 10A illustrates a circuit diagram of a supply and control circuitry associated with a SPAD pixel, according to an embodiment.

FIG. 10A is a circuit diagram 1000 of a section of a pixel array with pixel cell 1002, and associated exterior control circuitry. The pixel cell 1002 includes the SPAD 1004 and the pMOS high voltage quenching (HV) transistor 1006. As before, the control circuitry may be located on a separate wafer which is bonded to the pixel wafer containing the pixel cell 1002. The control circuitry includes a low voltage quenching transistor 1010, whose source is connected to the voltage source 1014, which may be at level VDDL. The drain of the low voltage quenching transistor 1010 connects to the pixel cell 1002 at the interconnection pad 1008a through which signals from the pixel cell 1002 are taken. The signals from the pixel cell 1002 may be conditioned (e.g., amplified or buffered) by the inverting buffer 1012 to produce $V_{OUT}$ that may be transmitted to further logic circuitry.

The anode of the SPAD 1004 is connected to the interconnection pad 1008c at which the bias voltage $V_{SPAD}$ is applied. The cathode of the SPAD 1004 connects to the drain of the pMOS HV quenching transistor 1006, which receives control signals through the interconnection pad 1008b at its gate 1007.

Figure 10B:
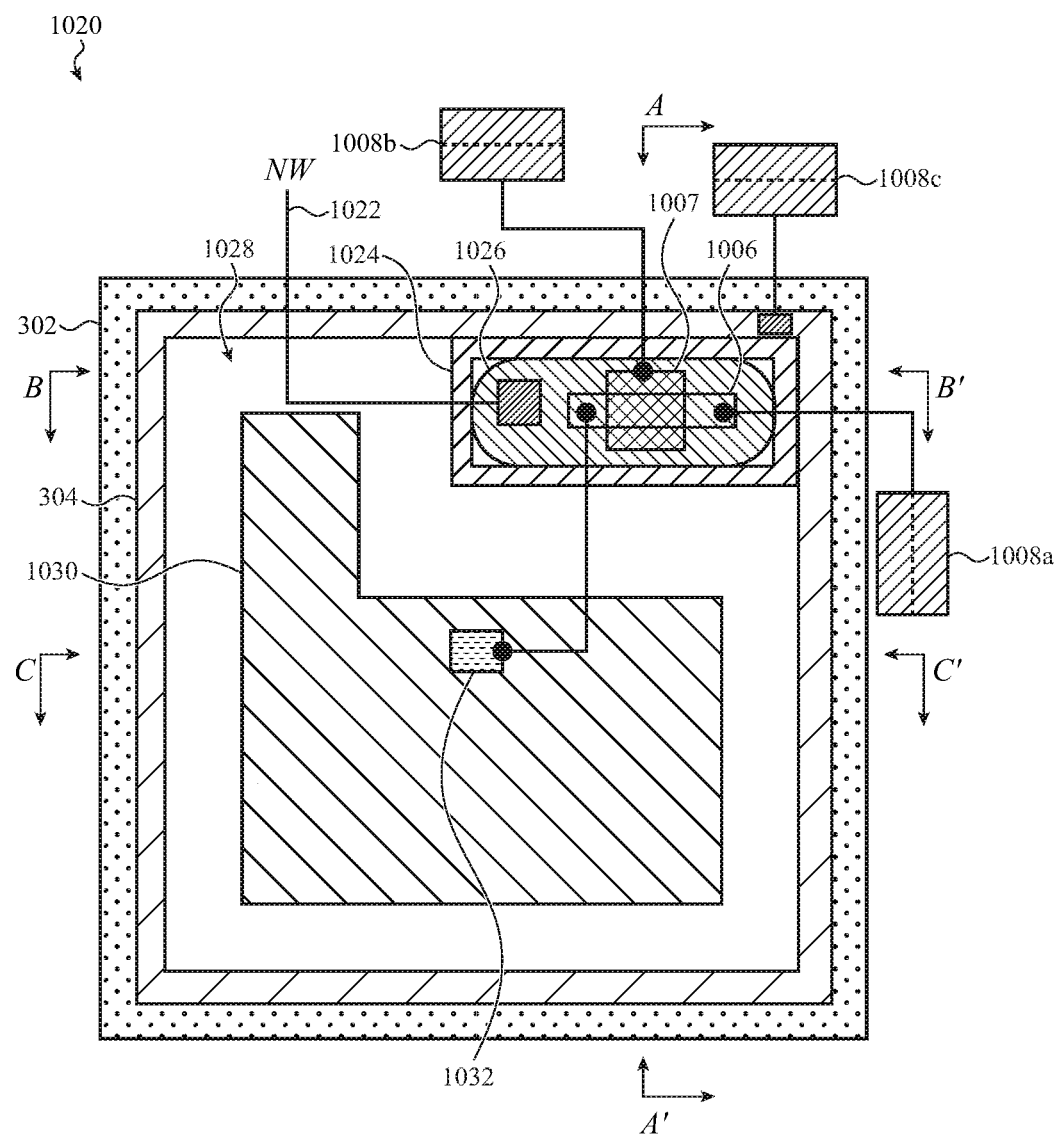
FIG. 10B illustrates a plan view of the components of the SPAD pixel of FIG. 10A, according to an embodiment.

FIG. 10B shows a plan view 1020 of a top surface of the pixel cell 1002 in a configuration that implements the circuit diagram of FIG. 10A. The pMOS HV quenching transistor 1006 is positioned at a corner of the pixel cell 1002 to allow for an increased avalanche region in the SPAD 1004. The pixel cell 1002 may be formed with a surrounding isolation layer 302 and its bordering anode layer 304, such as described in previous embodiments. The pixel cell 1002 may contain an n-type cathode layer 1030 formed in a p-type semiconductor substrate 1028. The n-type cathode layer 1030 may have a cathode electrode 1032 connected to the drain of the pMOS HV quenching transistor 1006. The pMOS HV quenching transistor 1006 may be separated from the n-type cathode layer 1030 by a shallow trench isolation (STI) well 1024. Within the STI well 1024, the pMOS HV quenching transistor 1006 is formed in an NW 1026. The NW 1026 may have a bias section (not shown for clarity) supplied by a voltage source, as described in previous embodiments.

Figure 10C:
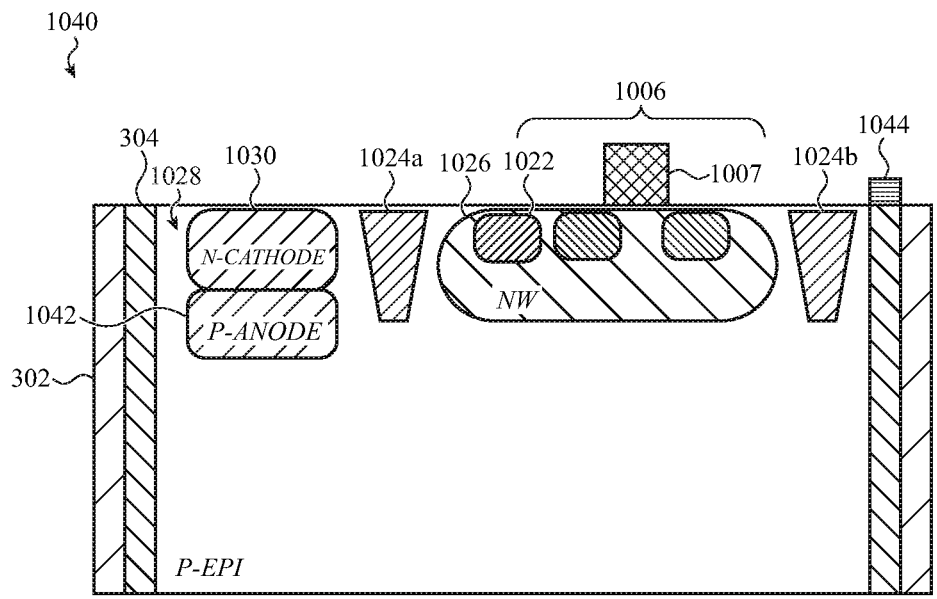
FIG. 10C illustrates a first cross-sectional view of the SPAD pixel of FIG. 10B, according to an embodiment.

FIG. 10C is a cross-sectional view 1040 of the pixel cell 1002 along the cut line B-B' of FIG. 10B. The pMOS HV quenching transistor 1006 is formed in the NW 1026 and is separated by the STI walls 1024a and 1024b from the anode layer 304, and from the section of n-type cathode layer 1030 formed over the p-anode region 1042. The anode layer 304 has electrode 1044 to connect to $V_{SPAD}$.

Figure 10D:
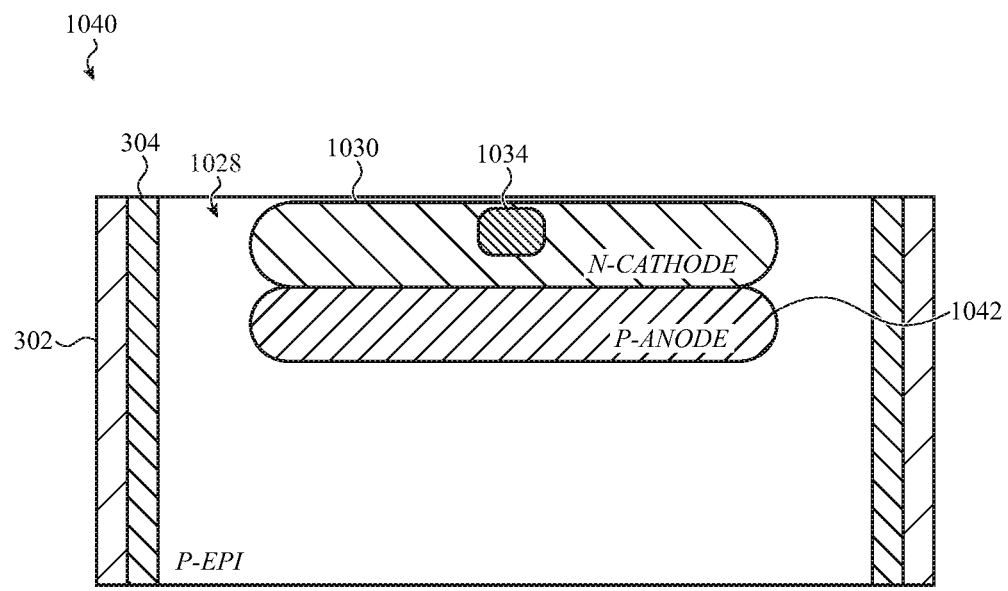
FIG. 10D illustrates a second cross-sectional view of the SPAD pixel of FIG. 10B, according to an embodiment.

FIG. 10D is a cross-sectional view 1050 of the pixel cell 1002 along the cut line C-C' of FIG. 10B. The n-type cathode layer 1030 and the p-anode region 1042 of the SPAD 1004 may extend across a large area within the pixel cell 1002 to allow for increased photodetection efficiency. The p-type semiconductor substrate 1028 may have a doping gradient, as shown in FIG. 10E.

Figure 10E:
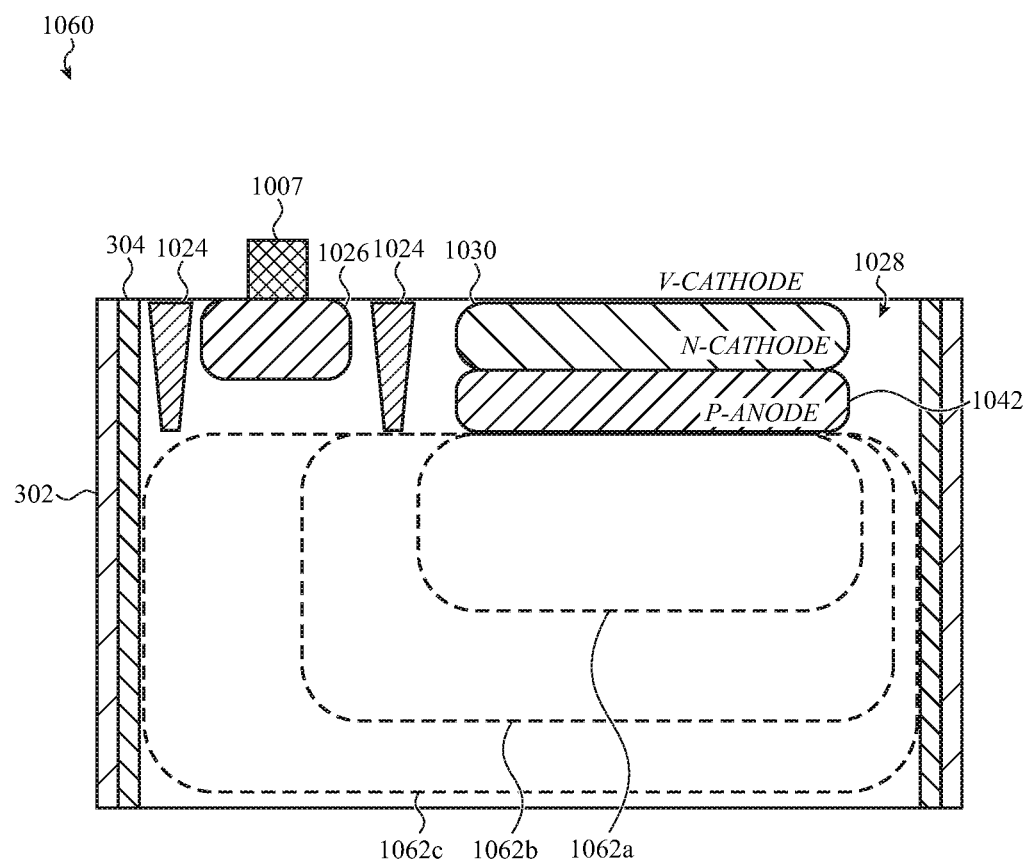
FIG. 10E illustrates a third cross-sectional view of the SPAD pixel of FIG. 10B, according to an embodiment.

FIG. 10E is a cross-sectional view 1060 of the pixel cell 1002 along the cut line A-A' of FIG. 10B. The p-type semiconductor substrate 1028 may have a doping gradient, as indicated by the doping level contours 1062a-c, to direct photon-induced charge carriers to the avalanche area formed at the junction of the n-type cathode layer 1030 and the p-anode region 1042.

Fourth Family: Transistors Exterior to Pixel Cells

In the previous families of embodiments, the one or more control transistors are formed within the pixel cells, such as within the isolation layers 302 that may separate the individual pixel cells within the pixel array. In those embodiments, the control transistors are operationally or electrically separated from the SPAD of the pixel cell either by formation within a shallow trench isolation well, or by formation within a deep n-type or p-type well.

In the fourth family, embodiments are described for pixel wafers that include both the pixel cells and their one or more respective control transistors. These embodiments may make use of deep trench isolation (DTI) to provide separation between a pixel cell and its associated control transistors. The DTI provides separation of the pixel wafer into pixel regions and transistor regions separated by the DTI. With DTI, an isolation material, such as an oxide, is formed as vertical walls from the top surface of the pixel wafer to, or near to, the backside (light illuminated) side of the pixel wafer.

Figure 11:
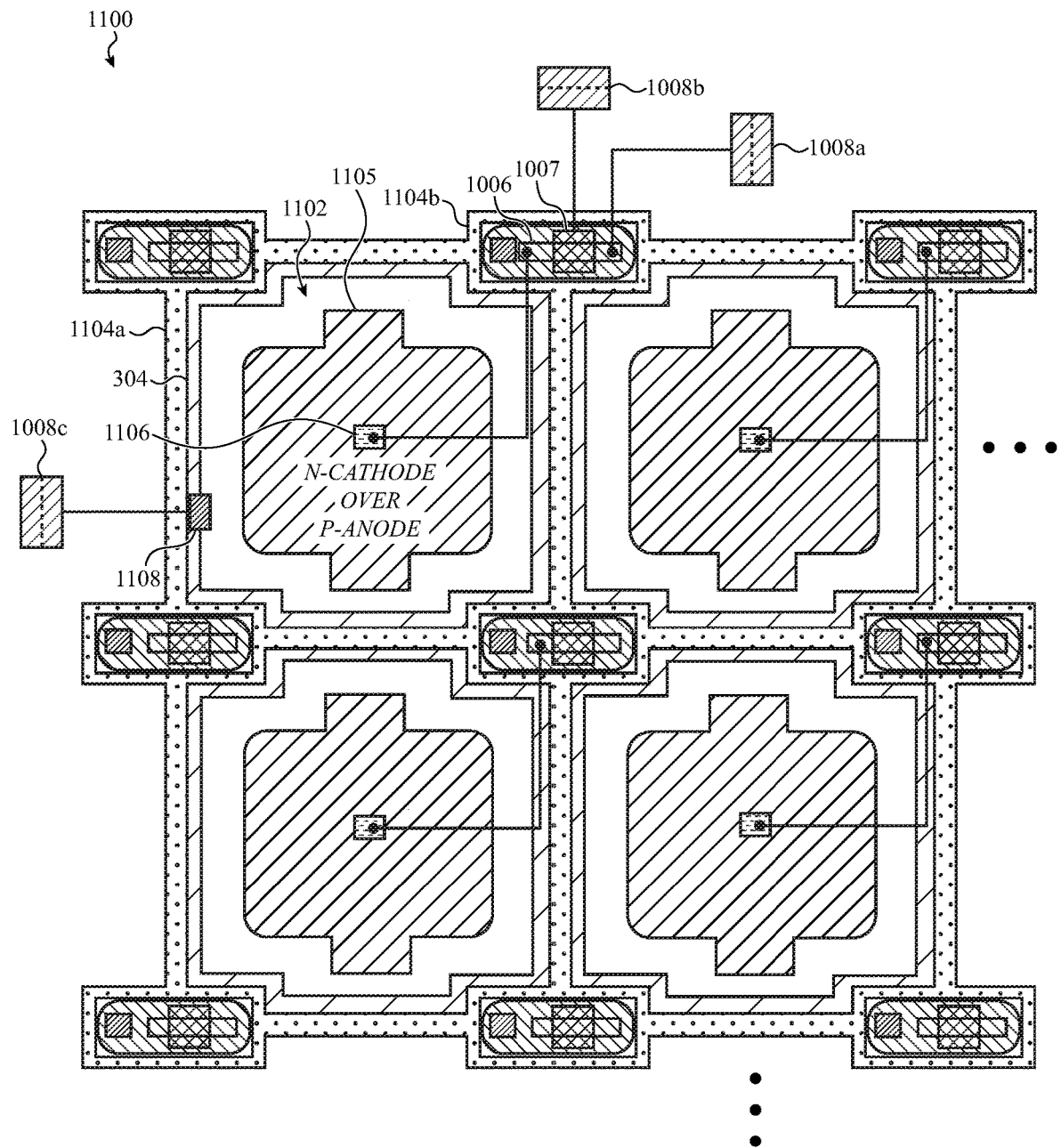
FIG. 11 is a plan view of a section of a SPAD pixel array, according to an embodiment.

FIG. 11 shows a plan view of a section of a pixel wafer 1100. The pixel wafer 1100 is formed as a rectangular array of pixel cells, such as pixel cell 1102, separated by DTI walls, such as DTI wall 1104a. Within the pixel cell 1102 is a bordering anode layer 304, which may be as described previously. The anode layer 304 is connected through the electrode 1108 to the interconnection pad 1008c, through which a bias voltage $V_{SPAD}$ may be applied. The pixel cell 1102 contains a SPAD, and the combination of the SPAD in pixel cell 1102 and the single associated pMOS HV quenching transistor 1006 implements the circuit within the pixel cell 1002 of FIG. 10A.

Within the pixel cell 1102, the SPAD is formed as an n-type cathode layer 1105 positioned over a p-type anode layer. The n-type cathode layer 1105 is connected to the pMOS HV quenching transistor 1006 by a connection from the cathode electrode 1106 to the drain of the pMOS HV quenching transistor 1006, as previously described. A vertical cross-section through the center of the pixel cell 1102 would be similar to the cross-sectional view 1050 of FIG. 10D.

The pMOS HV quenching transistor 1006 is formed within a rectangular transistor separated from the array of pixel cells by the DTI wall 1104b. The configuration shown for the pixel wafer 1100 may provide better noise and signal isolation between the pixel cell 1102 and the pMOS HV quenching transistor 1006.

Figure 12A:
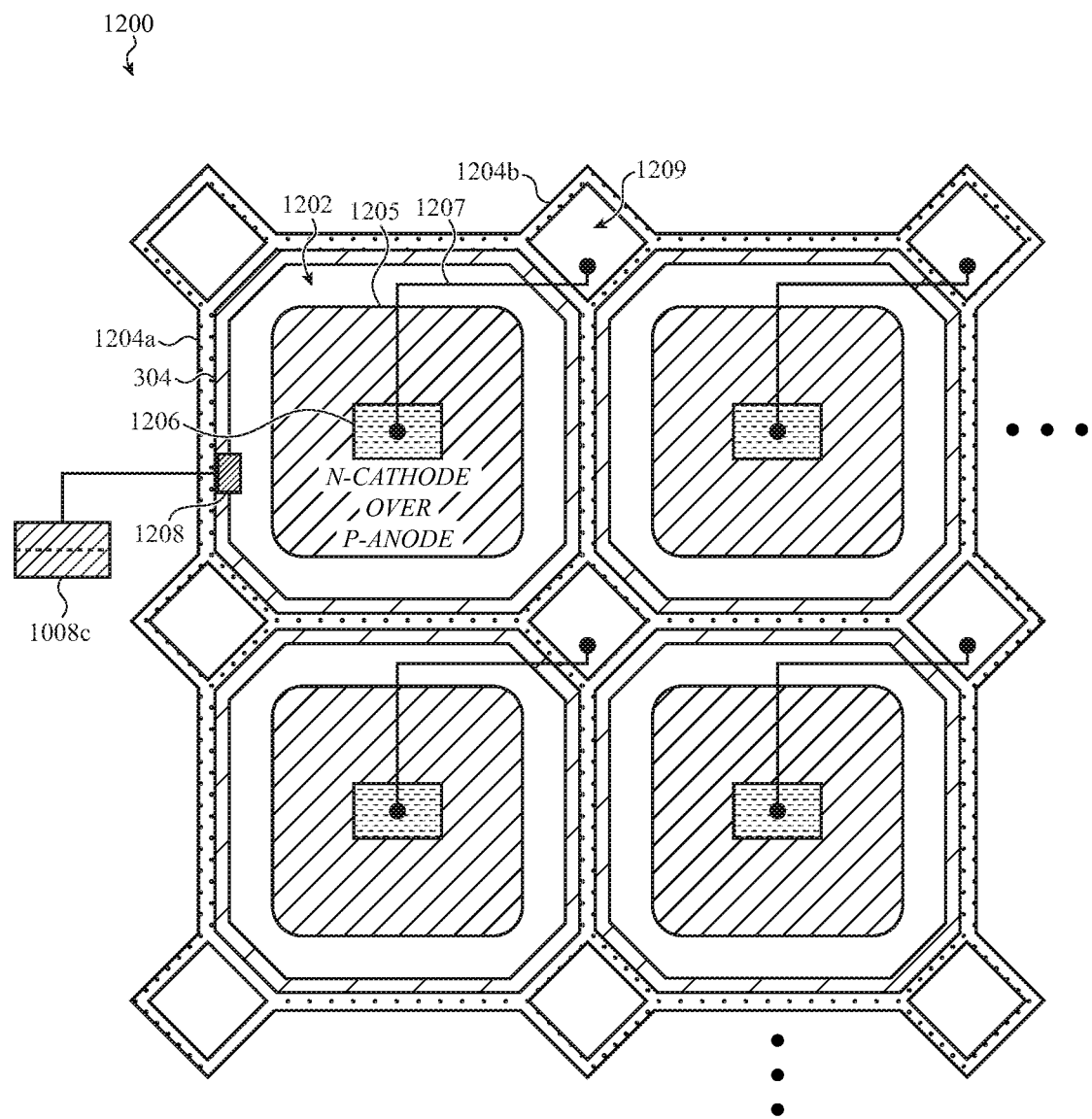
FIG. 12A is a plan view of a section of a SPAD pixel array, according to an embodiment.

FIG. 12A shows a plan view of a section of a pixel array 1200 that implements a variation of the embodiment of FIG. 11. The pixel wafer 1200 is formed as a rectangular array of pixel cells, such as pixel cell 1202, separated by DTI walls, such as DTI wall 1204a. Within the pixel cell 1202 is a bordering anode layer 304, which may be as described previously. The anode layer 304 is connected through the electrode 1208 to the interconnection pad 1008c, through which a bias voltage $V_{SPAD}$ may be applied. The pixel cell 1202 contains a SPAD. The SPAD has n-type cathode layer 1205 positioned near the top surface of the pixel cell 1202. The cathode electrode 1206 has connection 1207 to a control transistor located in the transistor region 1209, shown in further detail in FIG. 12B. The combination of the SPAD in pixel cell 1202 and a single associated control transistor in the transistor region 1209 implements the circuit within the pixel cell 1002 of FIG. 10A.

The DTI walls 1204b surround the transistor region 1209. The DTI walls 1204b are diagonally oriented with respect to the horizontal and vertical axes defining the rectangular array of pixels. Such a diagonal or diamond-shaped configuration for the transistor region 1209 may provide increased area within the pixel cell 1202.

Figure 12B:
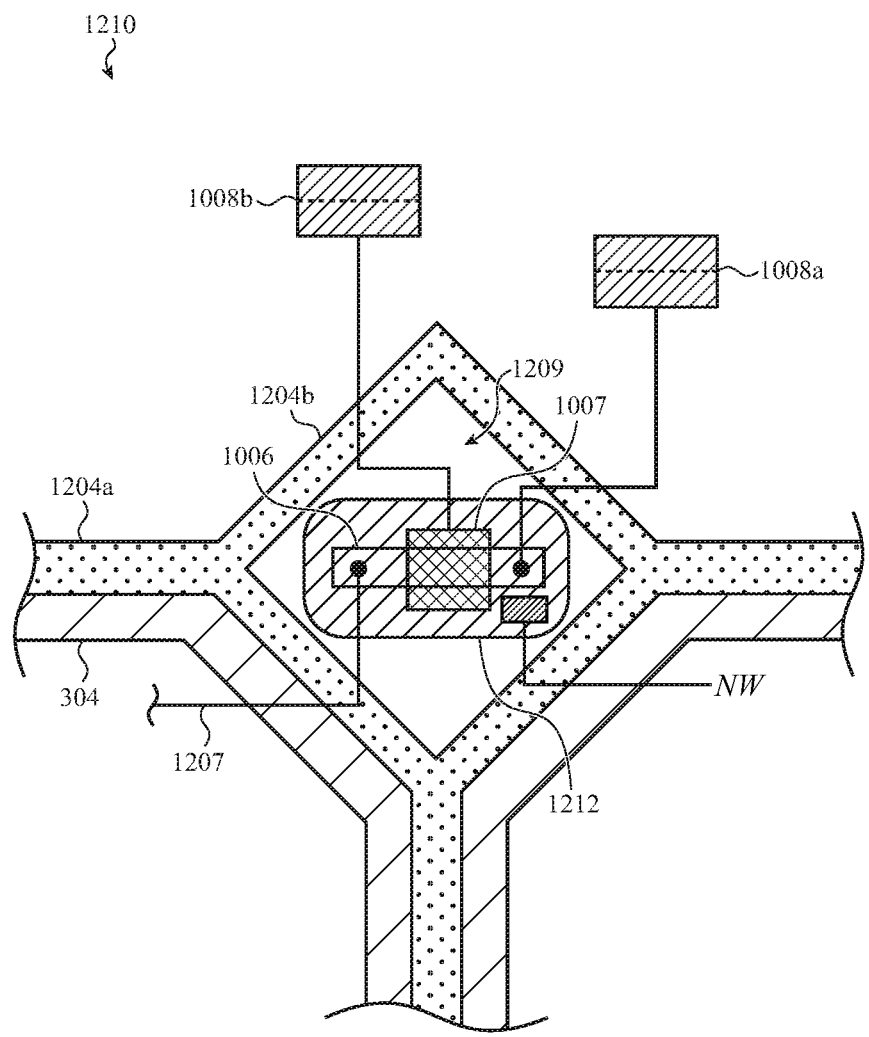
FIG. 12B is a detail view of a section of the SPAD pixel array of FIG. 12A, according to an embodiment.

FIG. 12B shows an enlarged plan view of the transistor region 1209 containing the pMOS HV quenching transistor 1006 associated with the pixel cell 1202. The pMOS HV quenching transistor 1006 is formed within an NW 1212, and has its drain connected to the connection 1207, as described.

Figure 13A:
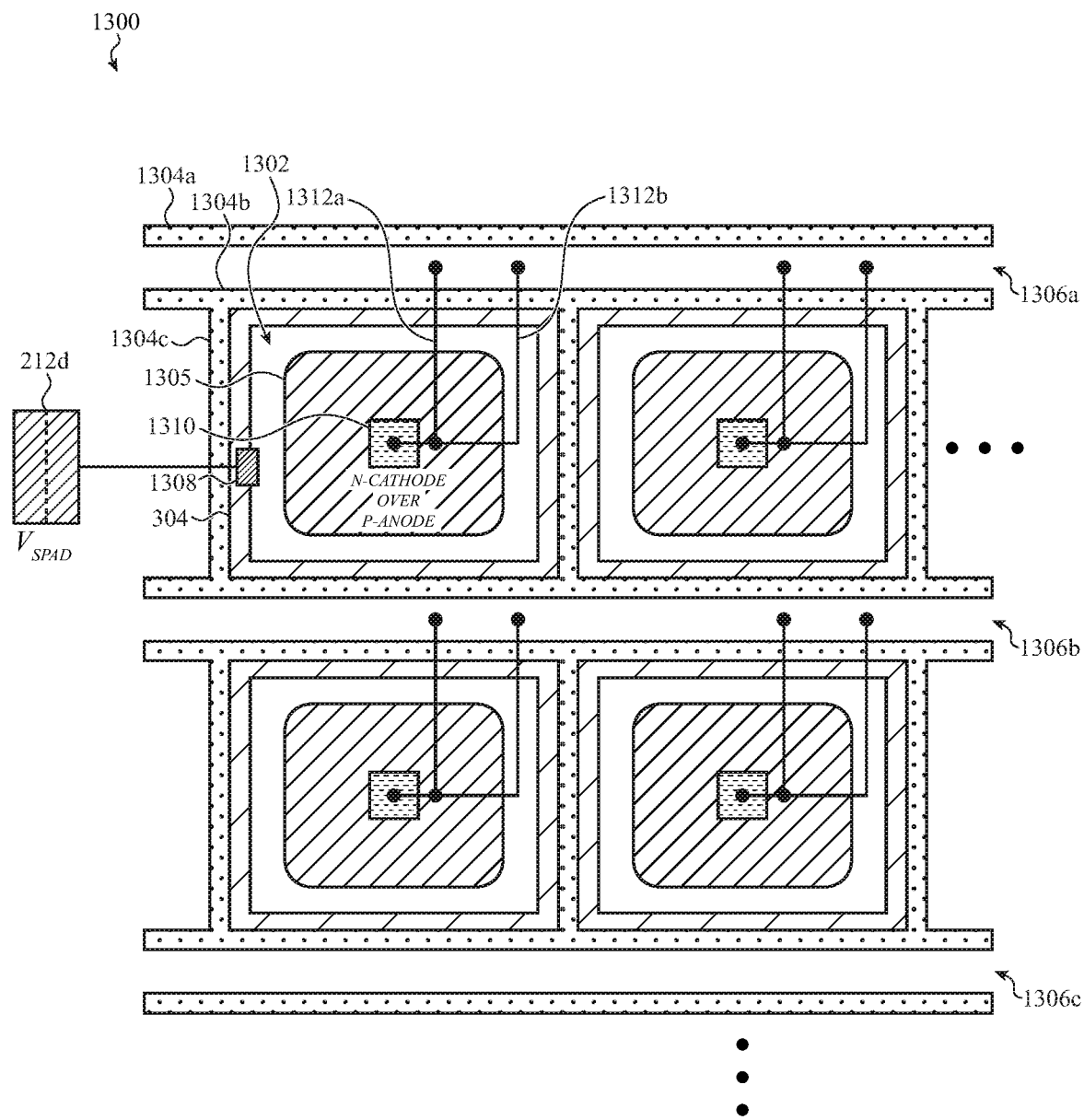
FIG. 13A is a plan view of a section of a SPAD pixel array, according to an embodiment.

FIG. 13A shows a plan view of a section of a pixel wafer 1300. The pixel wafer 1300 includes a rectangular array of pixel cells, such as pixel cell 1302. Horizontally oriented transistor regions 1306a-c alternate with the rows of the rectangular array of pixel cells. Horizontal DTI walls, such as horizontal DTI walls 1304a and 1304b, form separations between the transistor regions 1306a-c and the rows of the rectangular array of pixel cells. Vertical DTI walls, such as vertical DTI wall 1304c, form separations between pixel cells within each row of the rectangular array of pixel cells. As shown in detail below, within transistor regions 1306a-c are, for each pixel cell, a respective pMOS recharging transistor and an nMOS gating transistor that are configured to form a circuit within a pixel cell.

The pixel cell 1302 includes a SPAD formed with an n-type cathode layer 1305 over a p-anode layer formed beneath an n-type the cathode layer 1305. The pixel cell 1302 has an anode layer 304, such as described previously, bordering the DTI walls. The anode layer 304 is linked from the anode electrode 1308 to the interconnection pad 212d, which may be as described previously. A vertical cross-section through the center of the pixel cell 1302 would be similar to the cross-sectional view 1050 of FIG. 10D. The cathode electrode 1310 has connections 1312a and 1312b to the corresponding pMOS recharging transistor and an nMOS gating transistor within the transistor region 1306a.

Figure 13B:
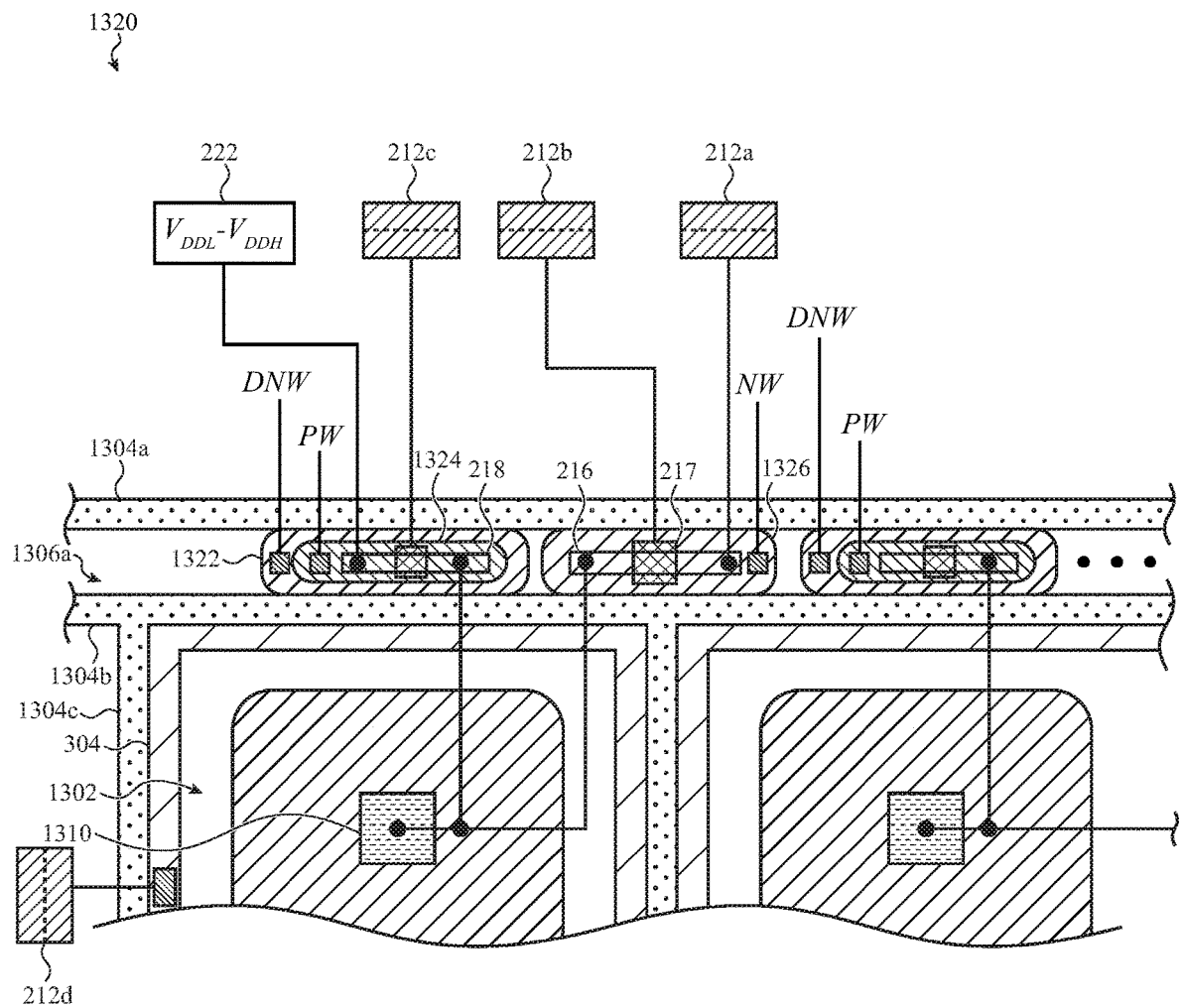
FIG. 13B is a detail view of a section of the SPAD pixel array of FIG. 13A, according to an embodiment.

FIG. 13B shows an enlarged plan view 1320 of a transistor section 1306a of the pixel wafer 1300. Within the transistor section 1306a is the pMOS HV quenching transistor 216 disposed serially with the nMOS gating transistor 218, and connected as shown to form a circuit that may be disposed within the pixel cell 210 of FIG. 2. The pMOS HV quenching transistor 216 is formed in an NW 1324, which is formed within the DNW 1322. The nMOS gating transistor 218 is formed in the NW 1326.

Further pMOS recharging transistors and nMOS gating transistors are disposed sequentially within the transistor region 1306a and are associated with other pixel cells within the top row shown of pixel cells. Similarly, further pMOS recharging transistors and nMOS gating transistors may be disposed sequentially within the transistor region 1306a and are associated with other pixel cells within the second row of pixel cells shown in FIG. 13A.

Figure 14A:
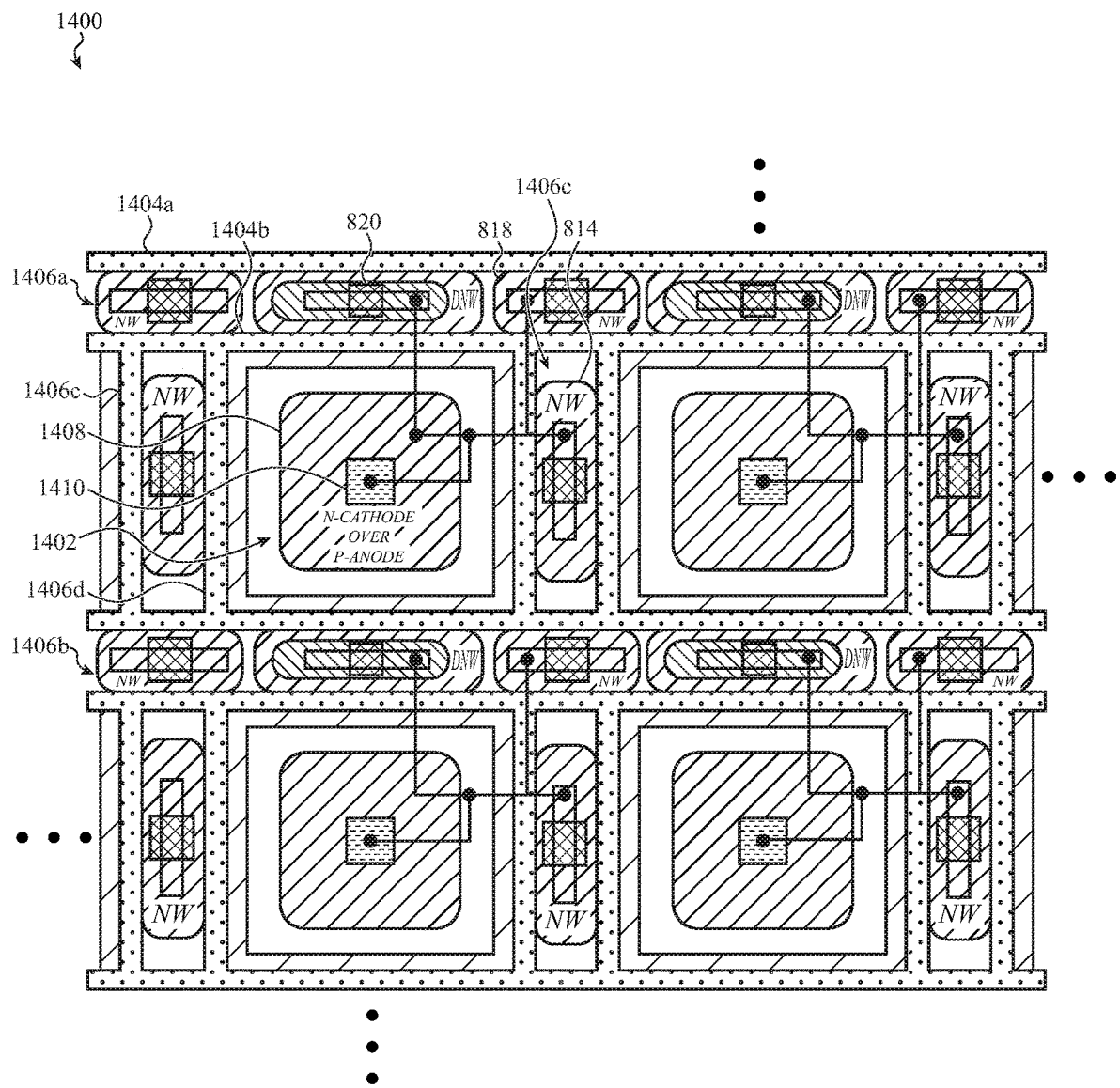
FIG. 14A is a plan view of a section of a SPAD pixel array, according to an embodiment.

FIG. 14A shows a plan view of a pixel array 1400. The pixel array 1400 is configured as a variation on the embodiment described with respect to FIGS. 13A-B, adapted so that a SPAD of each pixel cell may connect with three control transistors located in transistor regions to form the circuit shown in FIG. 8A within the pixel cell 802. The pixel array 1400 includes a rectangular array of pixel cells, such as pixel cell 1402. Horizontally oriented transistor regions 1406a-b alternate with the rows of the rectangular array of pixels cells. Horizontal DTI walls, such as horizontal DTI walls 1404a and 1404b, form separations between the transistor regions 1406a-b and the rows of the rectangular array of pixels cells. Vertical DTI walls, such as vertical DTI walls 1404c-d, form separations between pixel cells within each row of the rectangular array of pixel cells, and form transistor regions, such as transistor region 1406c between the pixel cells of a row of the rectangular array of pixel cells.

The pixel cell 1402 may include an anode layer, as described above, bordering the DTI walls that surround the pixel cell 1402. The pixel cell 1402 includes a SPAD having an n-type cathode layer 1408 connected through the cathode electrode 1410 to three control transistors located in the transistor regions 1406a and 1406c, as shown in detail in FIG. 14B. In the embodiment shown, the nMOS gating transistor 820 and the pMOS recharging transistor 818 associated to the pixel cell 1402 are disposed in the horizontally extending transistor region 1406a, and the internal pMOS transistor 814 associated to the pixel cell 1402 is disposed in the transistor region 1406c.

Figure 14B:
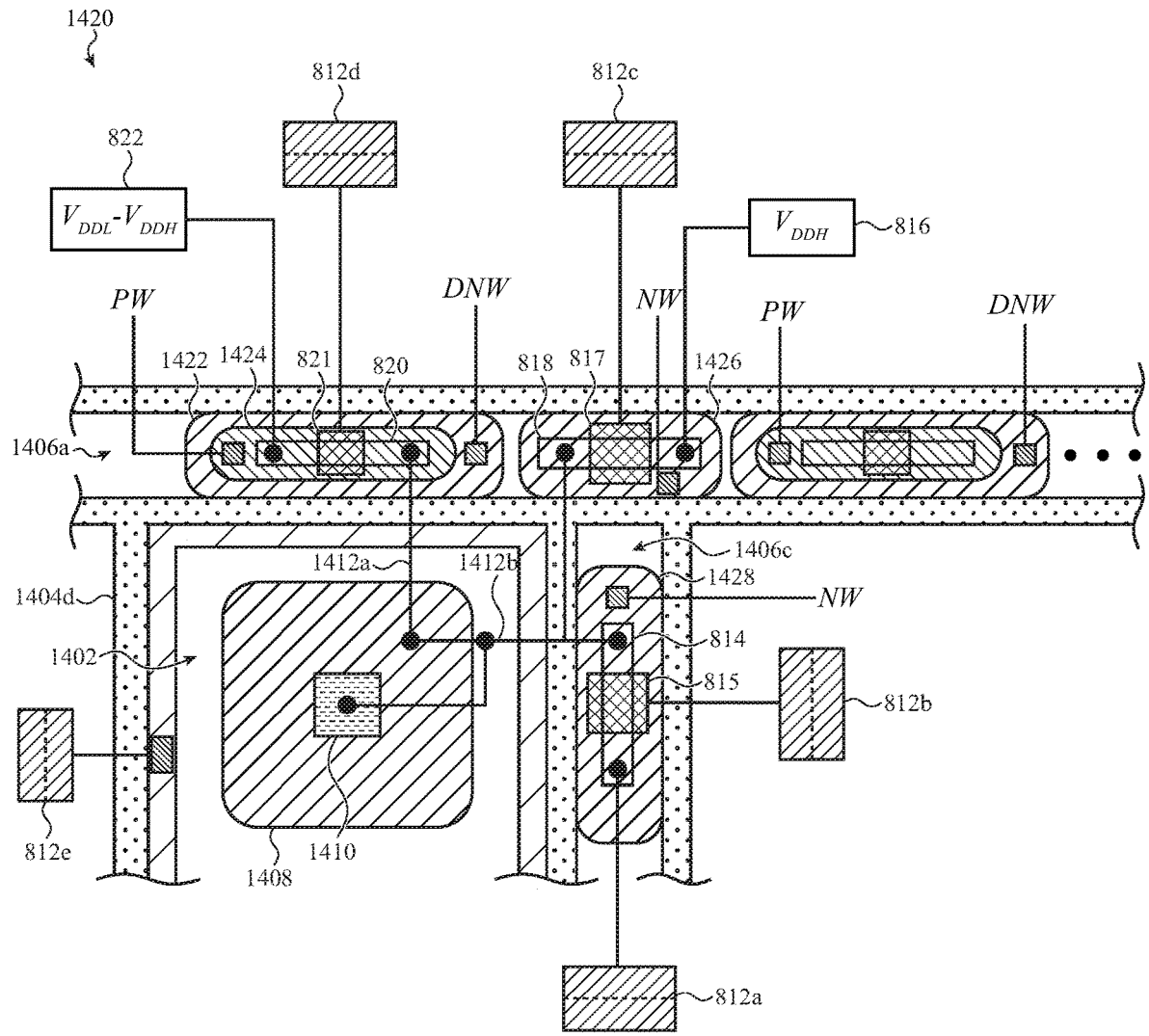
FIG. 14B is a detail view of a section of the SPAD pixel array of FIG. 14A, according to an embodiment.

FIG. 14B shows an enlarged plan view 1420 of the pixel cell 1402 and transistor regions 1406a and 1406c of the pixel array 1400. The configuration and connections shown in the plan view 1420 implement the circuit within the pixel cell 802 of FIG. 8A. The n-type cathode layer 1408 of the SPAD of the pixel cell 1402 connects from the cathode electrode 1410 by the connection 1412a to the drain of the nMOS gating transistor 820. The nMOS gating transistor 820 is formed within a PW 1424, which is formed in a DNW 1422. The n-type cathode layer 1408 of the SPAD of the pixel cell 1402 connects from the cathode electrode 1410 by the connection 1412b to the drain of the pMOS recharging transistor 818. The pMOS recharging transistor 818 is formed in an NW 1426. The internal pMOS transistor 814 is formed in the transistor region 1406c in an NW 1428, and is connected to the cathode electrode 1410 by the connection line 1412b. In other aspects, the connections of the remaining components shown in FIG. 14B are as described for the circuit diagram shown in FIG. 8A.

Fifth Family: Control Transistors on Separate Wafer

Another set of embodiments is directed to light sensing and imaging devices that are formed by joining three different wafers: a pixel array wafer containing an array of pixel cells, a control circuit wafer that may contain biasing and control circuit elements such as control transistors, and a logic circuitry wafer that may contain processing components. Such processing components may include, but are not limited to, filters, histogram counters, image or other digital processors, microprocessors, or still other components. The control circuit wafer may include the circuit elements, such as gating or control transistors for SPADs in the pixel cells that may operate from high voltage sources. Certain control transistors may be used to implement an inverter circuit whose output is connected to the logic circuitry wafer.

Figure 15A:
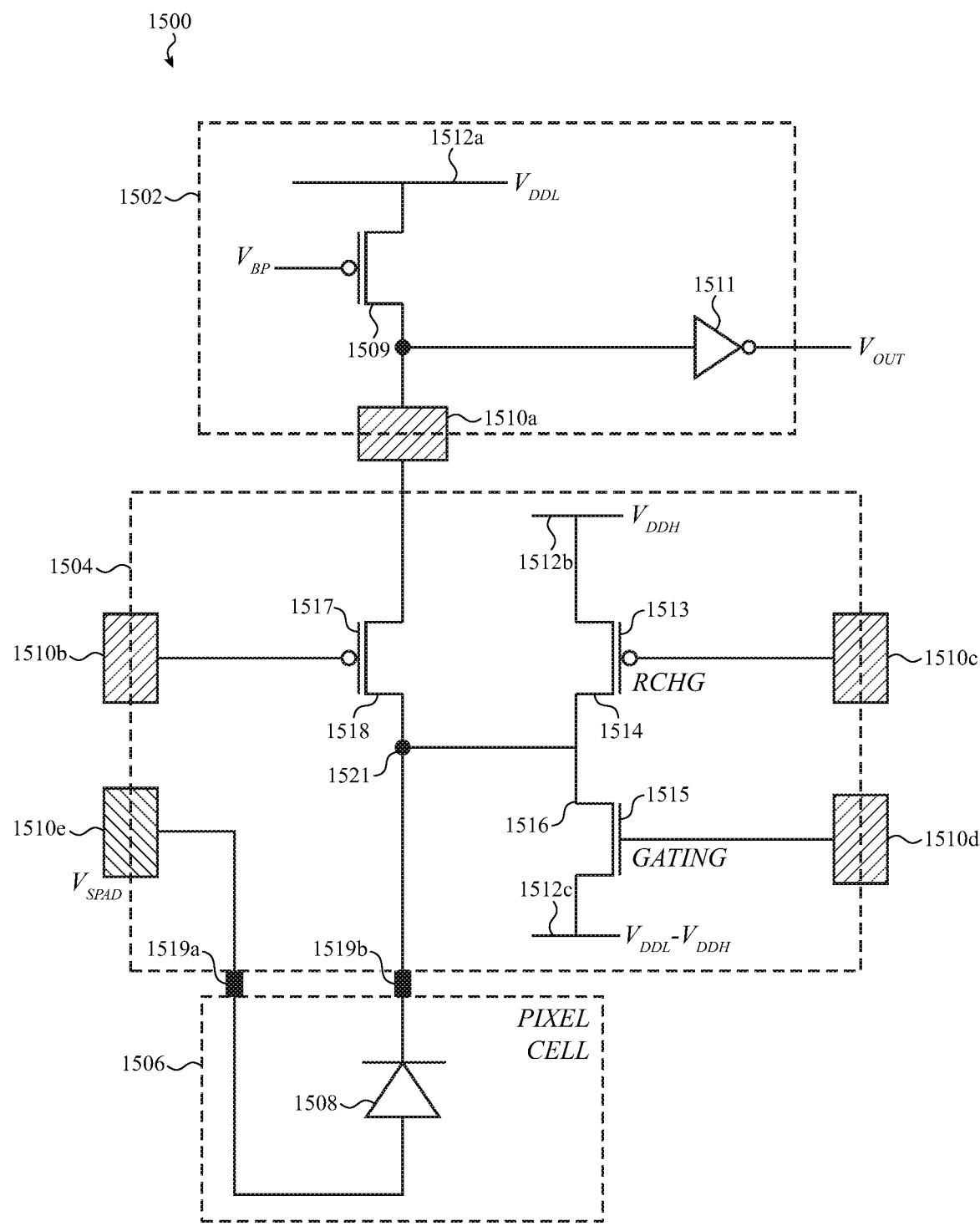
FIG. 15A illustrates a circuit diagram of supply and control circuitry associated with a SPAD pixel, according to an embodiment.

FIG. 15A is a circuit diagram for a configuration 1500 of certain components of a control circuit wafer 1504 positioned between a logic circuitry wafer 1502 and a pixel array wafer 1506 corresponding to a SPAD 1508. The wafers may be formed in separate semiconductor substrates, which may be either n-type or p-type. The logic circuitry wafer 1502 may contain a pMOS quenching transistor 1509 with a gate controlled by the voltage signal $V_{BP}$. The pMOS quenching transistor 1509 may have source connected to a lower level supply voltage $V_{DDL}$ on supply line 1512a. The drain of the pMOS quenching transistor connects through the interconnection pad 1510a to a control circuit wafer. The logic circuitry wafer 1502 may contain further circuit elements.

The pixel array wafer 1506 may contain an array of pixel cells, at least some of which may include a SPAD, such as SPAD 1508, for photodetection. The pixel cell 1506 may connect to a biasing voltage supply $V_{SPAD}$, supplied to the control circuitry wafer 1504 through the interconnection pad 1510e, at a through-silicon via (TSV) 1519a. The anode of the SPAD 1508 may be connected to the control circuitry wafer 1504 by another (TSV) 1519b. The cathode of the SPAD 1508 may be connected to the biasing voltage supply $V_{SPAD}$ received at the TSV 1519a.

The control circuitry wafer 1504 may contain control transistors to control a light gathering or detecting operation of respective SPADs of the pixel array wafer 1506. In the embodiment shown, the control circuitry wafer 1504 includes three control transistors to implement the control circuitry shown in FIG. 8A. There is a pMOS recharging transistor 1514 with gate 1513 linked to the interconnection pad 1510c to receive inputs from external controller circuitry, a pMOS high voltage quenching transistor 1518 with gate 1517 connected to interconnection pad 1510b, and nMOS gating transistor 1516 with gate 1515 connected to the interconnection pad 1510d. The description of these transistors and their interconnection is analogous to the descriptions given in relation to FIG. 8A, and will not be repeated here.

Figure 15B:
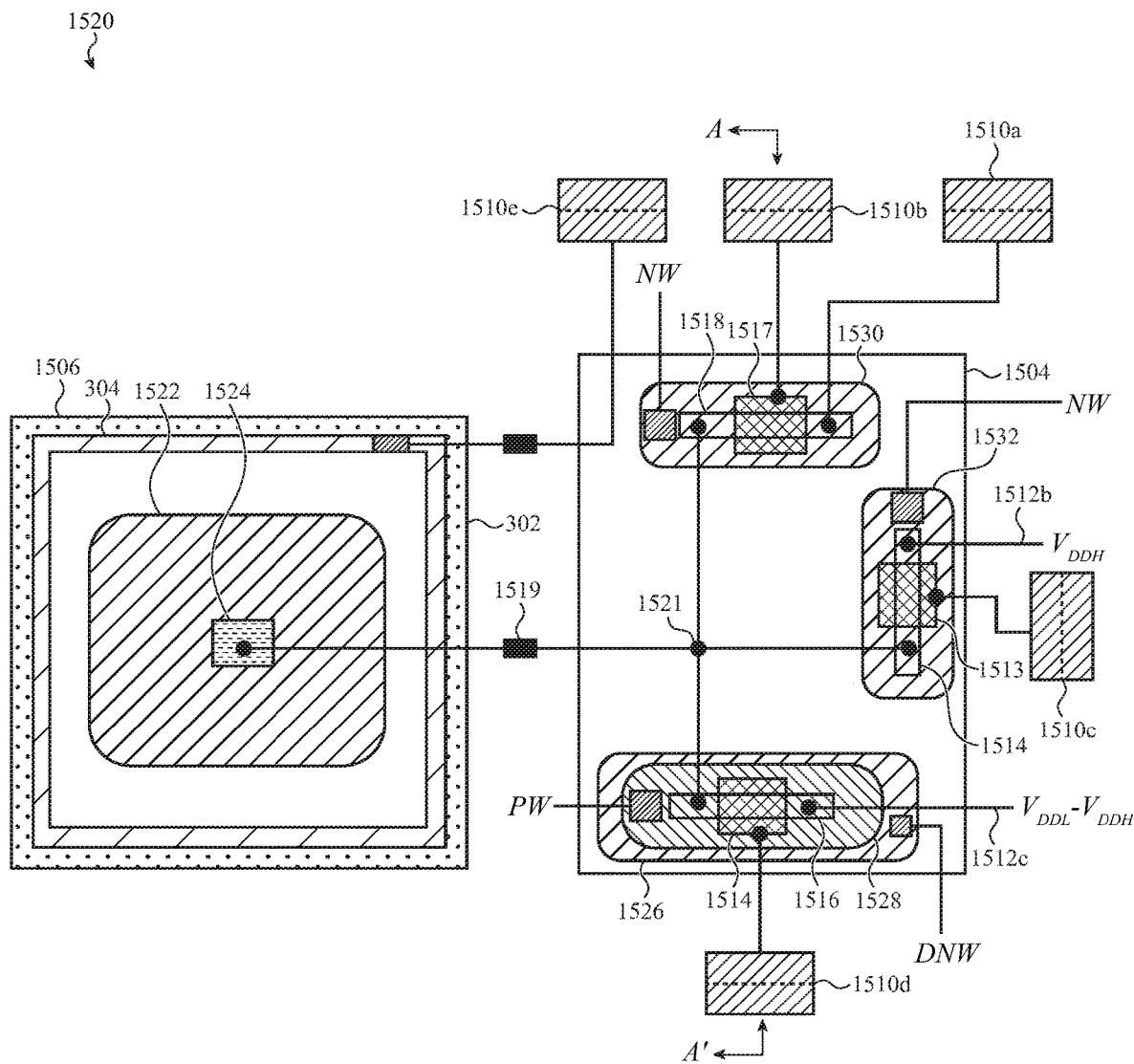
FIG. 15B illustrates a plan view of various components of the SPAD pixel and the supply and control circuitry of FIG. 15A, according to an embodiment.

FIG. 15B is an expanded plan view 1520 that shows a configuration for the pixel cell containing the SPAD 1508 and a configuration or layout for the pMOS recharging transistor 1514, the pMOS high voltage quenching transistor 1518, and the nMOS gating transistor 1516. The nMOS gating transistor 1516 is formed within a PW 1528, which is formed in the DNW 1526. The pMOS high voltage quenching transistor 1518 is formed in the NW 1530. The pMOS recharging transistor 1514 is formed in the NW 1532.

Figure 15C:
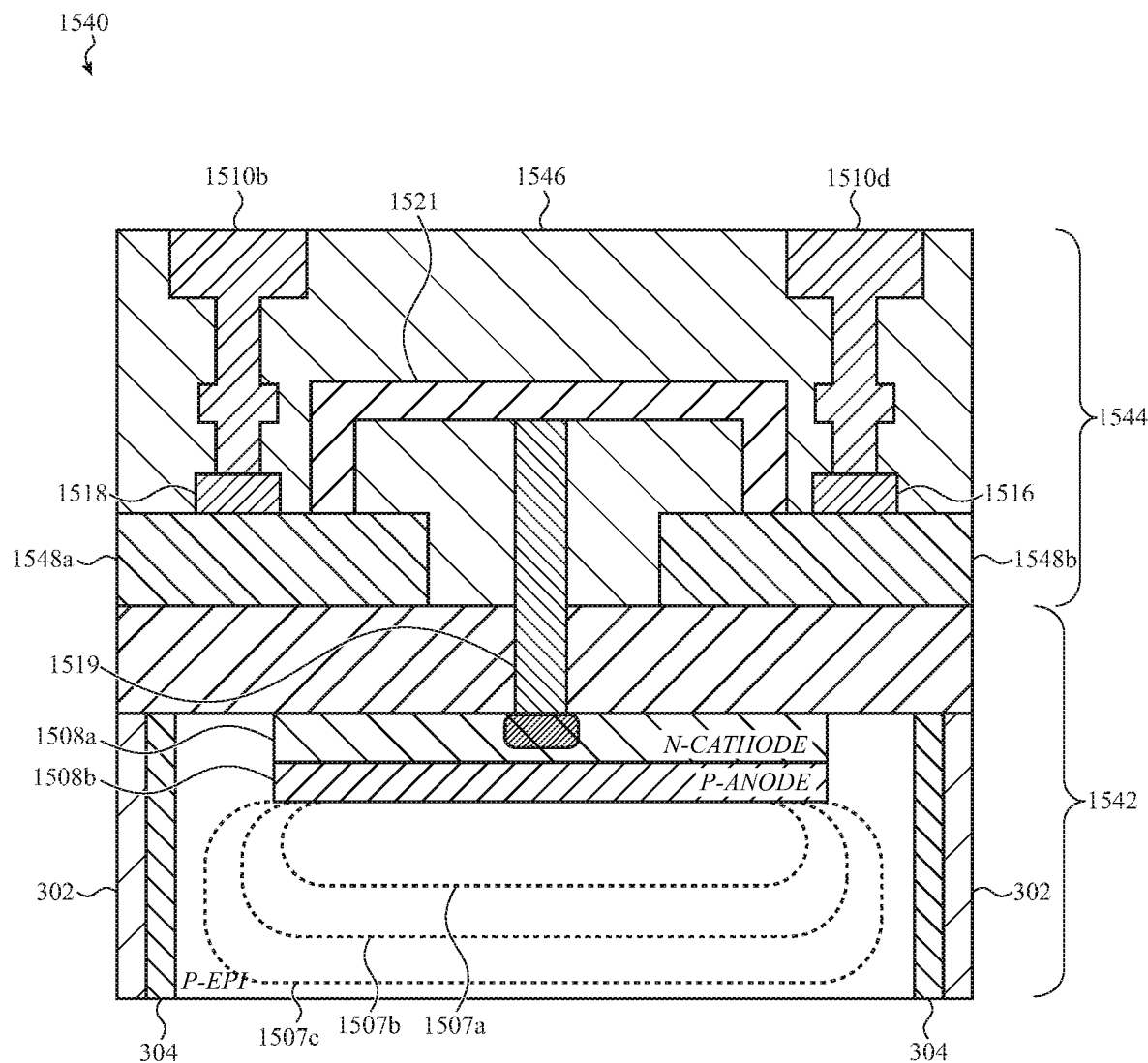
FIG. 15C illustrates a cross-sectional view of the SPAD pixel and circuitry of FIG. 15A, according to an embodiment.

FIG. 15C is a cross-sectional view 1540 of the control circuit wafer 1504 bonded or joined with the pixel array wafer 1506 along the cut line A-A' of FIG. 15B. The SPAD 1508 may be formed as the junction of the n-type cathode layer 1508a and the p-anode layer 1508b. The pixel cell of the SPAD 1508 may isolated from other pixel cells of the pixel array wafer 1506 by the isolation layer 302, such as described previously. Internal to the isolation layer 302 may be an anode layer 304, such as described previously. The semiconductor substrate in the pixel cell may be p-type, and may have a doping gradient, as indicated by the doping contour lines 1507a-c.

The pixel array wafer 1506 may be bonded or joined with an intermediate layer 1541 to form a first combined layer 1542 that is bonded or joined to the control circuit wafer 1544. A TSV 1519 may provide electrical connection between the SPAD 1508 and the control transistors of the control circuit wafer 1544. The logic circuitry wafer 1502 may be bonded or joined to the top surface 1546 of the control circuit wafer 1544.

Within the control circuit wafer 1544, the pMOS high voltage quenching transistor 1518 may be disposed on the isolating structure 1548*a*, and the nMOS gating transistor 1516 may be disposed on an isolating structure 1548*b*. The node 1521 may be implemented as a conductor implanted in the semiconductor substrate of the control circuit wafer 1504.

Figure 16:
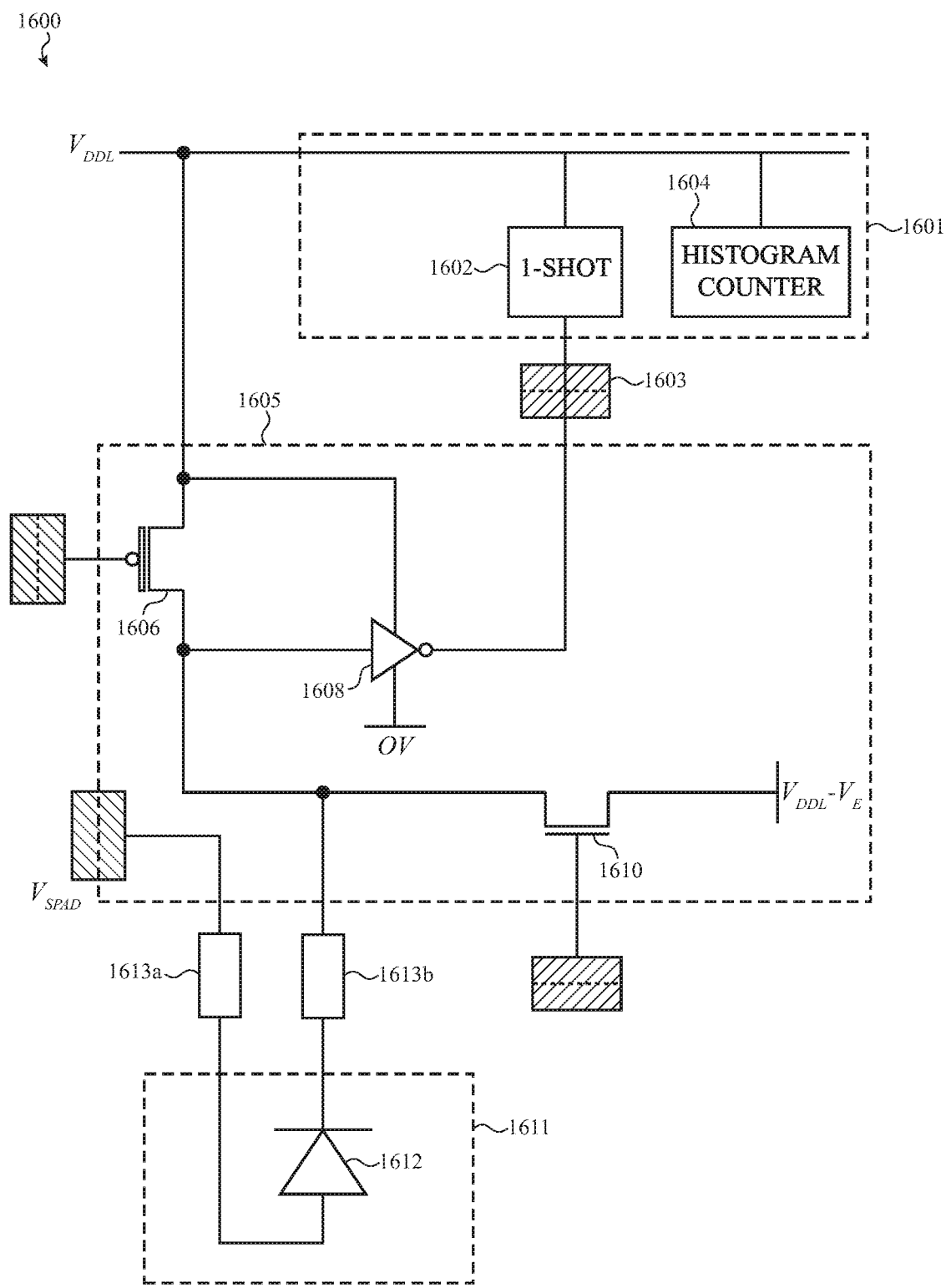
FIG. 16 illustrates a circuit diagram of supply and control circuitry associated with a SPAD pixel, according to an embodiment.

FIG. 16 illustrates a variation of the embodiment discussed in relation to FIGS. 15A-C. The embodiment of FIG. 16 uses three joined or bonded wafers: a pixel wafer containing an array of SPAD pixel cells that do not have control transistors, an intermediate wafer containing control transistors that may be high voltage, and a logic circuitry wafer. The embodiment of FIG. 16 differs from that of FIGS. 15A-C in that the transistors for the inverter are located on the intermediate wafer. As described below, the SPAD pixel may be implemented as disclosed in relation to FIG. 15B, and the configuration of the gating transistor, recharging transistor and inverter transistors may be implemented as disclosed in relation to FIG. 9D.

FIG. 16 illustrates a configuration 1600 of components of a logic circuitry wafer 1601, an intermediate wafer 1605, and a pixel wafer 1611. The intermediate wafer 1605 includes the control transistors for one or more SPADs located on the pixel wafer 1611. In this embodiment, the pixel wafer 1611 contains an array of pixel cells, each containing a SPAD, such as SPAD 1612. In this embodiment, the intermediate wafer 1605 includes at least the recharging transistor 1606, the gating transistor 1610, and the inverter 1608. The inverter 1608 may be formed as the stacked pMOS transistor and nMOS transistor as shown in FIG. 9C, or may implemented in another configuration of transistors. The pixel wafer 1611 may be joined with the intermediate wafer 1605 by through-silicon-vias 1613*a* and 1613*b*, by a metal-to-metal connection such as 1603 connecting the logic circuitry wafer 1601 to the intermediate wafer 1605, or by another structure. The logic circuitry wafer 1601 includes at least a 1-shot 1602 to create a standard pulse based on a signal received from the inverter 1608. The standard pulse is received by the histogram counter 1604. In addition to the histogram counter 1604, the logic circuitry wafer 1601 may include other associated logic circuitry such as microprocessors, microcontrollers, signal processors, memory units and the like that may operate to generate image data.

In the embodiment of configuration 1600, at least some of the pixel cells of pixel array 1611 do not contain associated control transistors. In this embodiment, such pixel cells may have the structure shown in FIG. 15B and described above.

In the intermediate wafer 1605 of configuration 1600, the recharging transistor 1606, the gating transistor 1610, and the two transistors of the inverter 1608 may be positioned and implemented with the semiconductor configuration shown in FIG. 9D and described above. In the intermediate wafer 1605, such an implementation of the four transistors may use the same or an alternative structure for separation of each set of four transistors associated with a SPAD 1612.

The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of the specific embodiments described herein are presented for purposes of illustration and description. They are not targeted to be exhaustive or to limit the embodiments to the precise forms disclosed. It will be apparent to one of ordinary skill in the art that many modifications and variations are possible in view of the above teachings.

What is claimed is:

1. A pixel of a pixel array, the pixel comprising:
   isolation walls forming sides of the pixel and extending at least partially through a semiconductor substrate of the pixel array between a top surface of the pixel array and a light gathering surface of the pixel array opposite the top surface;
   shallow trench isolation material extending from the top surface at least partially into the semiconductor substrate, wherein the shallow trench isolation material separates a first region of the pixel, a second region of the pixel, and a third region of the pixel;
   a single-photon avalanche diode (SPAD) comprising:
     a cathode layer adjacent to the top surface; and
     an anode layer within the semiconductor substrate and adjoining a side of the cathode layer opposite the top surface; and
   a control transistor adjacent to the top surface and electrically connected with the SPAD, wherein:
     the control transistor is a first control transistor;
     the pixel further comprises a second control transistor;
     the first control transistor is a gating transistor formed within the third region;
     the second control transistor is a quenching transistor electrically connected to the SPAD and formed within the first region; and
     the anode layer and the cathode layer of the SPAD are formed at least partially in the second region.

2. The pixel of claim 1, wherein:
   the gating transistor is an nMOS transistor;
   the first region comprises an n-well region; and
   the third region comprises:
     a deep n-well region; and
     a p-well region formed within the deep n-well region.

3. The pixel of claim 1, wherein:
   the gating transistor is a first pMOS transistor;
   the quenching transistor is a second pMOS transistor;
   the first region comprises a first n-well region;
   the third region comprises a second n-well region;
   the quenching transistor is formed within the first n-well region; and
   the gating transistor is formed within the second n-well region.

4. The pixel of claim 1, further comprising:
   a p-well region; and
   a deep p-well region separated from the p-well region; wherein:
   the deep p-well region comprises an internal n-well region;
   the quenching transistor is a pMOS transistor formed within the internal n-well region; and
   the gating transistor is an nMOS transistor formed within the p-well region.

5. The pixel of claim 1, further comprising:
   a first p-well region; and
   a second p-well region; wherein:
   the quenching transistor is a first nMOS transistor formed within the first p-well region; and
   the gating transistor is a second nMOS transistor formed within the second p-well region.

6. The pixel of claim 1, further comprising:
   a first deep n-well region comprising a first p-well region;
   a second deep n-well region comprising a second p-well region; wherein:
   the semiconductor substrate is n-type;
   the quenching transistor is a first nMOS transistor formed in the first p-well region;

the gating transistor is a second nMOS transistor formed in the second p-well region.

7. The pixel of claim 1, wherein:
the pixel further comprises a third control transistor;
the quenching transistor is electrically connected between a first voltage source and a cathode of the SPAD;
the third control transistor is a recharging transistor;
the recharging transistor is connected in series with the gating transistor between a second voltage source and a third voltage source at a common node; and
the cathode of the SPAD is connected to the common node.

8. The pixel of claim 7, further comprising:
a deep p-well region comprising:
 a first n-well region; and
 a second n-well region separated from the first n-well region; and
a p-well region; wherein:
the gating transistor is an nMOS transistor formed in the p-well region;
the recharging transistor is a first pMOS transistor formed in the first n-well region;
the quenching transistor is a second pMOS transistor formed in the second n-well region.

9. The pixel of claim 7, further comprising:
a first deep p-well region comprising a first n-well region;
a second deep p-well region comprising a second n-well region; and
a third deep p-well region comprising a third n-well region; wherein:
the gating transistor is a first pMOS transistor formed in the first n-well region;
the recharging transistor is second pMOS transistor formed in the second n-well region; and
the quenching transistor is a third pMOS transistor formed in the third n-well region.

10. The pixel of claim 7, wherein:
the recharging transistor is formed within the third region.

11. A pixel of a pixel array, the pixel comprising:
isolation walls forming sides of the pixel and extending at least partially through a semiconductor substrate of the pixel array between a top surface of the pixel array and a light gathering surface of the pixel array opposite the top surface;
shallow trench isolation material extending from the top surface at least partially into the semiconductor substrate;
a single-photon avalanche diode (SPAD) comprising:
 a cathode layer adjacent to the top surface; and
 an anode layer within the semiconductor substrate and adjoining a side of the cathode layer opposite the top surface; and
a control transistor adjacent to the top surface and electrically connected with the SPAD, wherein:
the shallow trench isolation material separates a first region of the pixel from a second region of the pixel;
the control transistor is formed within the first region; and
the anode layer and the cathode layer of the SPAD are formed at least partially in the second region.

12. A pixel wafer having a top surface and a backside surface opposite the top surface, comprising:
a semiconductor substrate;
a rectangular array of pixel cells;
a plurality of transistor regions;
deep trench isolation material extending from the top surface of the pixel wafer into the semiconductor substrate proximate to the backside surface; wherein:
each pixel cell of the rectangular array of pixel cells comprises a single-photon avalanche diode (SPAD);
each transistor region is associated with a corresponding pixel cell;
each transistor region comprises a control transistor electrically connected with the SPAD of the corresponding pixel cell with which the transistor region is associated;
the deep trench isolation material forms surrounding sides of each pixel cell of the rectangular array of pixel cells;
each transistor region is separated from each pixel cell of the rectangular array of pixel cells by the deep trench isolation material;
the SPAD of each pixel cell of the rectangular array of pixel cells is formed with an n-type cathode proximate to the top surface and a p-type anode formed beneath the n-type cathode opposite the top surface;
the semiconductor substrate is p-type with a doping gradient;
the control transistor of each transistor region controls a light gathering operation of the SPAD of the corresponding pixel cell with which the transistor region is associated.

13. The pixel wafer of claim 12, wherein:
each transistor region is formed as a rectangular region disposed at a grid point position of the rectangular array of pixel cells with a parallel orientation to the rectangular array of pixel cells;
the control transistor is a pMOS transistor connected between the n-type cathode of the SPAD and a voltage source.

14. The pixel wafer of claim 12, wherein:
each transistor region is a rectangular region disposed at a grid point position of the rectangular array of pixel cells and diagonally oriented with respect to the rectangular array of pixel cells;
the control transistor is a pMOS transistor connected between the n-type cathode of the SPAD and a voltage supply.

15. The pixel wafer of claim 12, wherein:
a first transistor region of the plurality of transistor regions is disposed parallel to a first row of the rectangular array of pixel cells;
the control transistor of the first transistor region is an nMOS gating transistor connected between the n-type cathode of the SPAD of the corresponding pixel cell and a first voltage supply;
the first transistor region contains a pMOS quenching transistor connected between the n-type cathode of the SPAD of the corresponding pixel cell and a second voltage supply.

16. The pixel wafer of claim 15, further comprising a second transistor region disposed within the first row of the rectangular array of pixel cells between the corresponding pixel cell and an adjacent pixel cell; wherein:
the second transistor region contains a pMOS fast recharging transistor connected between the n-type cathode of the SPAD of the corresponding pixel cell and a third voltage supply.

17. A photodetector device, comprising:
a pixel wafer comprising an array of pixel cells, at least one of which comprises a single-photon avalanche diode (SPAD);
a control transistor wafer comprising:
 a first side joined to the pixel wafer;
 a second side opposite the first side; and
 a group of control transistors comprising at least two of:

a recharging transistor;
a gating transistor; or
a quenching transistor; and
a logic wafer joined to the second side of the control transistor wafer and comprising circuit components that receive an electrical signal from the control transistor wafer; wherein:
the group of control transistors controls a light detection operation of the SPAD;
the electrical signal is based on the light detection operation;
the group of control transistors further includes:
a first transistor; and
a second transistor;
the first transistor and the second transistor form an inverter circuit; and
the cathode of the SPAD is connected to the input of the inverter circuit.

18. The photodetector device of claim 17, wherein:
the gating transistor is an nMOS transistor formed in a p-type well, the p-type well being formed in a deep n-type well;
the recharging transistor is a first pMOS transistor formed in a first n-type well;
the quenching transistor is a second pMOS transistor formed in a second n-type well;
a drain of the gating transistor, a drain of the recharging transistor and a drain of the quenching transistor are connected at a node in the control transistor wafer; and
a cathode of the SPAD is connected to the node.

19. A pixel wafer having a top surface and a backside surface opposite the top surface, comprising:
a semiconductor substrate; and
a rectangular array of pixel cells, at least one pixel cell comprising:
a single-photon avalanche diode (SPAD) that includes a cathode and an anode formed in the semiconductor substrate; and
a group of control transistors formed proximate to the top surface, comprising:
a recharging transistor for the SPAD;
a gating transistor for the SPAD; and
a first transistor and a second transistor that form an inverter circuit having an input connected to the cathode of the SPAD.

* * * * *